(12) United States Patent
Chou et al.

(10) Patent No.: US 10,867,833 B2
(45) Date of Patent: Dec. 15, 2020

(54) BURIED METAL FOR FINFET DEVICE AND METHOD

(71) Applicant: Taiwan Semiconductor Manufacturing Company, Ltd., Hsinchu (TW)

(72) Inventors: Lei-Chun Chou, Taipei (TW); Chih-Liang Chen, Hsinchu (TW); Jiann-Tyng Tzeng, Hsinchu (TW); Chih-Ming Lai, Hsinchu (TW); Ru-Gun Liu, Zhubei (TW); Charles Chew-Yuen Young, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/191,338

(22) Filed: Nov. 14, 2018

(65) Prior Publication Data

US 2019/0164805 A1 May 30, 2019

Related U.S. Application Data

(60) Provisional application No. 62/592,499, filed on Nov. 30, 2017.

(51) Int. Cl.
*H01L 21/74* (2006.01)
*H01L 29/66* (2006.01)
(Continued)

(52) U.S. Cl.
CPC .......... *H01L 21/743* (2013.01); *H01L 23/535* (2013.01); *H01L 29/66795* (2013.01);
(Continued)

(58) Field of Classification Search
CPC ............. H01L 29/66795; H01L 29/785; H01L 29/41791; H01L 29/401; H01L 21/823431;
(Continued)

(56) References Cited

U.S. PATENT DOCUMENTS 9,105,490 B2  8/2015  Wang et al.
9,236,267 B2  1/2016  De et al.
(Continued)

FOREIGN PATENT DOCUMENTS

KR  20150044412 A  4/2015
KR  20160016508 A  2/2016
(Continued)

*Primary Examiner* — Hsien Ming Lee
(74) *Attorney, Agent, or Firm* — Slater Matsil, LLP

(57) ABSTRACT

A semiconductor device includes a buried metal line disposed in a semiconductor substrate, a first dielectric material on a first sidewall of the buried metal line and a second dielectric material on a second sidewall of the buried metal line, a first multiple fins disposed proximate the first sidewall of the buried metal line, a second multiple fins disposed proximate the second sidewall of the buried metal line, a first metal gate structure over the first multiple fins and over the buried metal line, wherein the first metal gate structure extends through the first dielectric material to contact the buried metal line, and a second metal gate structure over the second multiple fins and over the buried metal line.

20 Claims, 56 Drawing Sheets

(51) Int. Cl.
*H01L 23/535* (2006.01)
*H01L 21/762* (2006.01)
*H01L 21/3115* (2006.01)
*H01L 29/78* (2006.01)
*H01L 21/311* (2006.01)
*H01L 21/308* (2006.01)
*H01L 27/11* (2006.01)

(52) U.S. Cl.
CPC ...... *H01L 21/3081* (2013.01); *H01L 21/3086* (2013.01); *H01L 21/31111* (2013.01); *H01L 21/31155* (2013.01); *H01L 21/76224* (2013.01); *H01L 27/1104* (2013.01); *H01L 29/785* (2013.01)

(58) Field of Classification Search
CPC ......... H01L 21/823821; H01L 27/0886; H01L 27/0924; H01L 27/10826; H01L 27/10879; H01L 27/1211
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2009/0218616 A1* | 9/2009 | Jang | H01L 27/10876 257/330 |
| 2011/0140196 A1 | 6/2011 | Renn et al. | |
| 2014/0077305 A1 | 3/2014 | Pethe et al. | |
| 2015/0102411 A1 | 4/2015 | Ching et al. | |
| 2016/0043225 A1 | 2/2016 | Ching et al. | |
| 2016/0104628 A1 | 4/2016 | Metz et al. | |
| 2016/0126249 A1 | 5/2016 | Divakaruni et al. | |
| 2016/0155824 A1 | 6/2016 | Lin et al. | |
| 2016/0343854 A1 | 11/2016 | Masuoka et al. | |
| 2016/0351669 A1 | 12/2016 | Shiao et al. | |
| 2017/0011929 A1 | 1/2017 | Jun et al. | |
| 2017/0194209 A1 | 7/2017 | Li et al. | |
| 2017/0278744 A1 | 9/2017 | Wang et al. | |

FOREIGN PATENT DOCUMENTS

| | | |
|---|---|---|
| KR | 20160038673 A | 4/2016 |
| KR | 20160138592 A | 12/2016 |
| KR | 20170015880 A | 2/2017 |
| KR | 20170080426 A | 7/2017 |
| KR | 20170112941 A | 10/2017 |
| TW | 201629623 A | 8/2016 |
| TW | 201642325 A | 12/2016 |

* cited by examiner

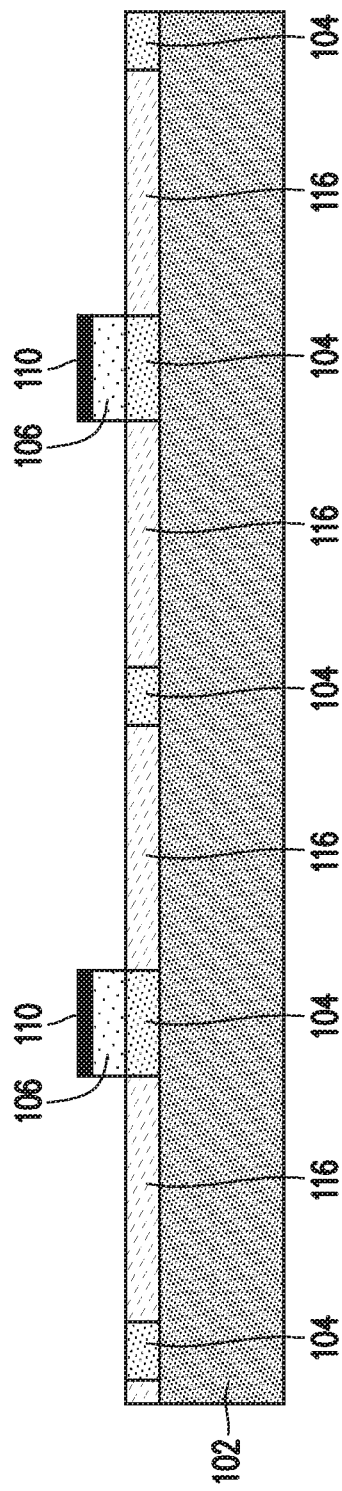
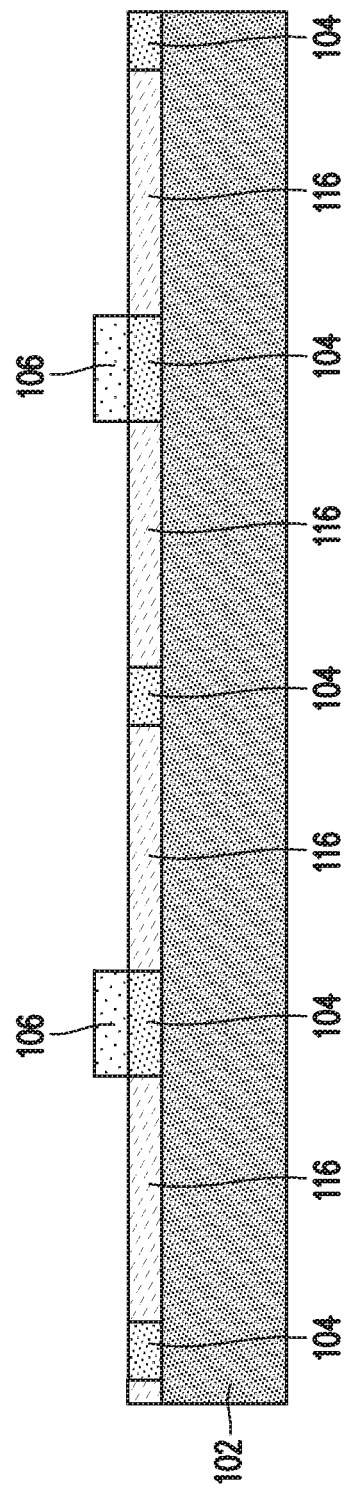
FIG. 8
FIG. 9

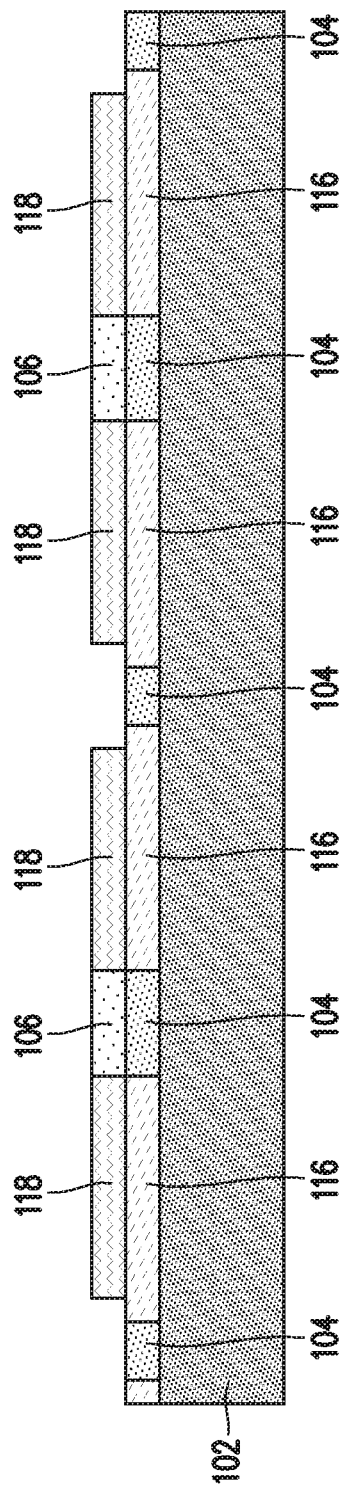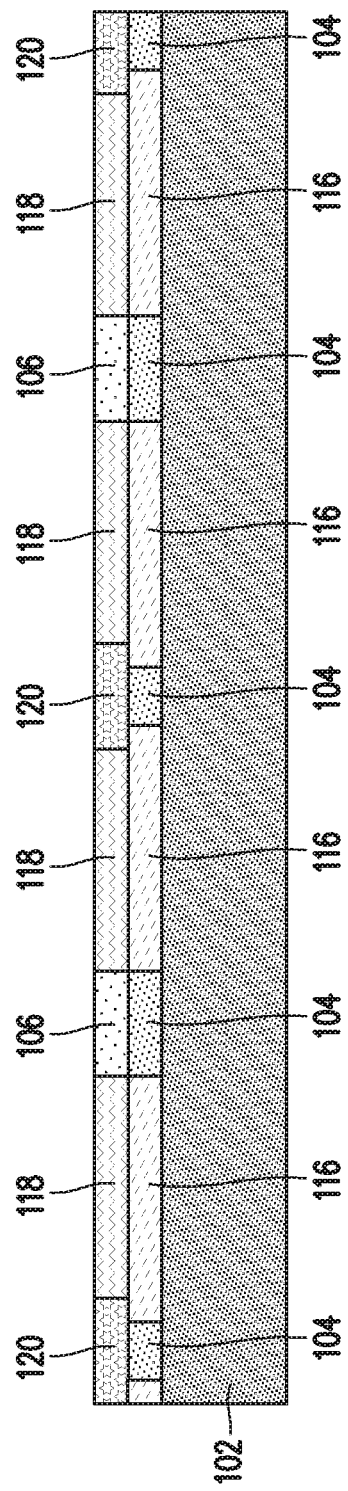

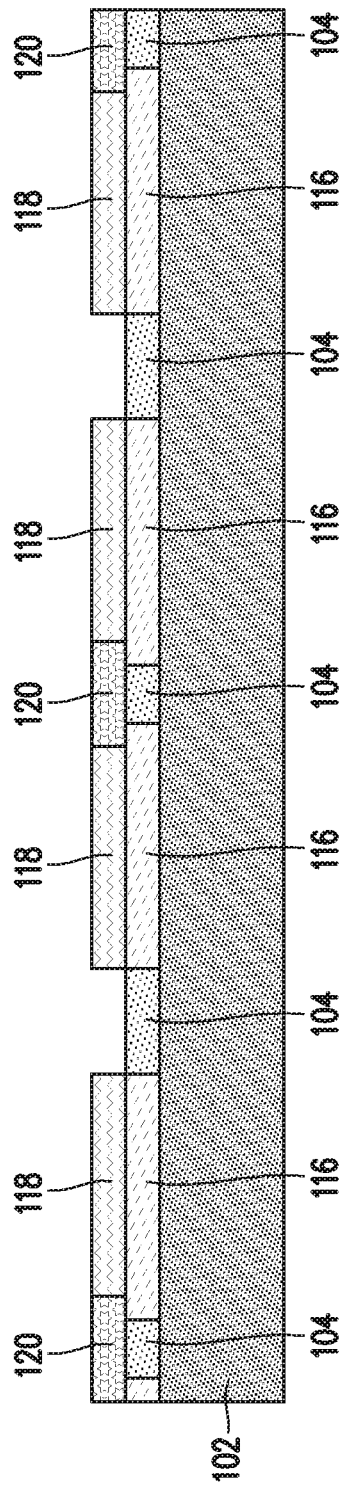
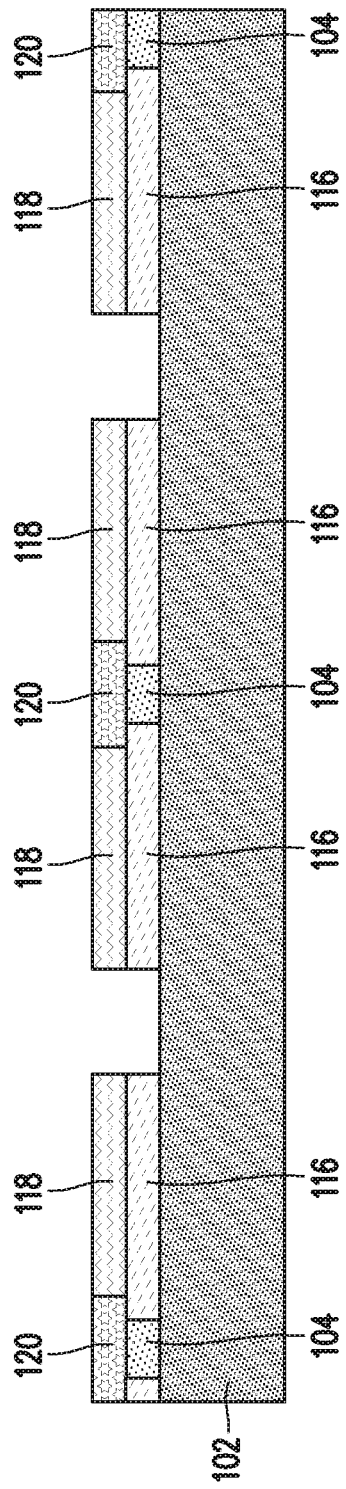
FIG. 12
FIG. 13

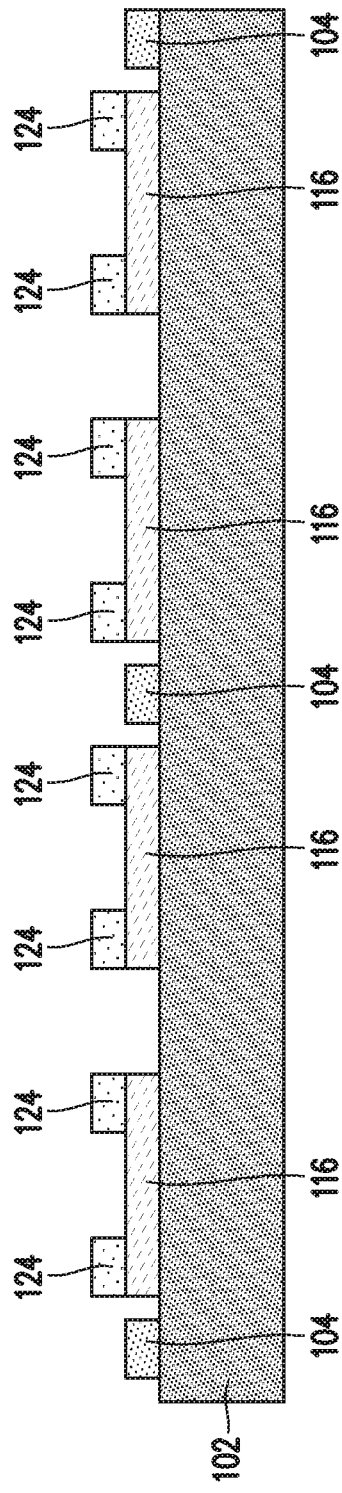
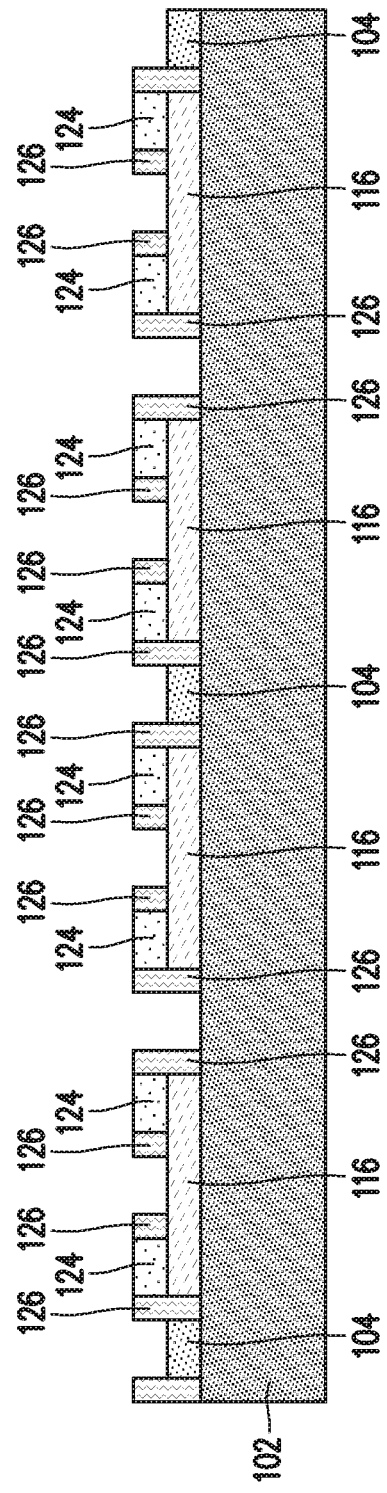

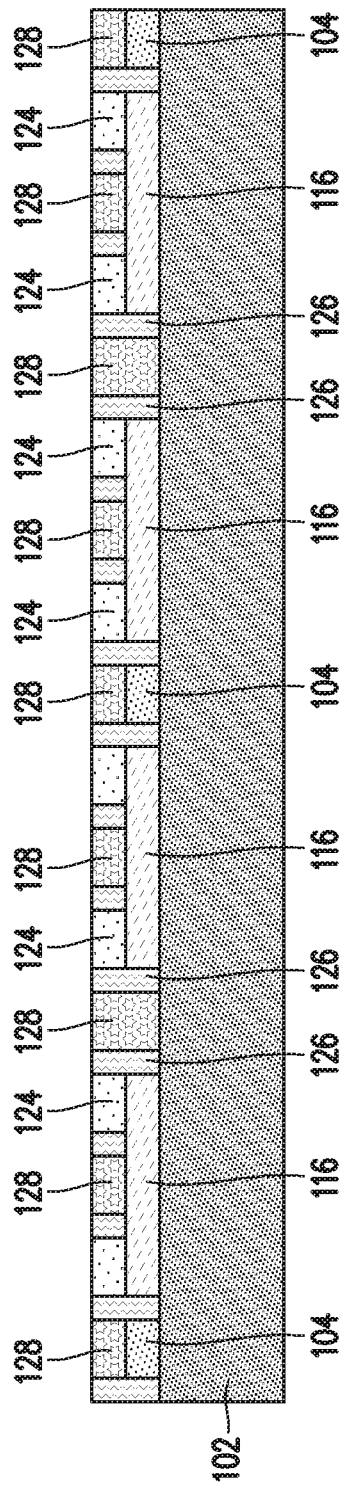
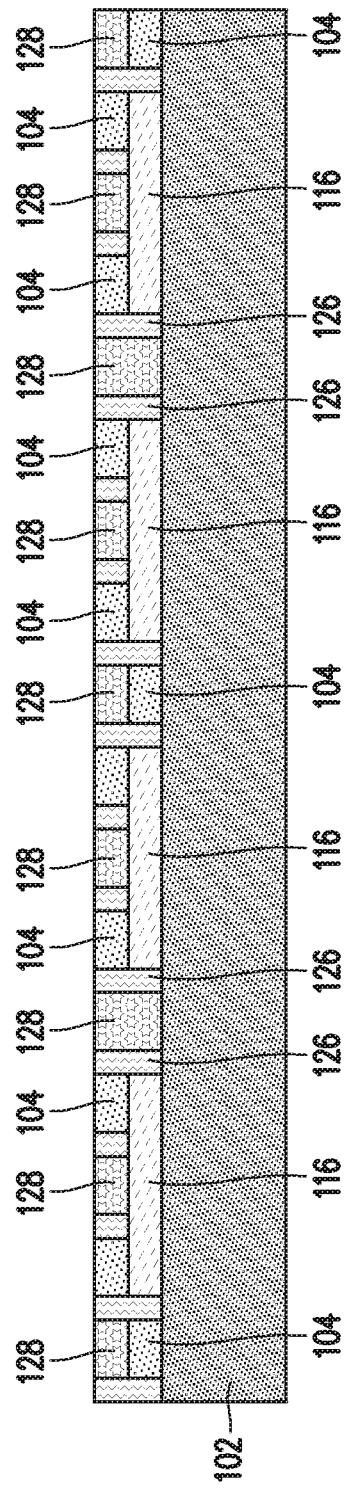
FIG. 20
FIG. 21

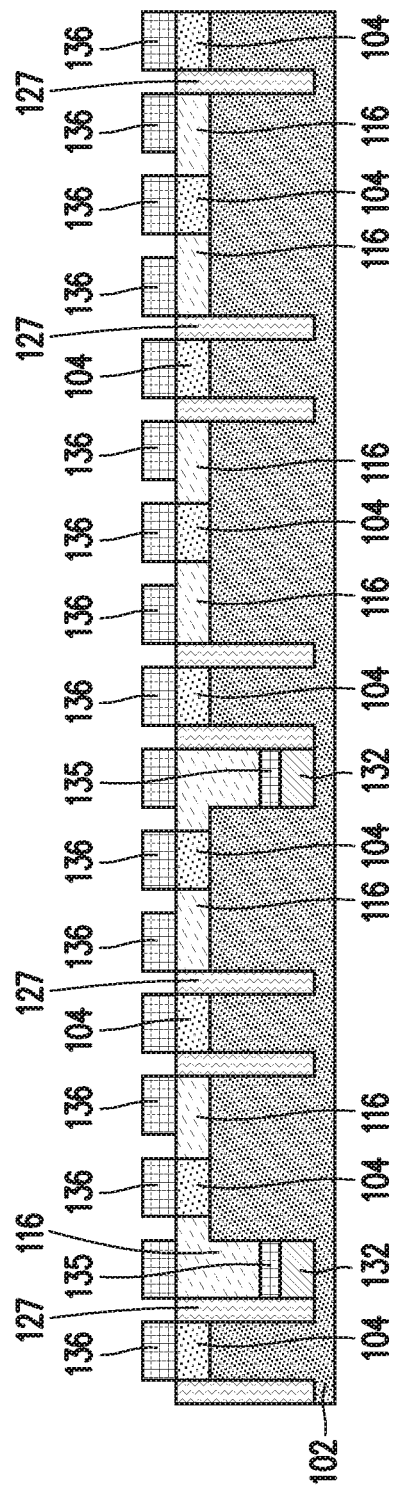
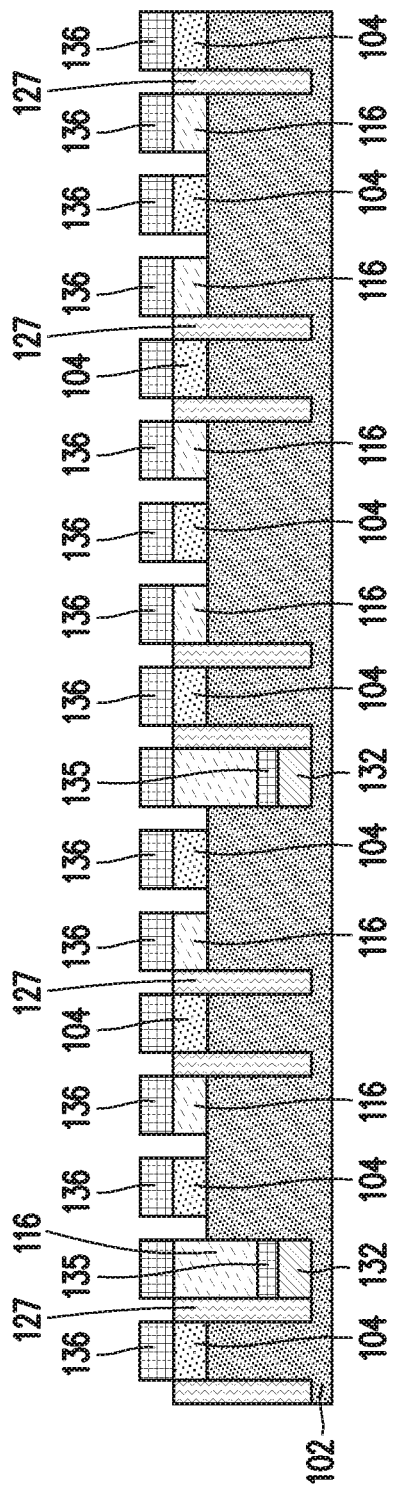

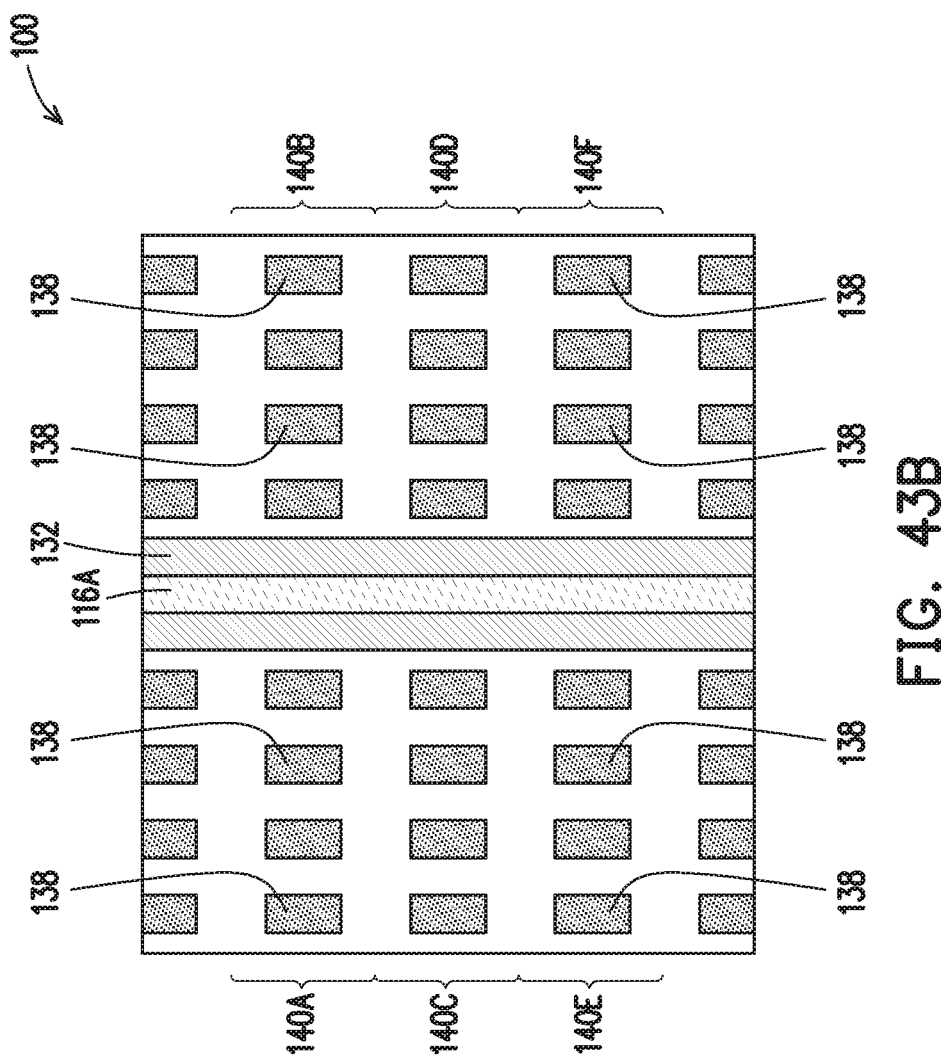

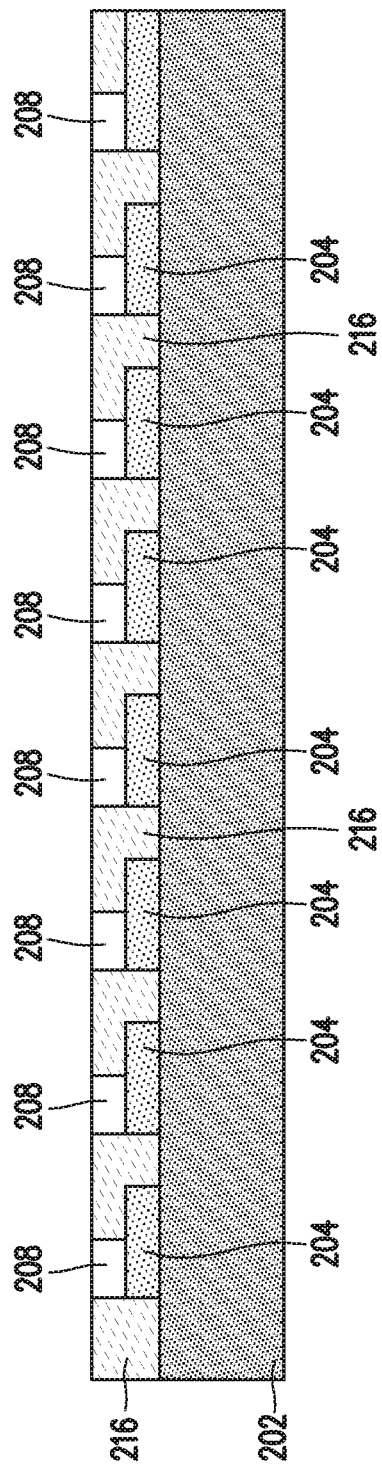
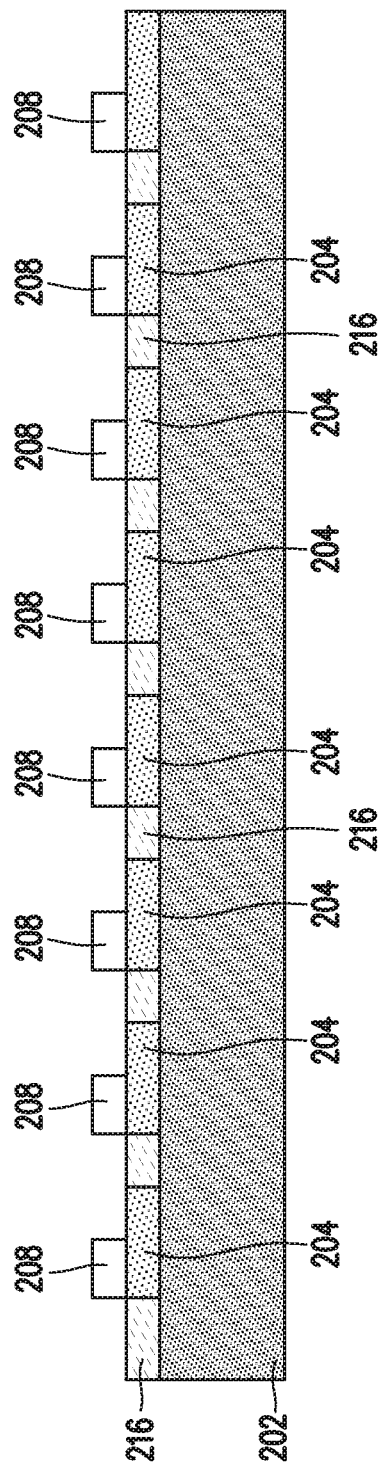

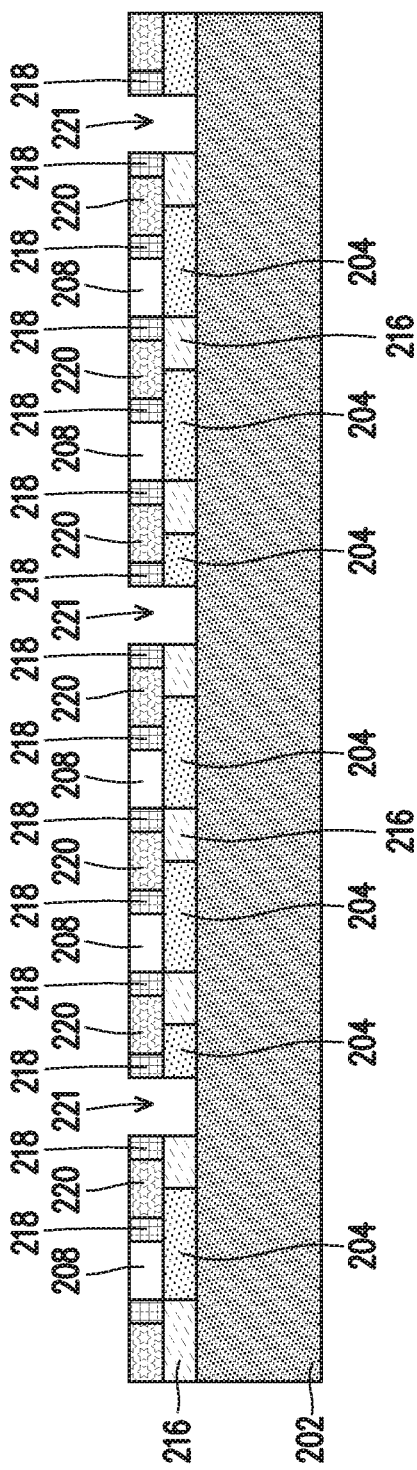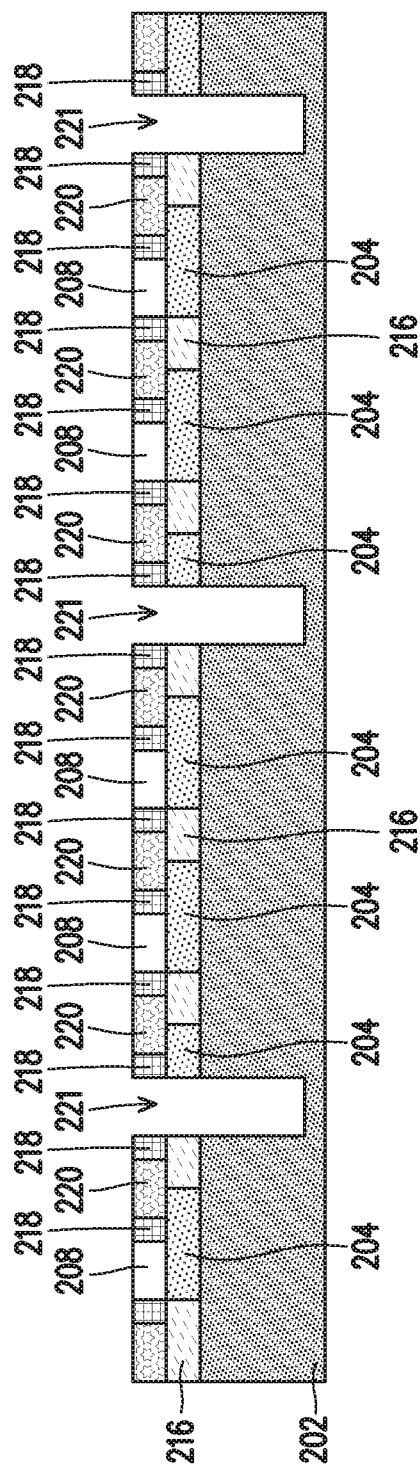

BURIED METAL FOR FINFET DEVICE AND METHOD

PRIORITY

This application claims the benefit to U.S. Provisional Patent Application No. 62/592,499 filed Nov. 30, 2017, and entitled "Tie Off Device with Buried Metal Layer," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-42 illustrate cross-sectional views of intermediate stages in the formation of buried metal lines in a semiconductor device in accordance with a first embodiment.

FIGS. 43A-44 illustrate cross-sectional views and a plan view of intermediate stages in the formation of buried metal lines in a semiconductor device in accordance with a some embodiments.

FIGS. 50-75 illustrate cross-sectional views of intermediate stages in the formation of buried metal lines in a semiconductor device in accordance with a first embodiment.

DETAILED DESCRIPTION

Figure 1:
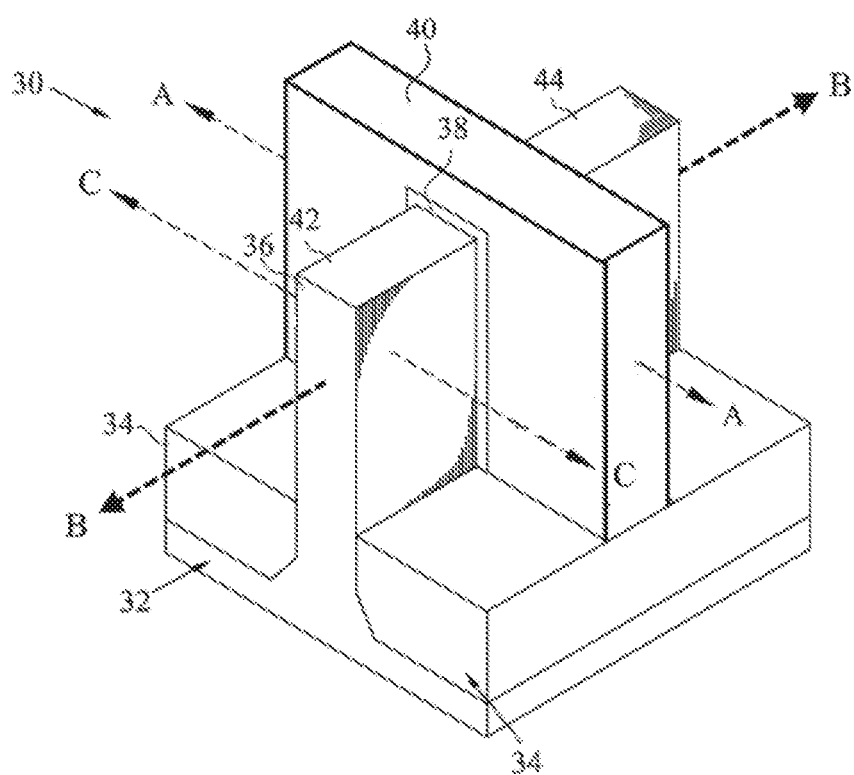
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device including buried metal lines and a method of forming the same. Various embodiments discussed herein allow for the use of buried metal lines that may be connected to the metal gate of a FinFET cell. Using a self-aligned process, the metal gates of respective FinFET cells may be selectively connected ("tied-on") to the buried metal lines or isolated from the buried metal lines. The techniques described herein allow for isolation between adjacent metal gates without significantly increasing area. Various embodiments presented herein are discussed in the context of FinFETs formed using a gate-last process. In other embodiments, a gate-first process may be used. The fin(s) of a FinFET device or the gate(s) of a FinFET device may be patterned by any suitable method. For example, the fins or gates may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins. Some embodiments contemplate aspects used in planar devices, such as planar FETs. Some embodiments may also be used in semiconductor devices other than FETs.

FIG. 1 illustrates an example of a fin field-effect transistor (FinFET) 30 in a three-dimensional view. The FinFET 30 includes a fin 36 on a semiconductor substrate 32. The fin 36 protrudes above and from between neighboring isolation regions 34, which are disposed over portions of the semiconductor substrate 32. In some embodiments, isolation regions 34 are not used. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross-section A-A and is across fin 36 outside of the channel (e.g., across the source/drain region 42). Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2-48D illustrate cross-sectional views of intermediate stages in the formation of a FinFET device 100, according to a first embodiment. FIGS. 2-43A and 44 are illustrated along the reference cross-section A-A of FIG. 1. The FinFET device 100 is similar to that shown in FIG. 1, but multiple fins 138 and multiple metal gates 150A-F are formed.

Figure 2:
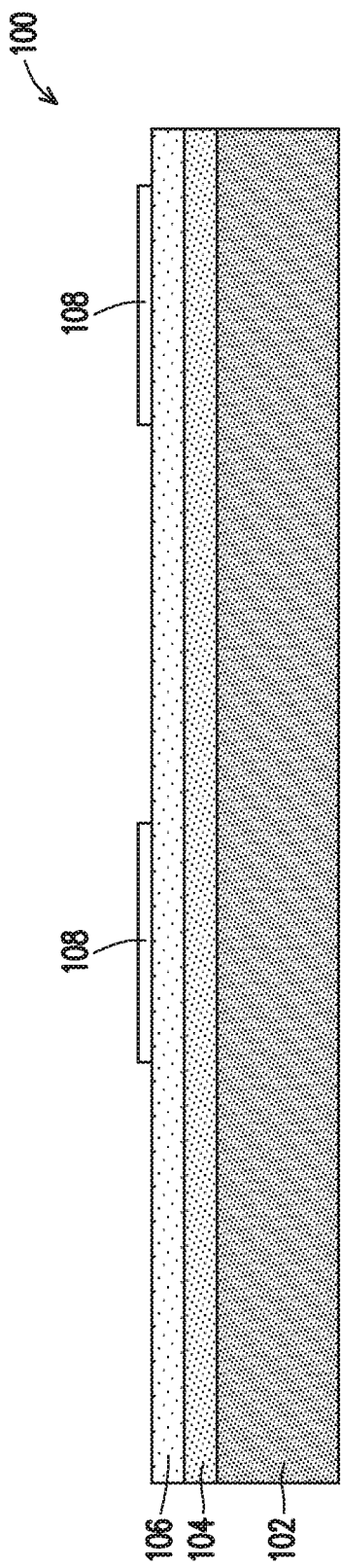

FIG. 2 illustrates a substrate 102. The substrate 102 may be a semiconductor substrate, such as a bulk semiconductor, a semiconductor-on-insulator (SOI) substrate, or the like, which may be doped (e.g., with a P-type or an N-type dopant) or undoped. The substrate 102 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

FIG. 2 further illustrates the formation of a first material 104 and a second material 106 over the substrate 102. The first material 104 or the second material 106 may include silicon oxide (SiO), silicon nitride (SiN), silicon oxynitride (SiON), silicon carbide (SiC), silicon carbonitride (SiCN), silicon oxycarbonitride (SiOCN), a combination thereof, or the like. In some embodiments, the first material 104 or the second material 106 may include a metal or nitride material such as titanium nitride, titanium, tantalum nitride, tantalum, a combination thereof, or the like. In some embodiments, the composition of the first material 104 is different from the composition of the second material 106. In this manner, selective etching processes (e.g., selective wet etches or selective dry etches) may be used in subsequent steps when etching the first material 104 or the second material 106. The first material 104 or the second material 106 may be formed using any suitable process, such as atomic layer deposition (ALD), physical vapor deposition (PVD), chemical vapor deposition (CVD), a combination thereof, or the like. In some embodiments, the first material 104 may be formed as a layer having a thickness between about 5 nm and about 25 nm. In some embodiments, the second material 106 over the first material 104 may be formed as a layer having a thickness between about 5 nm and about 25 nm. The first material 104 or the second material 106 may be formed having other thicknesses in other embodiments. In some embodiments, the thickness of the first material 104 or the second material 106 may depend on the materials chosen for the first material 104 and the second material 106, and may depend on the selectivity of one or more etching processes chosen to etch the first material 104 or the second material 106.

A mandrel material is formed over the second material 106 and patterned to form first mandrels 108. The first mandrels 108 may be a material that has a high etching selectivity with the underlying layer, e.g., with the second material 106. For example, the first mandrels 108 may be a material such as SiO, SiN, SiON, SiC, SiCN, SiOCN, a nitride material, or another type of material that is different than the second material 106. The first mandrels 108 may be formed using a process such as ALD, PVD, CVD, or the like. In some embodiments, the first mandrels 108 may be formed having a thickness between about 1 nm and about 5 nm, or another thickness. The mandrel material may be patterned to form first mandrels 108 using any suitable photolithography technique and etching technique.

Figure 3:
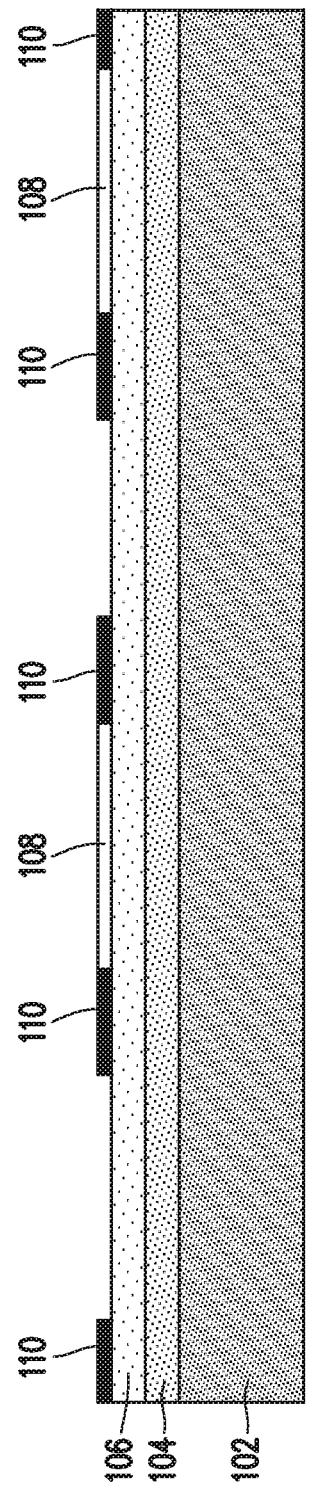

In FIG. 3, a first spacer material is formed over the second material 106 and the first mandrels 108 and then etched to form first spacers 110. After formation, the first spacer material extends along top surfaces of the second material 106 and top surfaces and sidewalls of the first mandrels 108. A suitable etching process is performed to remove horizontal portions of the first spacer material to form first spacers 110. The etching process may be, for example, an anisotropic dry etching process. The first spacers 110 may be a material selected to have a high etching selectivity with second material 106 or the first mandrels 108. In some embodiments, the first spacers 110 may be formed from a material such as SiO, SiN, SiON, SiC, SiCN, SiOCN, a nitride material, or another type of material that is different than the second material 106 or the first mandrels 108, and may be formed using any suitable process such as ALD, PVD, CVD, or the like. In some embodiments, the first spacers 110 may be formed having a width between about 1 nm and about 5 nm, or another thickness.

Figure 4:
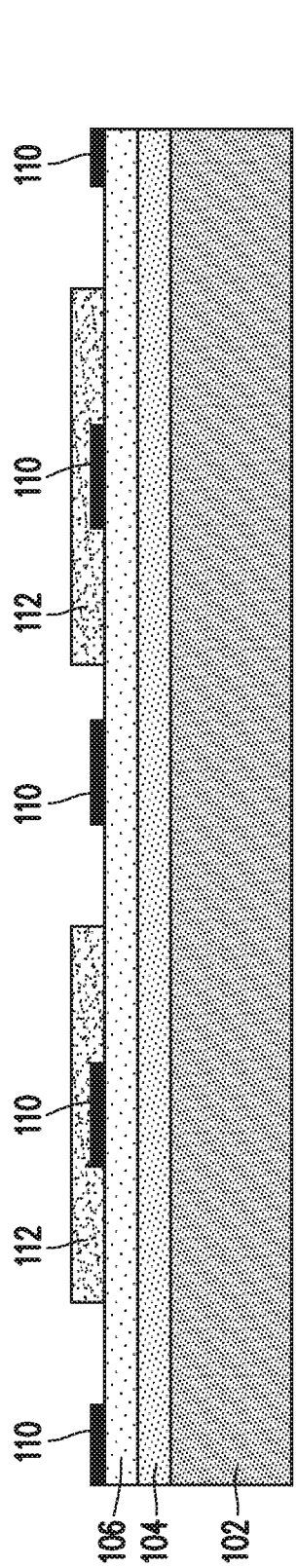

In FIG. 4, the first mandrels 108 are removed and a protective mask 112 is formed over some of the first spacers 110. The first mandrels 108 may be removed using a suitable etching process, such as a dry etching process, a wet etching process, or a combination. The etching process may be selective to the first mandrels 108 over the first spacers 110 or the second material 106. After the first mandrels 108 have been removed, the protective mask 112 is formed over some of the first spacers 110, as shown in FIG. 4. The protective mask 112 may be a photoresist or other suitable material, and may be patterned using suitable photolithographic techniques.

Figure 5:
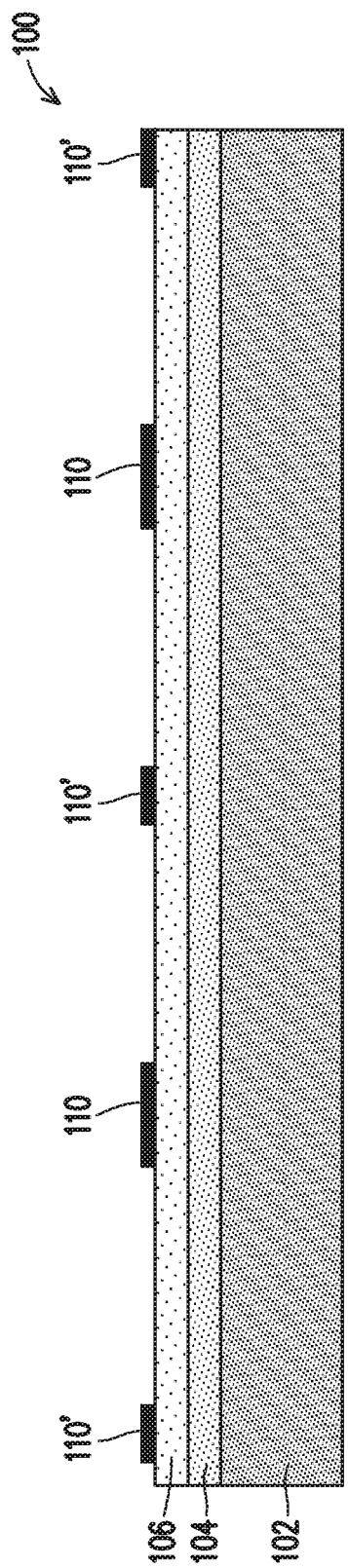

In FIG. 5, a trimming process is performed on the first spacers 110 not covered by the protective mask 112. The trimming process reduces the size of the exposed first spacers 110, forming trimmed first spacers 110'. The trimming process may include a dry etching process, a wet etching process, or a combination. After the trimming process is performed, the protective mask 112 is removed.

Figure 6:
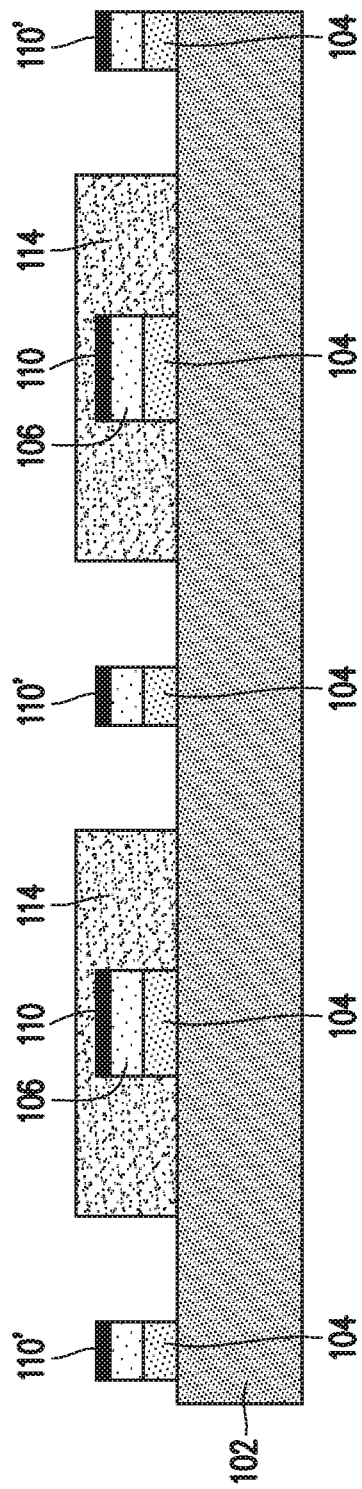

In FIG. 6, the first spacers 110 and trimmed first spacers 110' are used as an etching mask to pattern the first material 104 and the second material 106. The first material 104 and the second material 106 may be etched using one or more suitable etching processes. For example, the first material 104 or the second material 106 may be etched using anisotropic dry etching processes. After patterning the first material 104 and the second material 106, a protective mask 114 is formed over the untrimmed first spacers 110. The protective mask 114 may be, for example, a photoresist, and may be patterned using a suitable photolithographic process.

Figure 7:
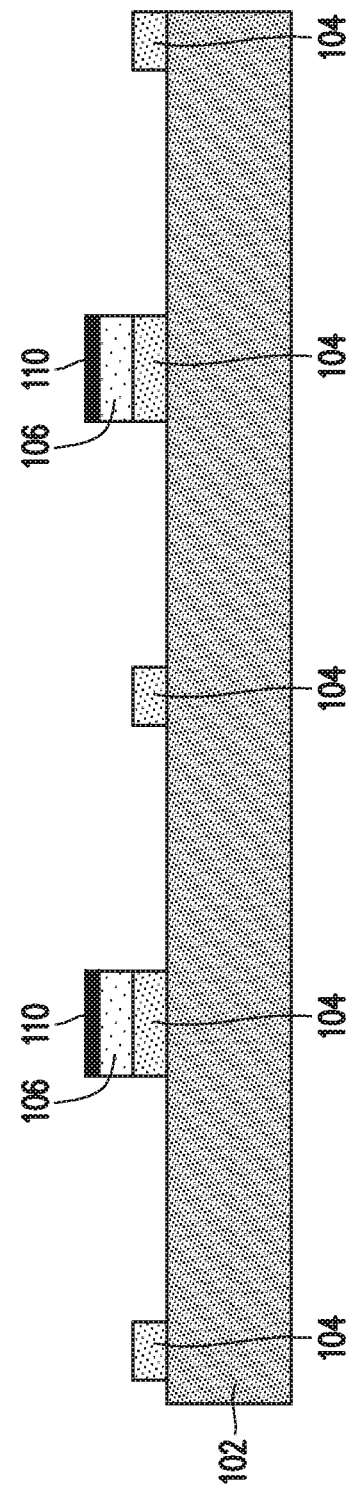

In FIG. 7, the trimmed first spacers 110' and the portions of the second material 106 not covered by the protective mask 114 are removed. The trimmed first spacers 110' and the second material 106 may be removed using one or more suitable etching processes, such as a dry etching process, a wet etching process, or a combination. The etching process may be selective to the second material 106 over the first material 104. In this manner, exposed portions of the first material 104 remain over the substrate 102, as shown in FIG. 7. The exposed portions of the first material 104 have a pattern corresponding to the trimmed first spacers 110'. After the etching process is performed, the protective mask 114 is removed.

In FIG. 8, a third material 116 is formed over the substrate 102 and between the patterned portions of the first material 104. The third material 116 may be a material such as SiO, SiN, SiON, SiC, SiCN, SiOCN, a nitride material, the like, or a combination thereof, and may be formed using a process such as ALD, PVD, CVD, or the like. In some embodiments, the third material 116 may be a different material than the substrate 102, the first material 104, or the second material 106. In some embodiments, the third material 116 may be deposited and then etched back (e.g., using a timed etch) such that the remaining portions of the third material 116 have a thickness about the same as the remaining portions of the first material 104. In FIG. 9, the remaining portions of the first spacers 110 are removed using a suitable dry etching process, a wet etching process, or a combination.

In FIG. 10, a second spacer material is deposited and then etched to form second spacers 118 adjacent the portions of the second material 106. The second spacers 118 may have a high etching selectivity with the second material 106 or the third material 116. The second spacers 118 may be a material similar to that of the first spacers 110 or be a different material. In some embodiments, the second spacers 118 may be formed having a thickness about the same as the remaining portions of the second material 106. In some embodiments, a suitable photolithographic patterning process and etching are used to pattern the second spacer material and form the second spacers 118.

In FIG. 11, a first photoresist 120 is formed over the exposed portions of the first material 104. The first photoresist 120 may be formed using a spin-on process or another suitable process, and patterned using suitable photolithographic techniques. The first photoresist 120 protects portions of the second spacers 118 during subsequent processing steps. In some cases, the first photoresist 120 may extend above the height of the second spacers 118 or extend over portions of the second spacers 118. In FIG. 12, the remaining portions of the second material 106 are removed using a suitable etching process. For example, the etching process may include a dry etching process, a wet etching process, or a combination. In some embodiments, the etching process may be selective to the second material 106 over the first material 104, the second spacers 118, and/or the first photoresist 120.

In FIG. 13, the exposed portions of the first material 104 are removed using a suitable etching process. For example, the etching process may include a dry etching process, a wet etching process, or a combination. In some embodiments, the etching process may be may be selective to the first material 104 over the substrate 102. In some cases, both the portions of the second material 106 (described as being removed above with reference to FIG. 12) and the portions of the first material 104 may be removed in a single etching process.

Figure 14:
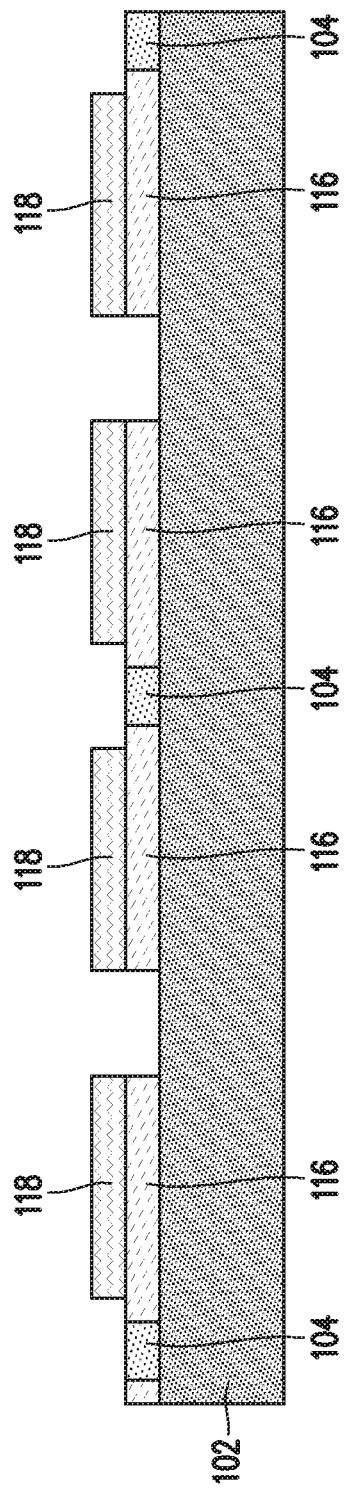
Figure 15:
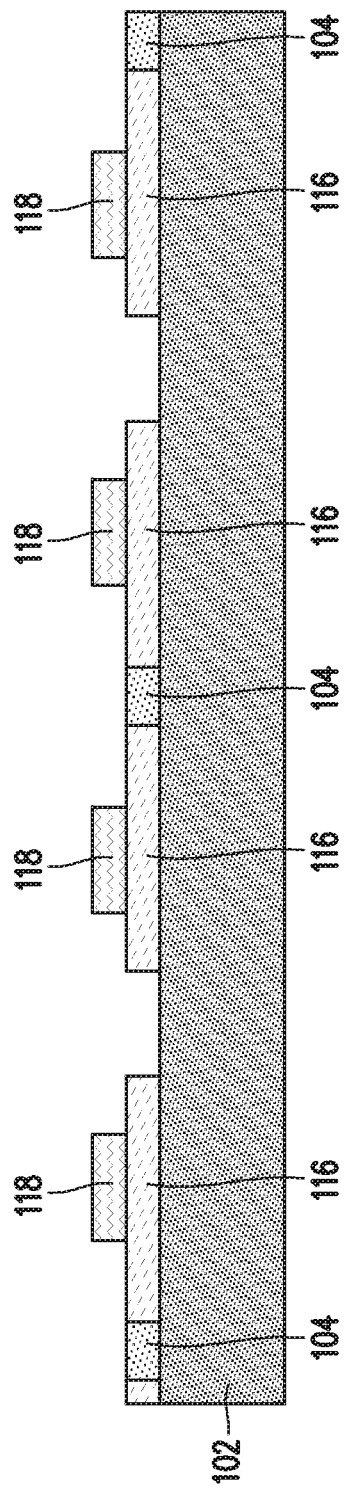

In FIG. 14, the first photoresist 120 is removed. The first photoresist 120 may be removed, for example, using a dry process (e.g., an ashing process) or a wet process (e.g., a wet chemical process). In FIG. 15, a trimming process is performed on the second spacers 118. The trimming process reduces the size of the second spacers 118. The trimming process may include a dry etching process, a wet etching process, or a combination.

Figure 16:
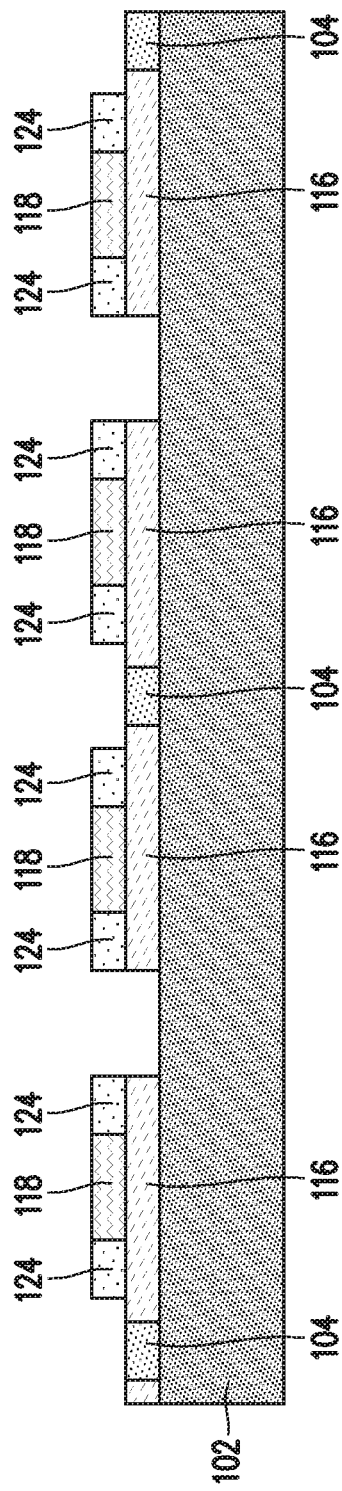

In FIG. 16, a third spacer material is deposited and then etched to form third spacers 124 adjacent the second spacers 118. The material of the third spacer material may be selected to have a high etching selectivity with the second spacer 118 or the third material 116. The third spacers 124 may be a material similar to that of the first spacers 110 or be a different material. In some embodiments, the third spacers 124 may have a thickness about the same as the second spacers 118. In some embodiments, a suitable photolithographic patterning process and etching process is used to pattern the third spacer material and form the third spacers 124.

Figure 17:
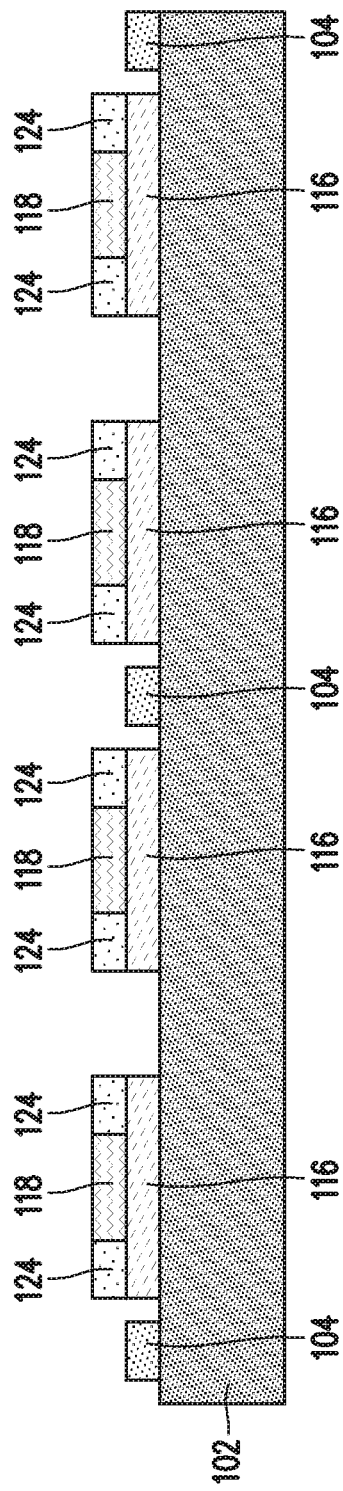

In FIG. 17, exposed portions of the third material 116 are removed using a suitable etching process. For example, an anisotropic dry etching process may be used to remove the portions of the third material 116. In some embodiments, the etching process may be selective to the third material 116 over the material of other features such as the substrate 102, the first material 104, the second spacers 118, or the third spacers 124. In FIG. 18, the second spacers 118 are removed using a suitable etching process. For example, a dry etching process or a wet etching process may be used to remove the second spacers 118. In some embodiments, the etching process may be selective to the material of the second spacers 118 over that of the third spacers 124, first material 104, etc.

In FIG. 19, a fourth spacer material is deposited and then etched to form fourth spacers 126. The fourth spacer material may be selected to have a high etching selectivity with, for example, the third material 116. The fourth spacers 126 may be formed from a material such as SiO, SiN, SiON, SiC, SiCN, SiOCN, a nitride material, or another type of material, and may be formed using any suitable process such as ALD, PVD, CVD, or the like. In some embodiments, the fourth spacers 126 include a material similar to that of the first spacers 110. In some embodiments, the fourth spacer material may be formed having a thickness between about 1 nm and about 10 nm, which may fill the lateral gaps between the first material 104 and the third material 116. The fourth spacer material may also be formed having another thickness in other embodiments. As shown in FIG. 19, a suitable etching process is performed to remove horizontal portions of the fourth spacer material. The etching process leaves sidewall portions of the fourth spacer material remaining to form fourth spacers 126. The etching process may be, for example, an anisotropic dry etching process.

In FIG. 20, a second photoresist 128 is formed to fill regions between the fourth spacers 126. The second photoresist 128 may be formed using a spin-on process or another suitable process. In FIG. 21, exposed portions of the third spacers 124 are replaced by the first material 104. For example, the exposed third spacers 124 may be removed using an etching process selective to the third spacers 124.

The etching process may be a dry etching process, a wet etching process, or a combination. The first material 104 may then be formed in the regions formerly filled by the exposed third spacers 124. The first material 104 may be formed using a deposition technique as described previously. In some cases, a CMP process may be performed after the first material 104 is formed.

Figure 22:
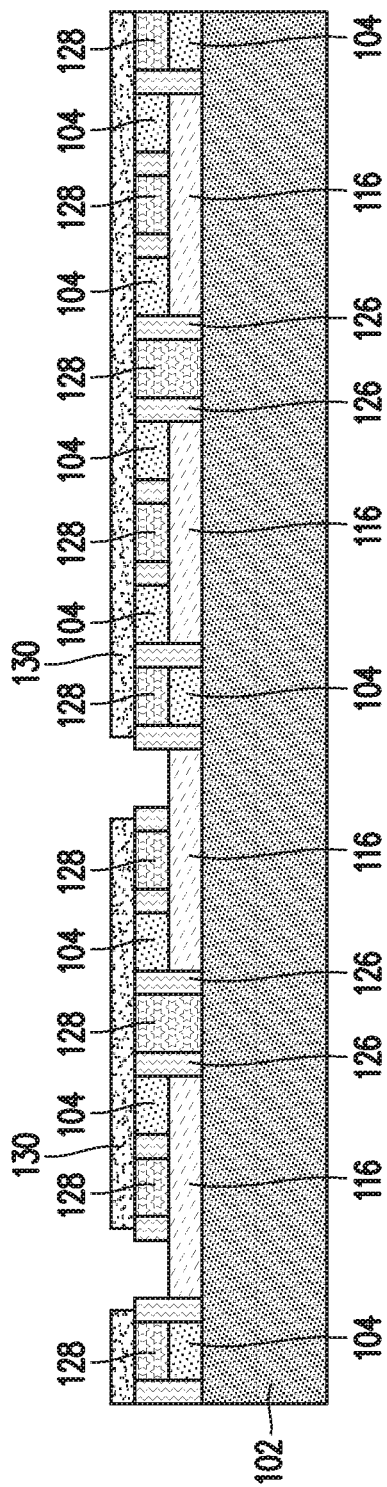

In FIG. 22, a protective mask 130 is formed over portions of the structure, and then exposed portions of the first material 104 are removed. The protective mask 130 may be, for example, a photoresist, and may be patterned using a suitable photolithographic process. The exposed first material 104 may be removed using a dry etching process, a wet etching process, or a combination. The removal of the exposed first material 104 forms openings that expose portions of the third material 116, as shown in FIG. 22.

Figure 23:
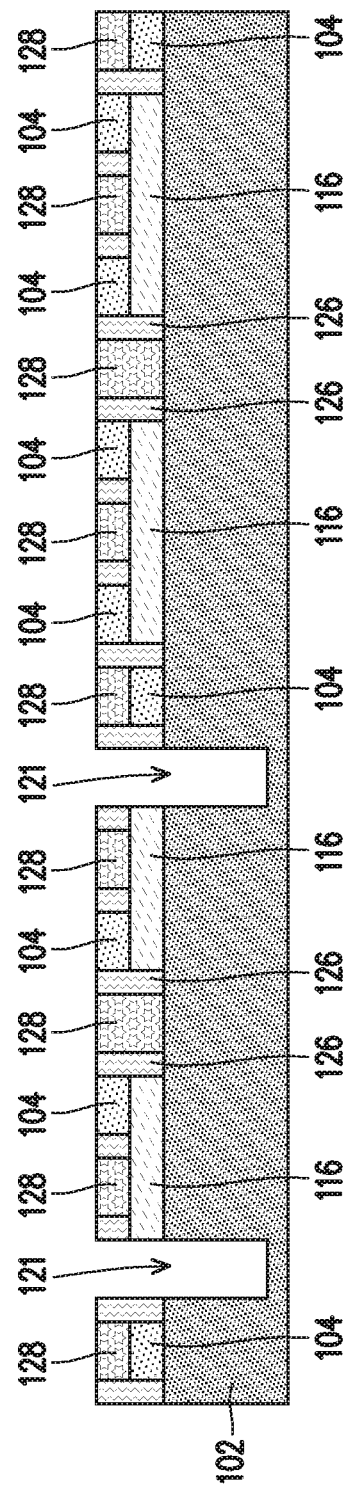

In FIG. 23, the openings formed by removal of the exposed first material are extended through the third material and into the substrate 102, forming recesses 121 in the substrate 102. The protective mask 130 is also removed. The exposed portions of the third material 116 and the subsequently removed portions of the substrate 102 may be removed using one or more dry etching processes, wet etching processes, or a combination. In some embodiments, the recesses 121 may extend a depth into the substrate a distance between about 50 nm and about 140 nm.

Figure 24:
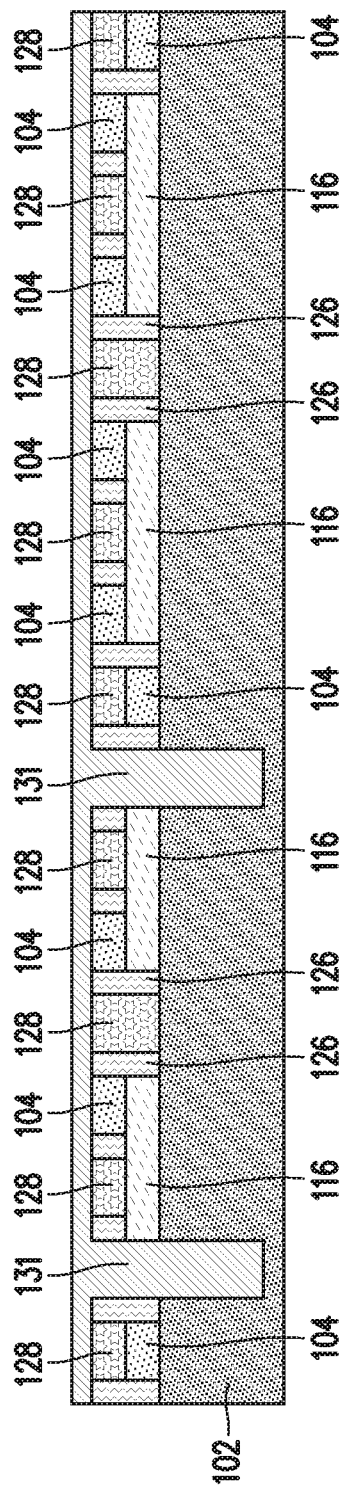

In FIG. 24, a conductive material 131 is formed over the structure and within the recesses 121. In some embodiments, layers may be formed in the recesses 121 prior to forming the conductive material 131. For example, a liner, a barrier layer, an adhesion layer, a seed layer, or another type of layer, or a combination of these, may formed before the conductive material 131 is formed. One or more of the layers may include titanium, titanium nitride, tantalum, tantalum nitride, or the like. The conductive material 131 may include copper, a copper alloy, silver, gold, tungsten, aluminum, nickel, cobalt, a combination, or the like. The conductive material 131 may be formed using a suitable deposition technique, such as electroplating, CVD, PVD, the like, or a combination. The conductive material 131 is used to form buried metal 132, described below.

Figure 25:
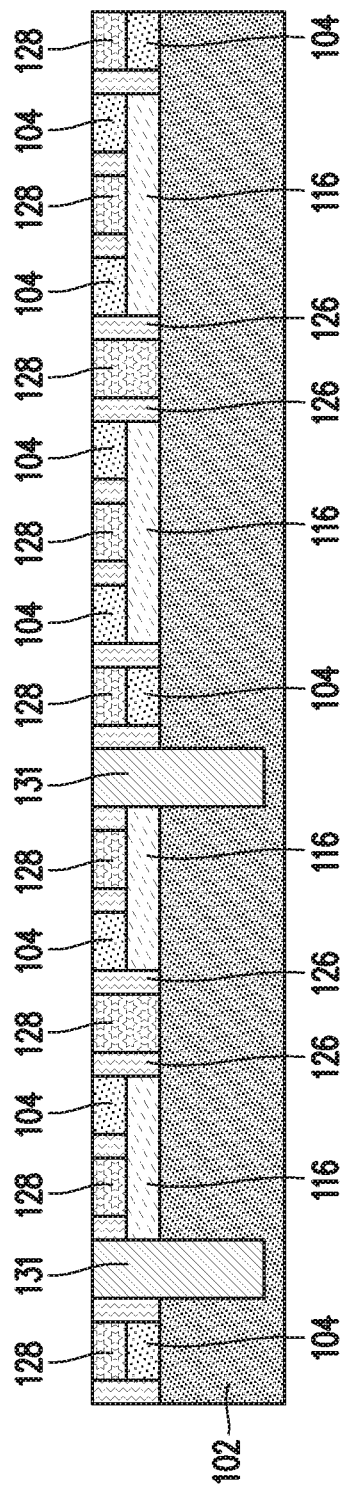
Figure 26:
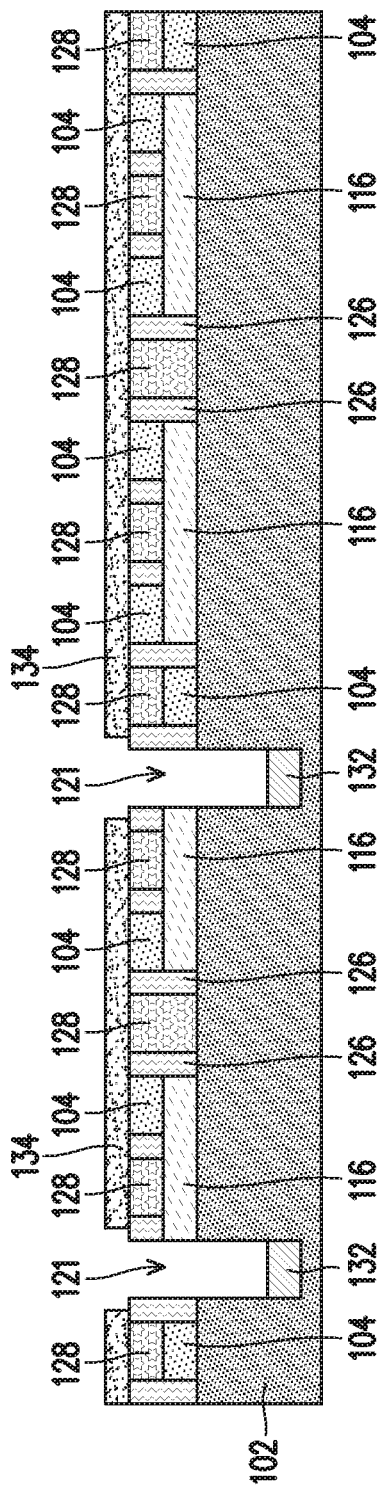

In FIG. 25, a planarization process such as a CMP process is used to remove excess conductive material 131. Then, in FIG. 26, a protective mask 134 is formed over regions other than the recesses 121, and an etching process is used to remove portions of the conductive material 131 from the recesses 121. The remaining conductive material 132131 forms buried metal 132, which may be conductive features such as buried metal lines. The etching process may be a dry etching process, a wet etching process, or a combination. For example, the etching process may include an anisotropic dry etching process.

Figure 27:
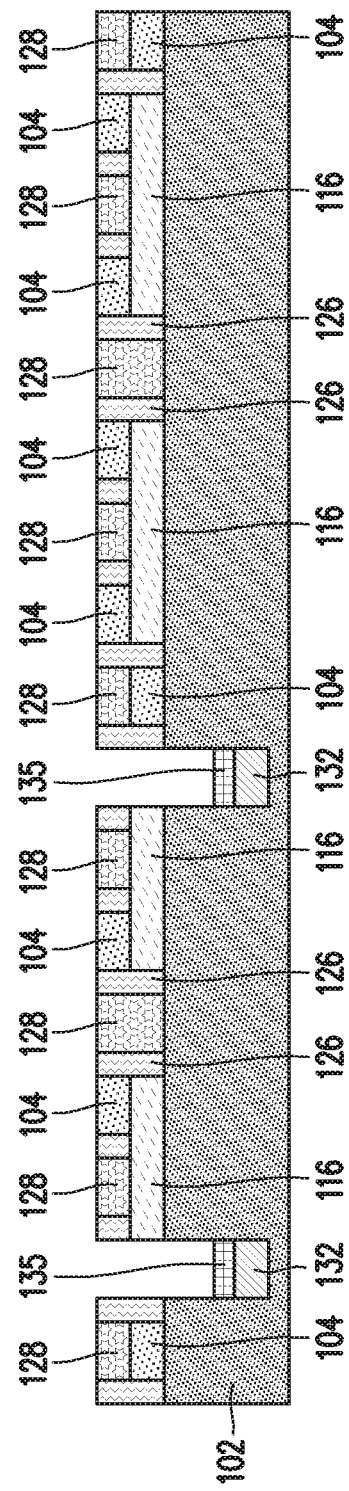

In FIG. 27, a hard mask material 135 is formed on the buried metal 132 within the recesses 121. In some embodiments, hard mask material 135 is a dielectric material and may include SiO, SiN, SiON, SiC, SiCN, SiOCN, a nitride material, or another type of material. The hard mask material 135 may be formed using any suitable process, such as ALD, PVD, CVD, a combination thereof, or the like. In some embodiments, the protective mask 134 is removed after the hard mask material 135 has been formed using a wet etching process or a dry etching process. In some embodiments, excess hard mask material 135 outside of the recesses 121 is removed using a planarization process (e.g., a CMP process). A timed etch may then be performed to etch the hard mask material 135 within the recesses 121 such that a desired amount of hard mask material 135 remains over the buried metal 132.

Figure 28:
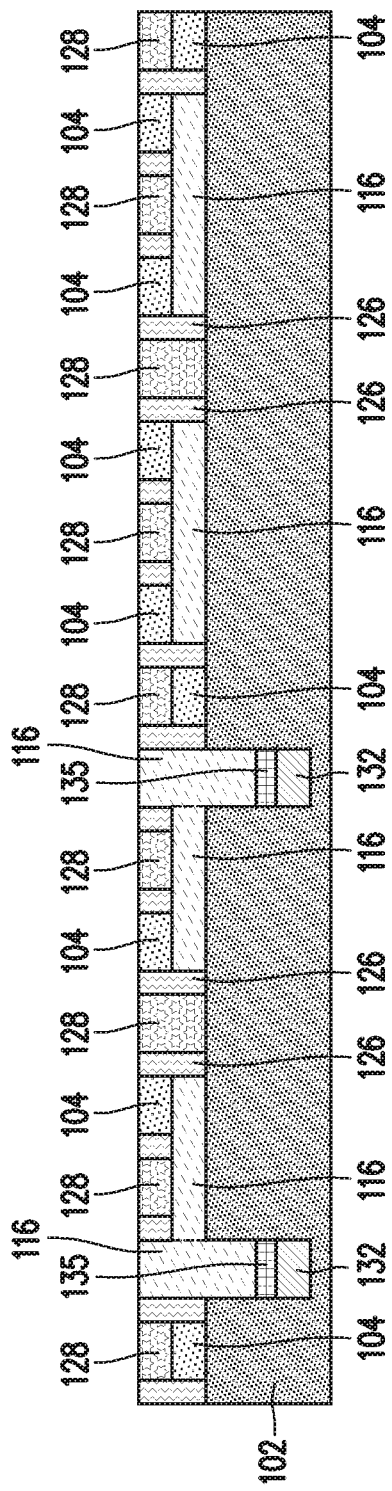
Figure 29:
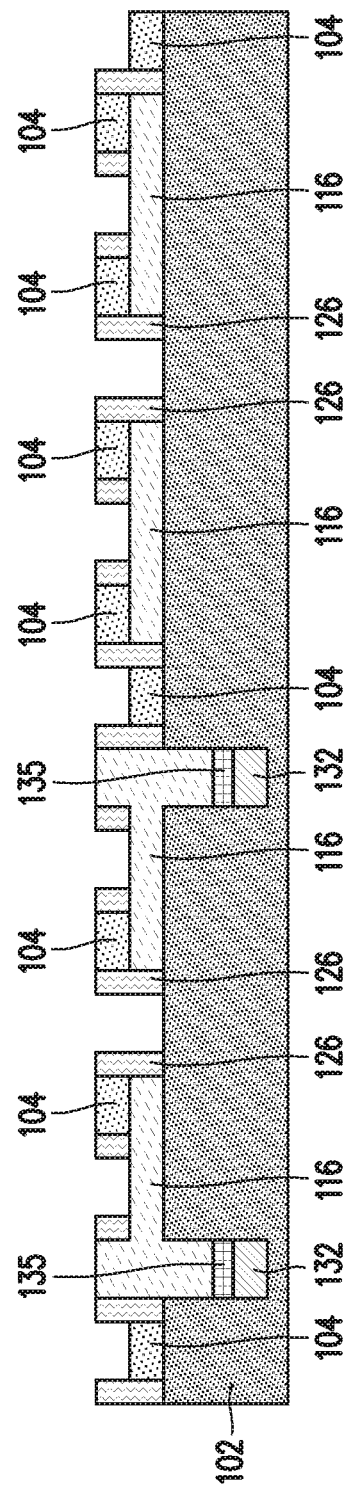
Figure 30:
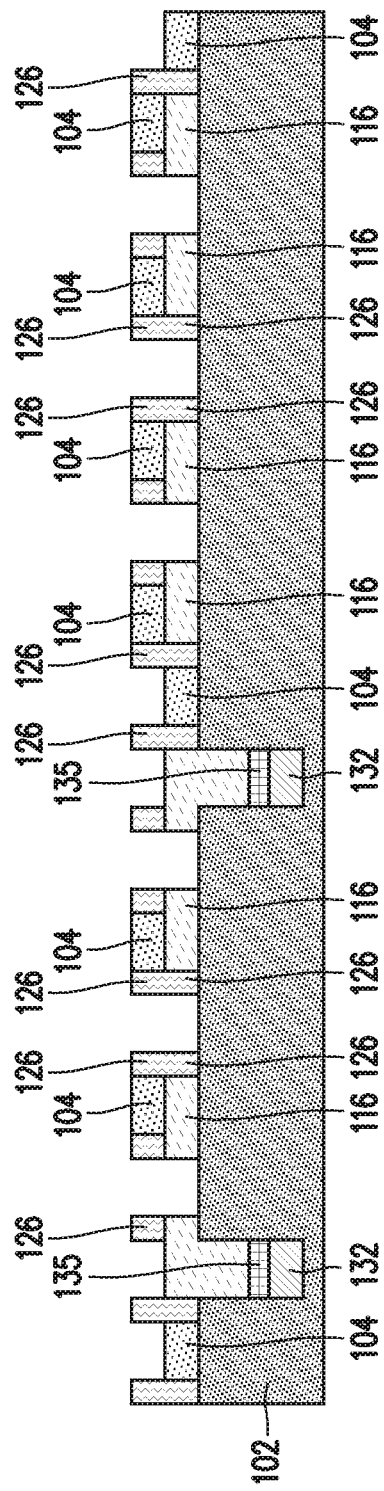

In FIG. 28, a second deposition of the third material 116 is performed, forming the third material over the hard mask material 135 within the recesses 121. The third material 116 may be formed using a previously described deposition technique for forming the third material 116. A planarization process such as a CMP process may be performed after the third material 116 is deposited. In FIG. 29, the second photoresist 128 is removed. The second photoresist 128 may be removed, for example, using a dry process (e.g., an ashing process) or a wet process (e.g., a wet chemical process). In FIG. 30, an etching process is used to remove exposed portions of the third material 116. Portions of the third material 116 over the buried metal 132 are left remaining after the etching process. In some cases, the top surface of the third material 116 remaining over the buried metal 132 may be about level with the top surface of other portions of third material 116, such as those covered by the first material 104. In some embodiments, the etching system performing the etching process may be configured to detect when the substrate 102 is exposed and stop the etching process once the substrate 102 beneath portions of the third material 116 is exposed. In some embodiments, the height of the remaining third material 116 over the buried metal 132 may be determined using a timed etching process. The etching process may be a dry etching process, a wet etching process, or a combination. For example, the etching process may include an anisotropic dry etching process.

Figure 31:
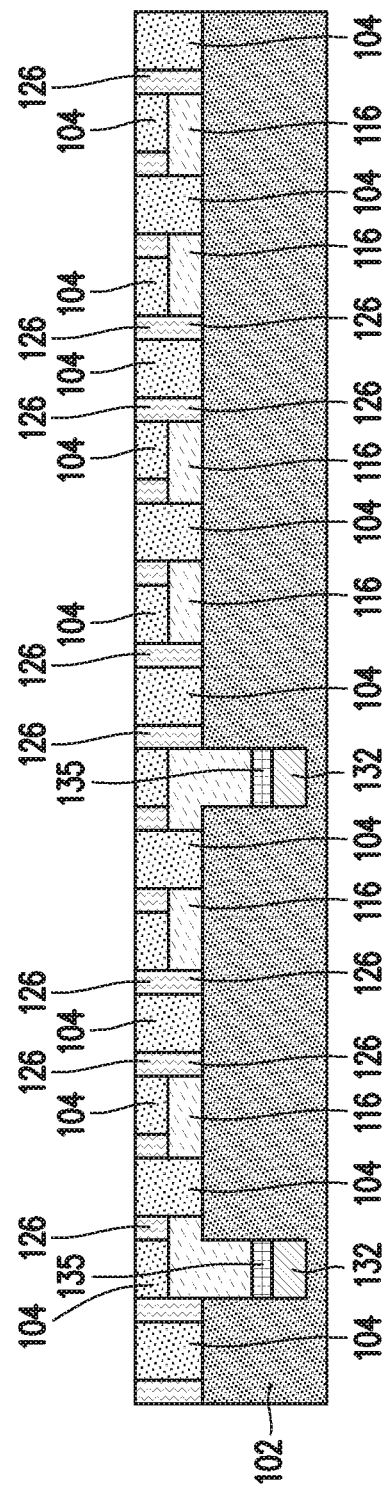
Figure 32:
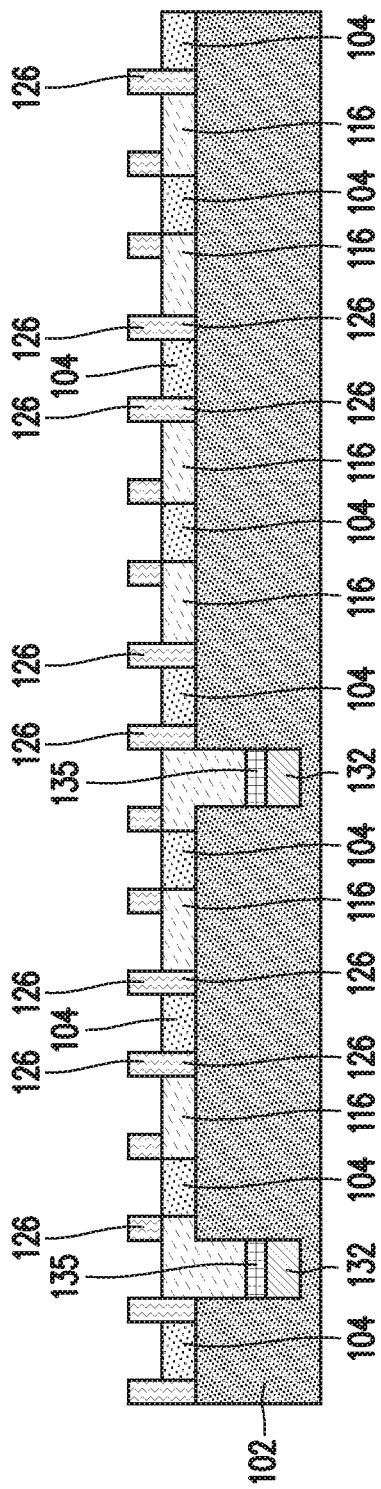

In FIG. 31, a second deposition of the first material 104 is performed. The first material 104 may be formed such that the top surfaces of the first material 104 are about level with the top surfaces of the fourth spacers 126. For example, a planarization process (e.g., a CMP process) may be performed after deposition of the first material 104. The first material 104 of FIG. 31 may have the same composition as the first material 104 of FIG. 2, and may be formed using the same deposition technique as previously described for the first material 104. In FIG. 32, an etching process is used to remove exposed portions of the first material 104. Portions of the first material 104 are left remaining after the etching process. In some cases, the top surface of the first material 104 remaining may be about level with the top surface of portions of third material 116. In some embodiments, the etching system performing the etching process may be configured to detect when the third material 116 is exposed and stop the etching process once the third material 116 beneath the first material 104 is exposed. In some embodiments, the height of the remaining first material 104 may be determined using a timed etching process. The etching process may be a dry etching process, a wet etching process, or a combination. For example, the etching process may include an anisotropic dry etching process.

Figure 33:
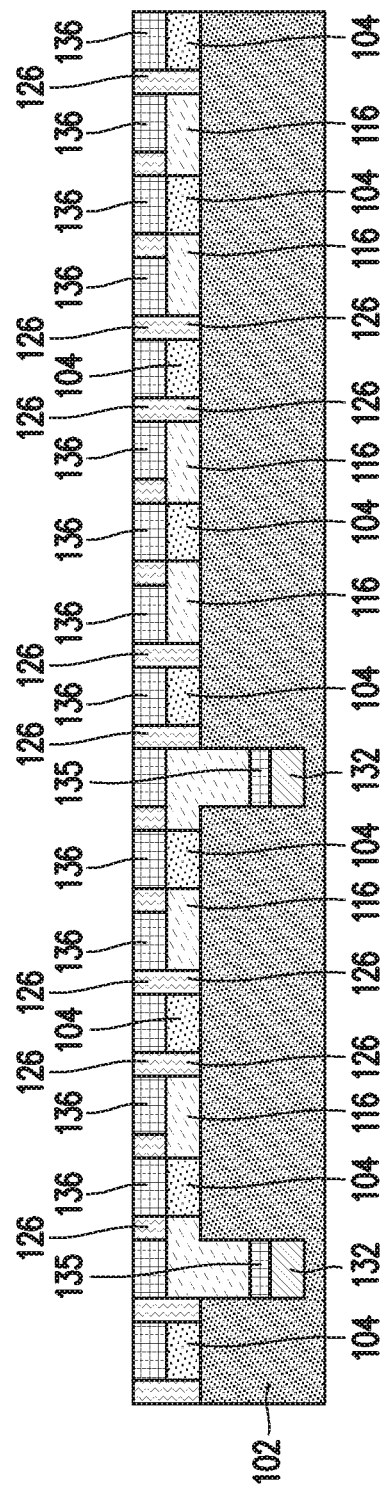
Figure 34:
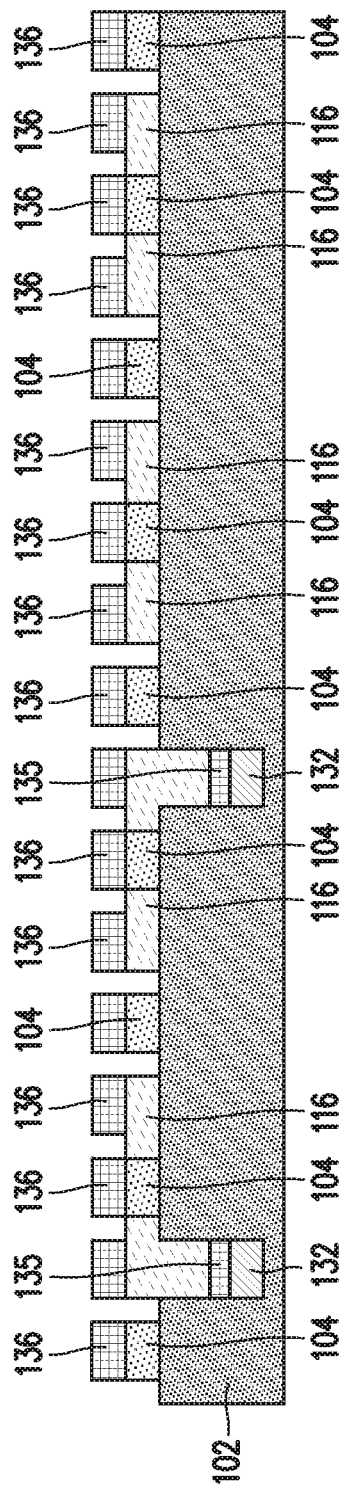

In FIG. 33, the hard mask material 136 is formed over the structure. The hard mask material 136 may be formed such that the top surfaces of the hard mask material 136 are about level with the top surfaces of the fourth spacers 126. For example, a planarization process (e.g., a CMP process) may be performed to control the height of the hard mask material 136. The hard mask material 136 may be a material similar to that of hard mask material 135 described previously or may be a different material. In FIG. 34, the fourth spacers 126 are removed. The fourth spacers 126 may be removed using a dry etching process, a wet etching process, or a combination. For example, an anisotropic dry etching process selective to the fourth spacers 126 over the hard mask material 136 may be used. Removing the fourth spacers 126 exposes portions of the substrate 102.

Figure 35:
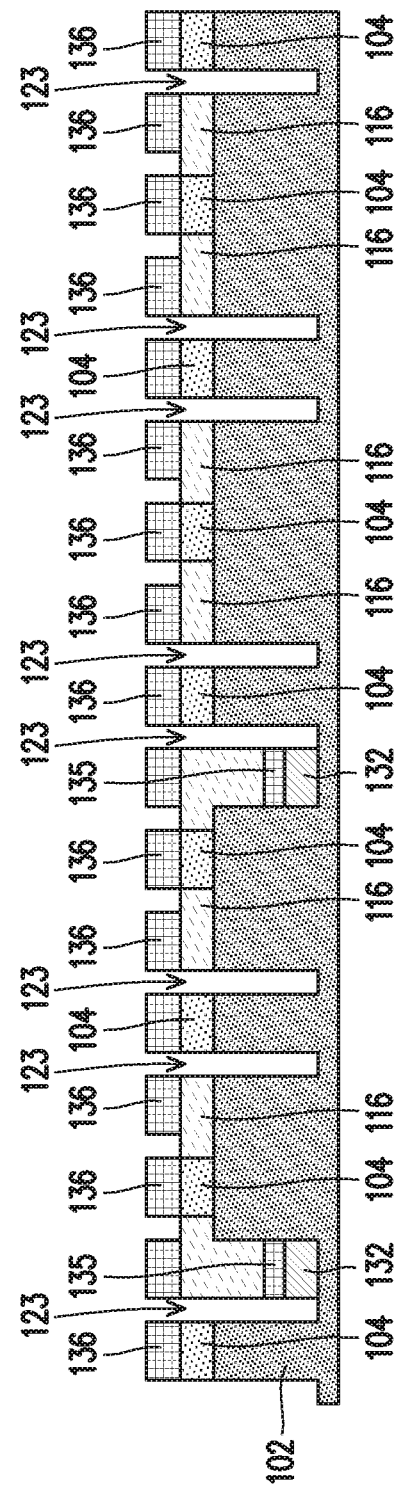

In FIG. 35, an etching process is performed on the exposed portions of the substrate 102 to form recesses 123 in the substrate 102. The etching process may include one or more dry etching processes, wet etching processes, or a combination. In some embodiments, the recesses 123 in the substrate 102 extend a depth into the substrate approximately equal to that of the recesses 121. After the etching process, first sidewalls of the buried metal 132 are exposed by the recesses 123. In FIG. 36, a fifth spacer material 127 is formed within the recesses 123. In some embodiments, the fifth spacer material 127 is similar to the fourth spacers 126, though the fifth spacer material 127 may be different in other embodiments. The fifth spacer material 127 may be formed such that the top surface of the fifth spacer material 127 are about level with the top surface of the first material 104 on the substrate 102. For example, the fifth spacer material 127 may be etched back after deposition using a timed etching process.

In FIG. 37, exposed portions of the third material 116 are removed. The portions of the third material 116 may be removed using a dry etching process, a wet etching process, or a combination. For example, an anisotropic dry etching process selective to the third material 116 over the hard mask material 135 may be used. Removing the exposed portions of the third material 116 exposes portions of the substrate 102.

Figure 38:
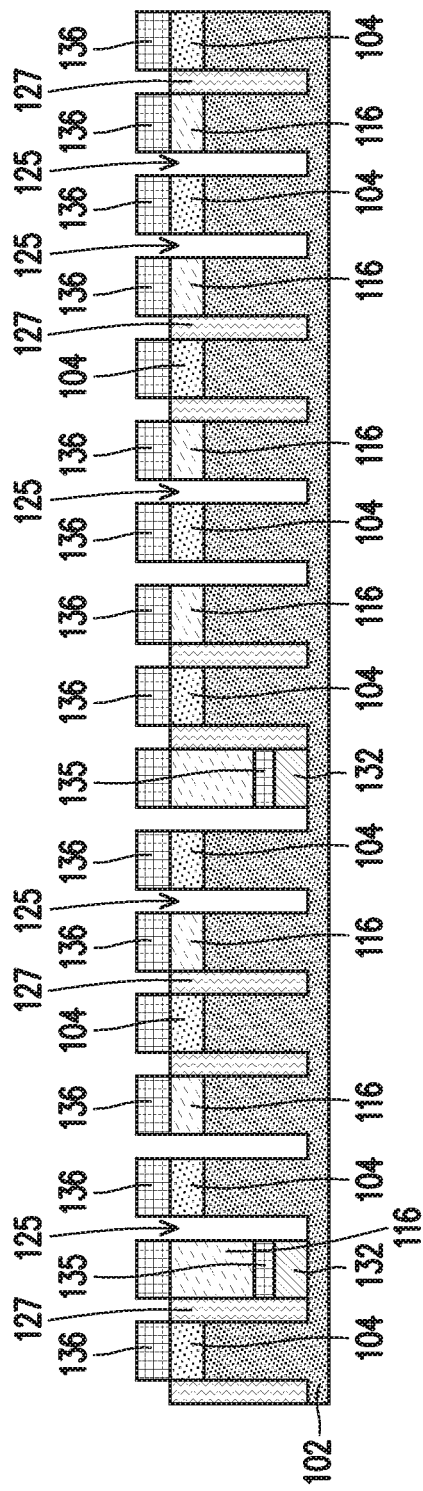

In FIG. 38, an etching process is performed on the exposed portions of the substrate 102 to form recesses 125 in the substrate 102. The etching process may include one or more dry etching processes, wet etching processes, or a combination. In some embodiments, the recesses 125 in the substrate 102 extend a depth into the substrate approximately equal to that of the recesses 121 or the recesses 123. After the etching process, second sidewalls of the buried metal 132 are exposed by the recesses 125.

Figure 39:
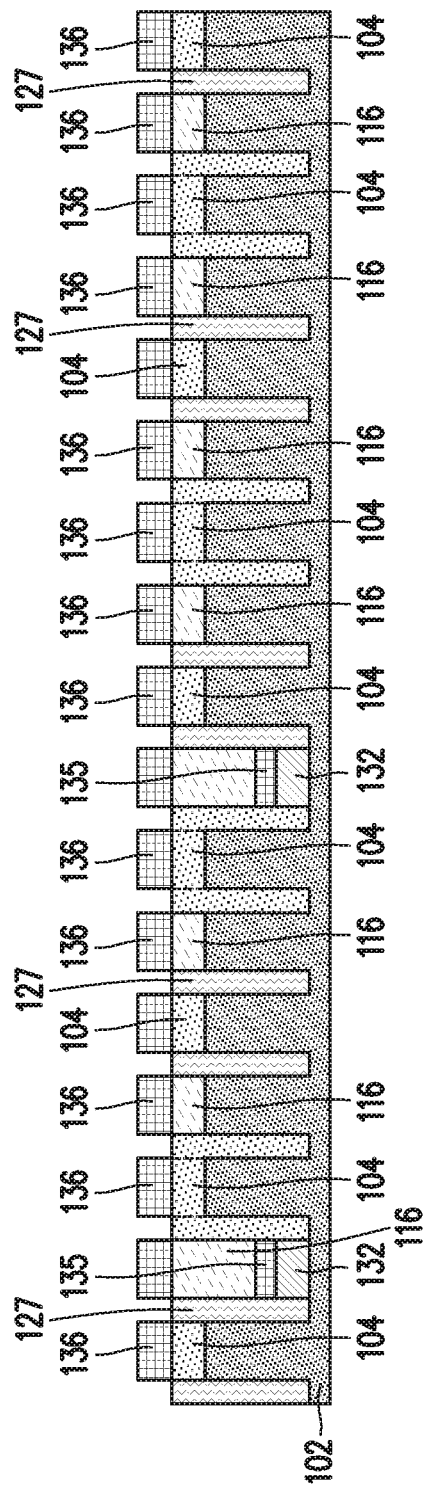

In FIG. 39, a third deposition of the first material 104 is performed, forming the first material 104 within the recesses 125. The first material 104 may be formed such that the top surface of the first material 104 are about level with the top surface of the fifth spacer material 127. For example, the first material 104 may be etched back after deposition using a timed etching process. The first material 104 may be formed using a previously described deposition technique for the first material 104.

Figure 40:
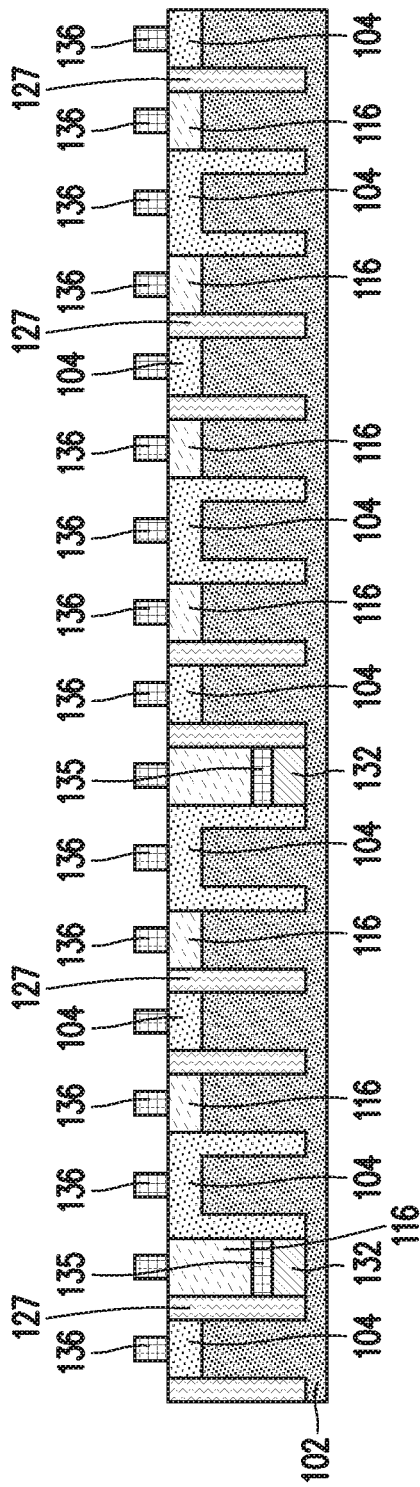

In FIG. 40, a trimming process is performed on the exposed hard mask material 136. The trimming process reduces the size of the exposed hard mask material 136. The trimming process may include a dry etching process, a wet etching process, or a combination. In some embodiments, after the trimming process, the exposed hard mask material 136 may have a width between about 1 nm and about 10 nm, or another width.

Figure 41:
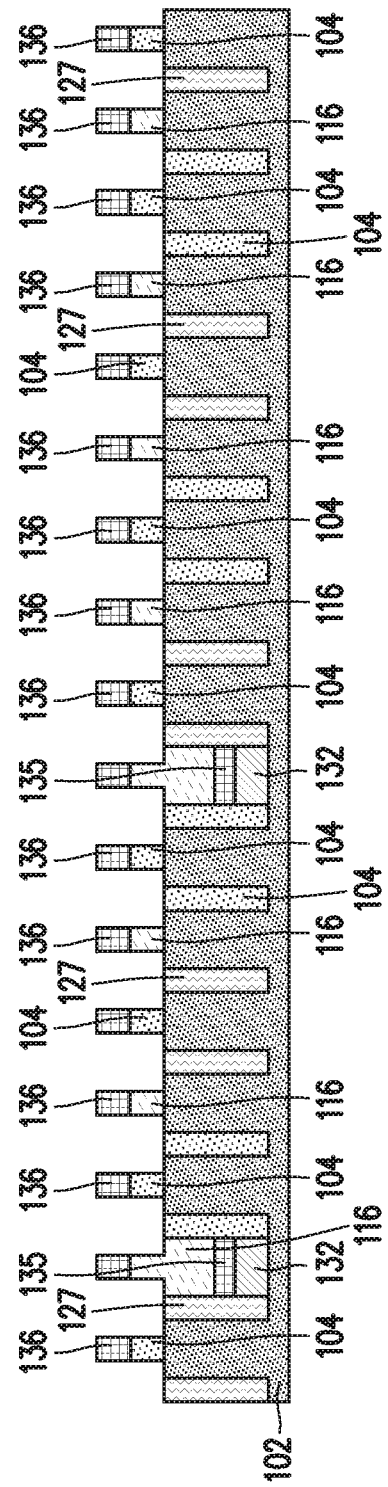

In FIG. 41, exposed portions of the first material 104, third material 116, and fifth spacer material 127 are removed using one or more etching processes. The one or more etching processes may include one or more dry etching processes, wet etching processes, or a combination. For example, one or more anisotropic dry etching processes may be used. In some embodiments, the exposed hard mask material 136 may be used as an etch mask for the etching of the first material 104, third material 116, and fifth spacer material 127.

Figure 42:
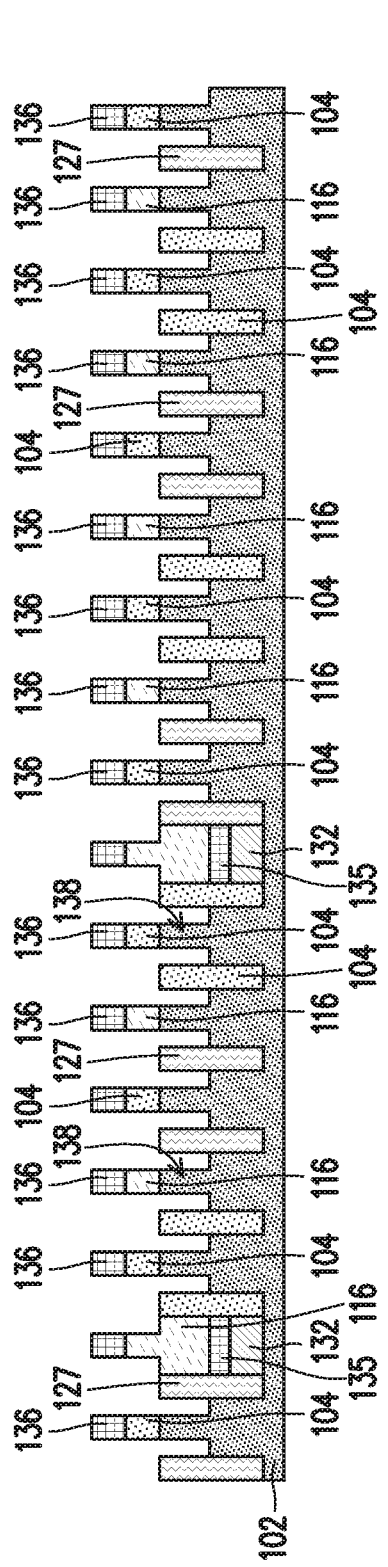

In FIG. 42, exposed portions of the substrate 102 are removed, forming fins 138. The portions of the substrate 102 may be removed using a dry etching process, a wet etching process, or a combination. For example, an anisotropic dry etching process selective to the material of the substrate 102 over the first material 104, third material 116, fifth spacer material 127, or hard mask material 136 may be used. In some embodiments, the substrate 102 may be etched a depth such that the surface of the substrate 102 between fins 138 is about level with top surface of the hard mask material 135 disposed on the buried metal 132. In this manner, semiconductor fins 138 are formed protruding from portions of the substrate 102. In some embodiments, the fins 138 may have a height between about 30 nm and about 100 nm, or a width between about 1 nm and about 10 nm. In other embodiments, the semiconductor fins 138 may have another height or another width. In some cases, having first material 104 and third material 116 disposed on different fins 138 allows the use of selective etching techniques to remove particular fins.

Figure 43A:
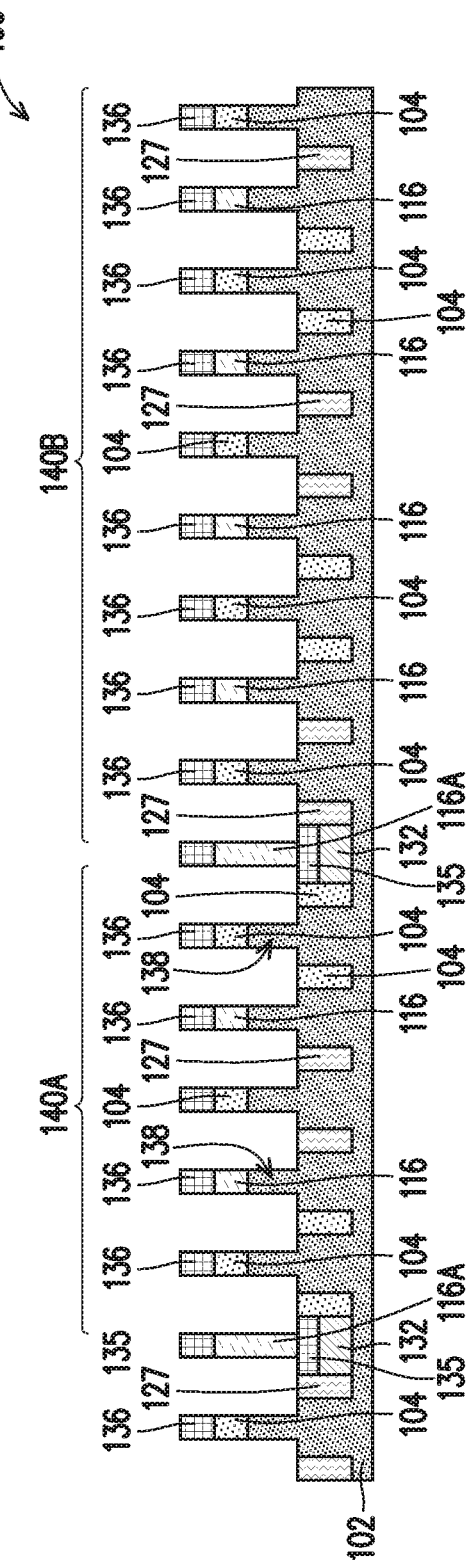

In FIG. 43A, exposed portions of the first material 104, third material 116, and the fifth spacer material 127 that are not covered by the hard mask material 136 are removed using one or more etching processes. The etching processes may include one or more dry etching processes, one or more wet etching processes, or a combination. For example, anisotropic dry etching processes selective to the first material 104, third material 116, and the fifth spacer material 127 over the hard mask material 135 and the material of the substrate 102 may be used. In some embodiments, the exposed portions of the first material 104, third material 116, and the fifth spacer material 127 may be etched a depth such that top surface of the etched first material 104, third material 116, and fifth spacer material 127 are approximately level with a top surface of the hard mask material 135 disposed on the buried metal 132. In FIG. 43A and subsequent Figures, the portion of third material 116 remaining over the buried metal 132 has been labeled as third material 116A.

In some embodiments, different "cells" of FinFETs may be separated and electrically isolated by the third material 116A disposed over the buried metal 132. As illustrative examples, portions of cells 140A-F are indicated in the cross-sectional view of FIG. 43A and the example plan view of FIG. 43B. FIG. 43B shows the fins 138 of the cells 140A-F as having been isolated into rows, but in other embodiments, the fins 138 may be isolated in a different process step or in a different configuration. The cells may be, for example, cells of a SRAM array. The buried metal 132 may be electrically connected to one or more metal gates of the FinFETs, or the metal gates of one or more cells, described in greater detail below. In some embodiments, a portion of buried metal 132 may extend adjacent multiple cells of FinFETs, and some or all of the multiple cells of FinFETs may be electrically connected together by being electrically connected to the same portion of buried metal 132. For example, as shown in FIG. 43B, the buried metal 132 may extend continuously along multiple rows of fins or along multiple cells, and may be connected to some, none, or all of the fins or cells disposed next to the buried metal 132. A cell may include one or more fins 138 used to form one or more FinFETs within that cell. As an exemplary example, a cell may contain 4 fins 138 that are used to form 6 FinFETs (i.e., for a six-transistor (6T) SRAM cell). Other numbers of fins 138 (e.g., 2, 3, 6, etc.) or FinFETs in a cell are possible and within the scope of this disclosure.

Figure 44:
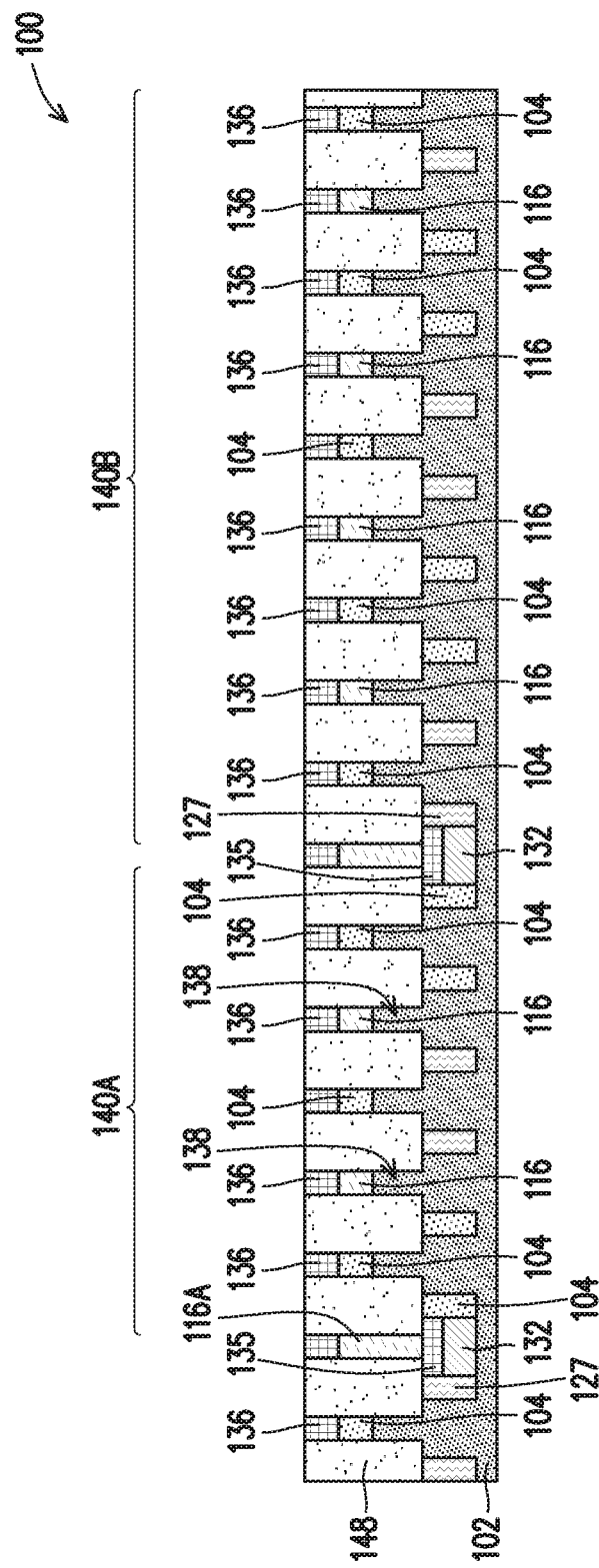

In FIG. 44, an insulation material is formed over the substrate 102 and between neighboring fins 138, forming Shallow Trench Isolation (STI) 148. The cross-sectional view of FIG. 44 may be along the example cross-section AA-AA, shown in FIG. 45A. The STI 148 may be formed from an oxide, such as silicon oxide, a nitride, the like, or a combination thereof, and may be formed by a high density plasma chemical vapor deposition (HDP-CVD), a flowable CVD (FCVD), the like, or a combination thereof. In some embodiments, a planarization process such as a CMP may be may be performed after the insulation material is formed. In some embodiments, the STI 148 may be recessed such that the top surface of the STI 148 is below the top surfaces of the fins 138.

Figure 45A:
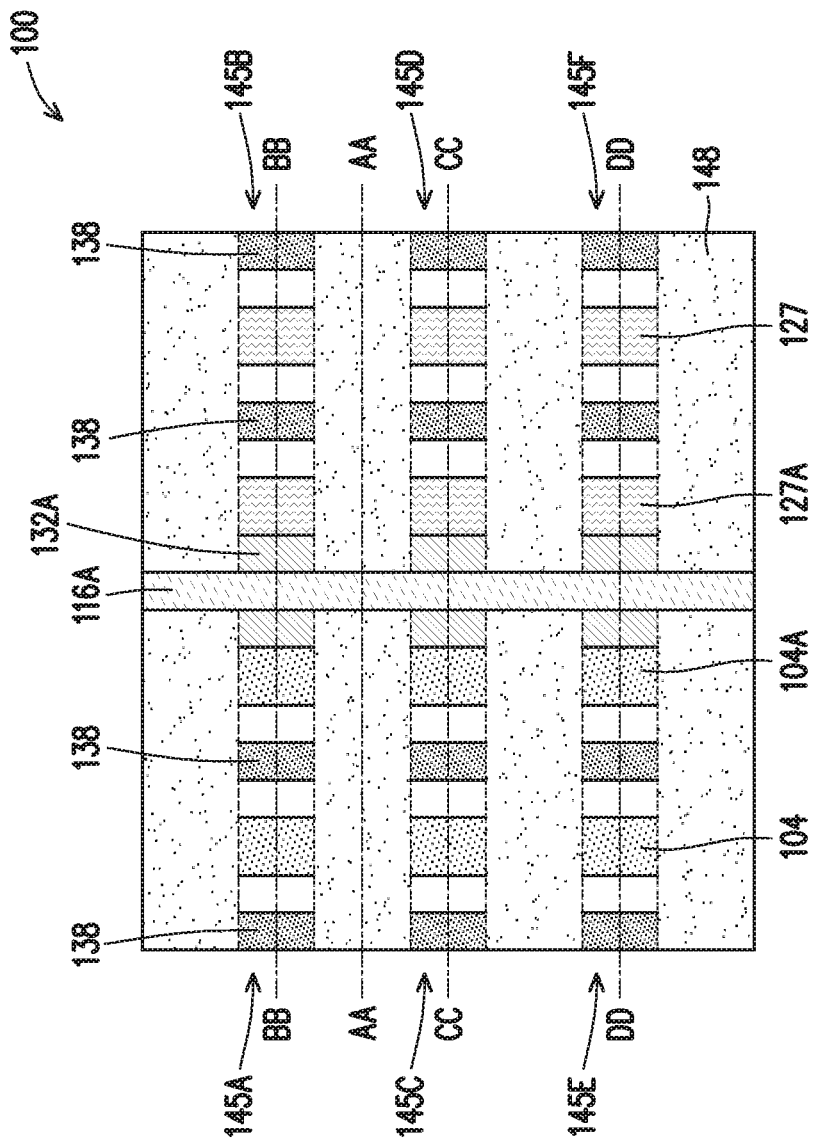
FIGS. 45A-47D illustrate cross-sectional views and plan views of intermediate stages in the formation of dummy gate stacks in accordance with a first embodiment.
Figure 45B:
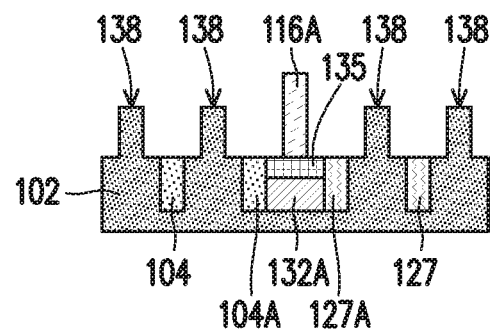
Figure 45C:
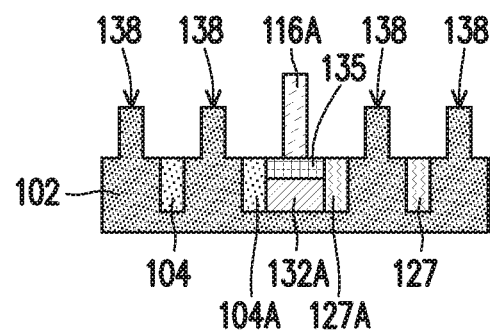
Figure 45D:
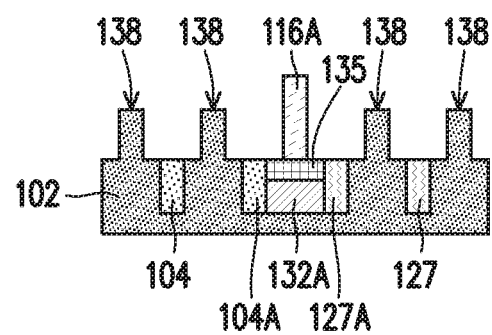
Figure 46A:
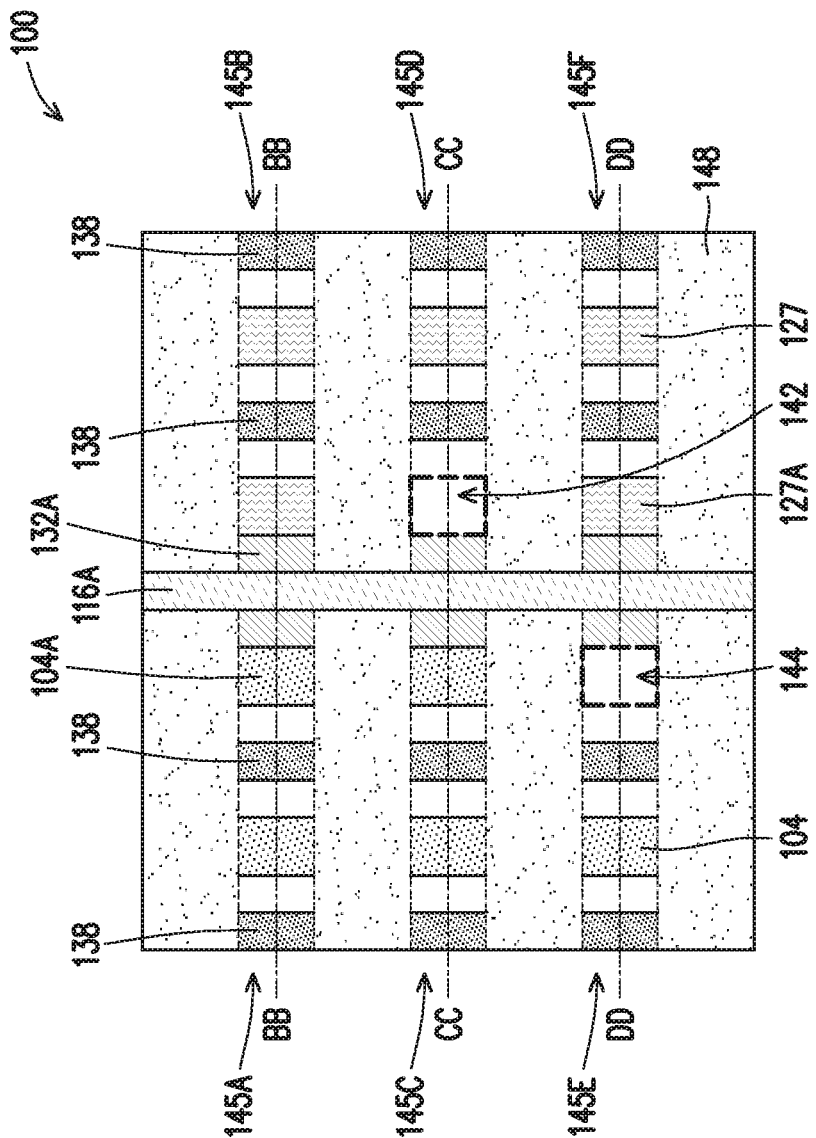
Figure 46B:
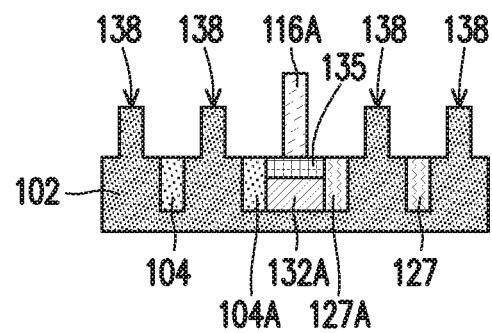
Figure 46C:
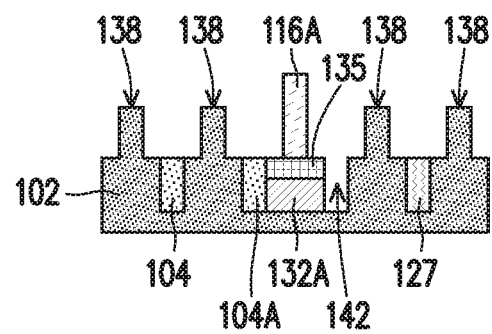
Figure 46D:
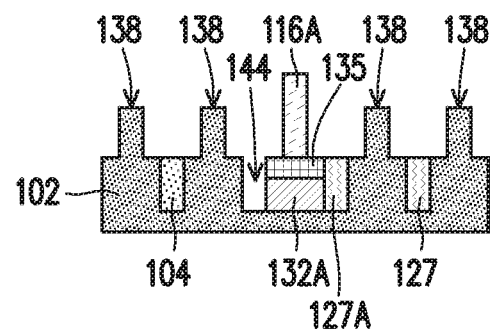
Figure 47A:
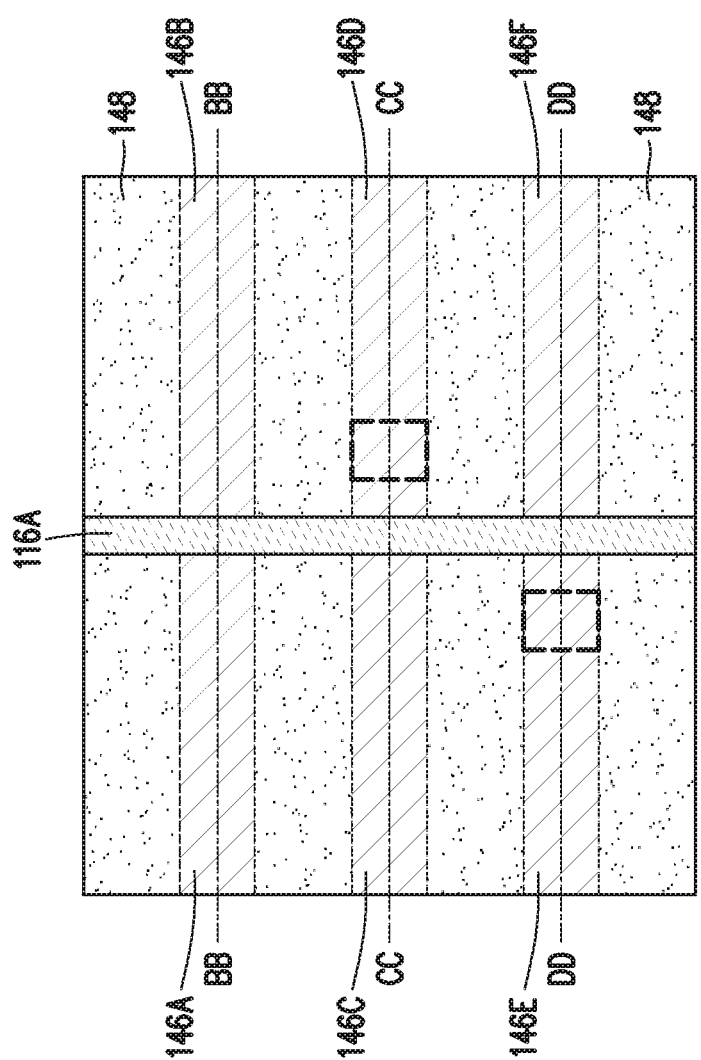
Figure 47B:
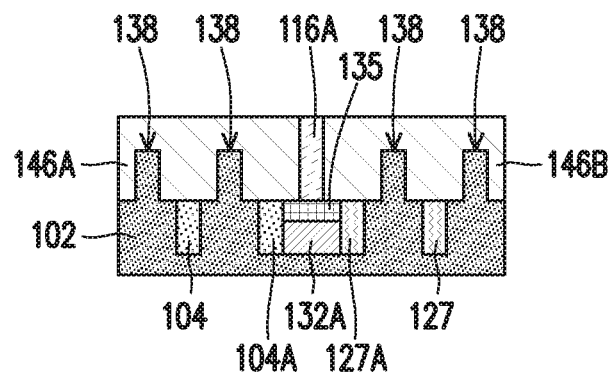
Figure 47C:
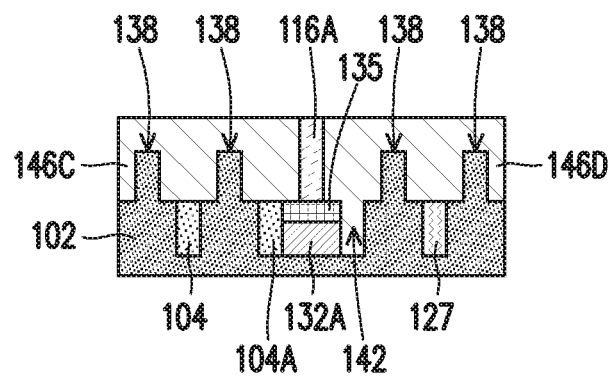
Figure 47D:
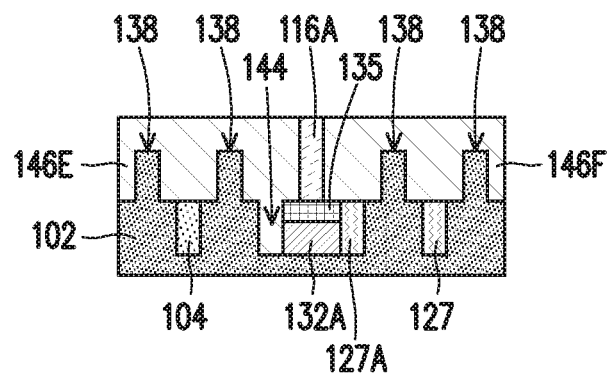

FIGS. 45A-45D, 46A-46D, and 47A-47D illustrate the formation of dummy gate structures 147A-F over the fins 138 of FinFET device 100, according to some embodiments. FIGS. 45A, 46A, and 47A show example plan views of a portion of FinFET device 100. FIGS. 45B, 46B, and 47B show example cross-sectional views along cross-section BB-BB as indicated in FIGS. 45A, 46A, and 47A. FIGS. 45C, 46C, and 47C show example cross-sectional views along cross-section CC-CC as indicated in FIGS. 45A, 46A, and 47A. FIGS. 45D, 46D, and 47D show example cross-sectional views along cross-section DD-DD as indicated in FIGS. 45A, 46A, and 47A. Each of cross-sections BB-BB, CC-CC, and DD-DD are perpendicular to the longitudinal direction of the fins 138 and are across subsequently formed metal gate structures, as in the cross-section A-A shown in FIG. 1. Additionally, the first material adjacent the buried metal 132 has been labeled as first material 104A, and the fifth spacer material 127 adjacent the buried metal 132 has been labeled as fifth spacer material 127A.

In FIGS. 45A-45D, the STI 148, the first material 104 disposed on the fins 138, and the third material 116 disposed on the fins 138 are removed from regions 145A-F. The STI 148, the first material 104, and the third material 116 may be removed from regions 145A-F using suitable photolithographic techniques. For example, the STI regions 148, the first material 104, and the third material 116 may be removed using one or more dry etching processes, one or more wet etching processes, or a combination. In some embodiments, the STI 148 in regions 145A-F are removed before removing the first material 104 or the third material 116. In some embodiments, anisotropic dry etching processes selective to the first material 104 and the third material 116 may be used. In this manner, the fins 138 in the regions 145A-F are exposed. In some embodiments, the STI 148 within the regions 145A-F may be recessed such that portions of the STI 148 remain within the regions 145A-F. The regions 145A-F shown in FIGS. 46A and 47A are intended as non-limiting examples, and other embodiments may include regions of a different number, shape, size, or other characteristics.

In FIGS. 46A-46D, portions of the first material 104A and the fifth spacer material 127A are removed to expose sidewall portions of the buried metal 132 within regions 145A-F. In the example embodiment shown in FIGS. 46A-D, none of the first material 104A or fifth spacer material 127A is removed from region 145A or region 145B.

As shown in FIG. 46C, the fifth spacer material 127A is removed from region 145D, forming a recess 142 that exposes a sidewall of the buried metal 132. The fifth spacer material 127A may be removed using suitable photolithographic techniques. For example, the fifth spacer material 127A may be removed using one or more dry etching processes, one or more wet etching processes, or a combination. For example, an anisotropic dry etching process selective to the fifth spacer material 127A over the first material 104A may be used. In this manner, the conductive material 132 is only exposed on the sidewall facing the fifth spacer material 127A. In other words, the buried metal 132 is exposed by forming the recess 142 in region 145D and not exposed in region 145C. The buried metal 132 in region 145C remains isolated by the first material 104A and the hard mask material 136. In some embodiments, the recess 142 may have a lateral aspect ratio as shown in FIG. 46A between about 1:5 and about 1:10.

As shown in FIG. 46D, the first material 104A is removed from region 145E, forming a recess 144 that exposes a sidewall of the buried metal 132. The first material 104A may be removed using suitable photolithographic techniques. For example, the first material 104A may be removed using one or more dry etching processes, one or more wet etching processes, or a combination. For example, an anisotropic dry etching process selective to the first material 104A over the fifth spacer material 127A may be used. In this manner, the buried metal 132 is only exposed on the sidewall facing the first material 104A. In other words, the buried metal 132 is exposed by forming the recess 144 in region 145E and not exposed in region 145F. The buried metal 132 in region 145F remains isolated by the fifth spacer material 127A and the hard mask material 136. In some embodiments, the recess 144 may have a lateral aspect ratio as shown in FIG. 46A between about 1:5 and about 1:10.

Because the buried metal 132 is isolated by the first material 104A on one side and isolated by the fifth spacer material 127A on the opposite side, the first material 104A or the fifth spacer material 127A may be selectively etched to expose desired portions on either side of the buried metal 132. As such, the distance between the conductive material and neighboring fins 138 may be reduced with less chance of process defects, such as exposing both sides of the buried metal 132 in regions where only one side is intended to be exposed. In some embodiments, both the first material 104A and the fifth spacer material 127A may be removed from opposite sides of the buried metal 132.

In FIGS. 47A-47D, dummy gate structures 146A-F are formed in regions 145A-F. In some embodiments, the dummy gate structures 146A-F may include multiple layers, such as a dummy dielectric layer, a dummy gate layer, or other layers. A dummy dielectric layer may include, for example, silicon oxide, silicon nitride, a combination thereof, or the like, and may be deposited or thermally grown according to acceptable techniques (e.g., thermal oxidation). A dummy gate layer may be formed over the dummy dielectric layer and may include, for example, polycrystalline-silicon (polysilicon), poly-crystalline silicon-germanium (poly-SiGe), metallic nitrides, metallic silicides, metallic oxides, metals, or other materials. The dummy gate layer may be deposited by physical vapor deposition (PVD), CVD, sputter deposition, or another technique. In some embodiments, the dummy gate structure materials are blanket formed over the surface of the FinFET device 100, and then portions are removed using a suitable photolithographic process to form dummy gate structures 146A-F. In some embodiments, a planarization process such as a CMP may be performed to remove excess dummy gate structure material. In some cases, the planarization process may expose the third material 116A, as shown in FIGS. 47B-D. In some embodiments, one or more of the dummy gate structures 146A-F may be formed simultaneously by the same processing steps, or may be formed sequentially in separate processing steps.

In some embodiments, the dummy gate structures 146A-F are formed before the STI 148 is formed. For example, appropriate portions of the first material 104A and fifth spacer material 127A may be removed in regions 145A-F as described above, then dummy gate structures 146A-F may be formed as described above. Portions of the dummy gate structures 146A-F may be removed outside of regions 145A-F via one or more etching processes, and then STI 148 may be formed as described above. This and other variations of processing steps are within the scope of this disclosure.

Figure 48A:
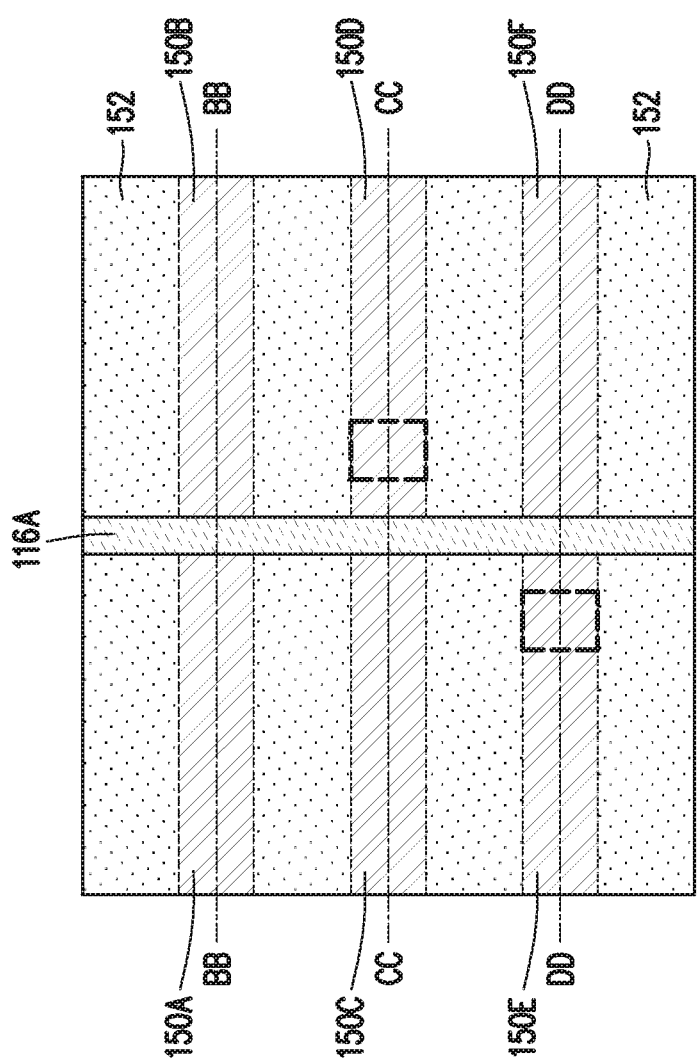
FIGS. 48A-48D illustrate cross-sectional views and plan views of intermediate stages in the formation of metal gate stacks in accordance with a first embodiment.

In FIGS. 48A-48D, the dummy gate structures 146A-F are removed and replaced with metal gate structures 150A-F. The dummy gate structures 146A-F may be removed using one or more dry etching processes, one or more wet etching processes, or a combination. The metal gate structures 150A-F may include gate dielectric layers, metal gate fill material, and other layers such as work-function layers, barrier layers, etc. FIG. 48A also shows interlayer dielectric (ILD) regions 152 that may be formed in some embodiments, for example, after removal of the STI regions 148. The STI regions 148 may be removed using a suitable etching process.

Figure 49:
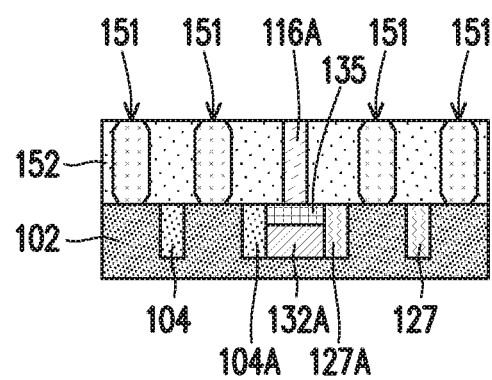
FIG. 49 illustrates a cross-sectional view of an intermediate stage in the formation of epitaxial source/drain regions in accordance with a first embodiment.

FIG. 49 is a cross-sectional view along cross-section AA-AA, showing the formation of epitaxial source/drain regions 151 over the fins 138. In some embodiments, the epitaxial source/drain regions 151 or other FinFET features may be formed prior to formation of the metal gate structures 150A-F, such as gate spacers, additional ILD regions, or other features (not shown). The epitaxial source/drain regions 151 may be formed using suitable techniques as known in the art.

Figure 48B:
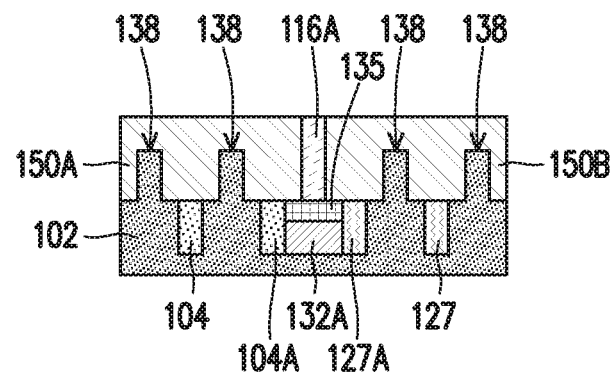

By selectively removing appropriate portions of first material 104A or fifth spacer material 127A adjacent the buried metal 132A shown in FIGS. 47A-D, the metal gate structures 150A-F may contact (and thus make electrical connection to) the buried metal 132 or be isolated from the buried metal 132 as desired. For example, as shown in FIG. 48B, the metal gate structures 150A and 150B are isolated from one another and from the buried metal 132 by the third material 116A, the hard mask material 135, the first material 104A, and the fifth spacer material 127A. The first material 104A and the fifth spacer material 127A remain on sidewalls of the buried metal 132 prevent the metal gate structures 150A and 150B from contacting the sidewalls of the buried metal 132 such that the metal gate structures 150A and 150B are electrically isolated from one another.

Figure 48C:
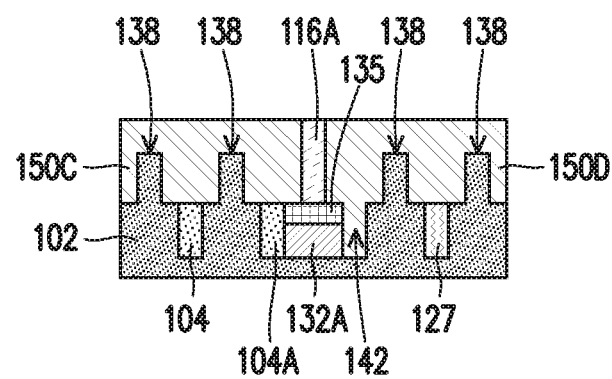
Figure 48D:
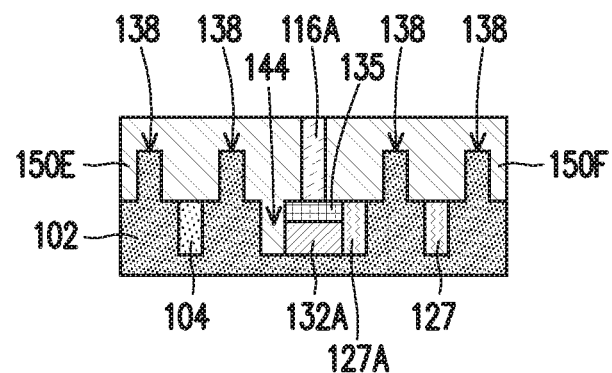

As shown in FIG. 48C, the metal gate structure 150D is electrically connected to the buried metal 132A, but the metal gate structure 150C is isolated from the buried metal 132A by the third material 116A, the first material 140A, and the hard mask material 136. As shown in FIG. 48D, the metal gate structure 150E is electrically connected to the buried metal 132A, but the metal gate structure 150F is isolated from the buried metal 132A by the third material 116A, the fifth spacer material 127A, and the hard mask material 136. In the example embodiment shown in FIGS. 48B-D, the metal gate structure 150D and the metal gate structure 150E are both electrically connected to the buried metal 132A and are thus both electrically connected to each other. Metal gate structures 150A-E are illustrative examples, and metal gate structures may be connected or isolated from buried metal in other configurations or combinations than shown.

FIGS. 50-80 illustrate cross-sectional views of intermediate stages in the formation of a FinFET device 200, according to a second embodiment. FIGS. 50-76 are illustrated along the reference cross-section A-A of FIG. 1. The FinFET device 200 is similar to FinFET device 1oo shown in FIG. 1, but multiple fins 226 and multiple metal gates 234A-F are formed.

Figure 50:
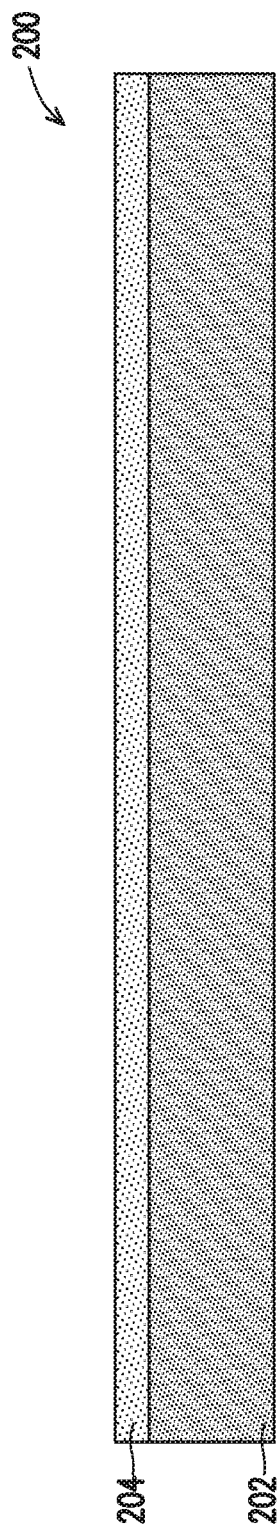

FIG. 50 illustrates the formation of a first material 204 over a top surface of a substrate 202. The substrate 202 may be similar to substrate 102 described previously, or be a different type of substrate. The first material 204 may be similar to the first material 104 described previously, or be a different material. For example, the first material 204 may be a material such as SiO, SiN, SiON, SiC, SiCN, SiOCN, a nitride material, or another type of material. The first material 204 may be formed using a process such as ALD, PVD, CVD, or the like. In some embodiments, the first material 204 may be formed having a thickness between about 5 nm and about 25 nm, though the first material 204 may have another thickness in other embodiments.

Figure 51:
Figure 52:
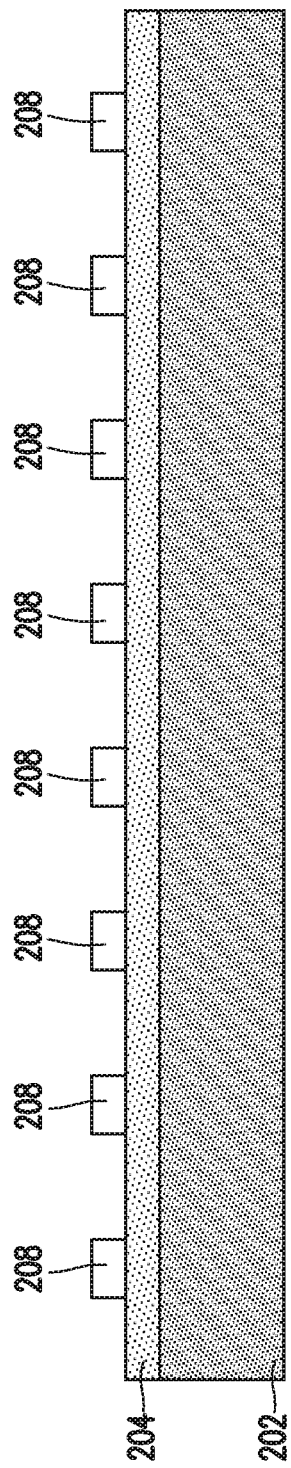

In FIG. 51, a mandrel material is formed over the first material 204 and patterned to form first mandrels 206. The mandrel material of the first mandrels 206 may be different the first material 204, and may be similar to the mandrel material of first mandrels 108 described above. The first mandrels 206 may be formed using similar techniques as described above for the first mandrels 108. In some embodiments, the first mandrels 206 may be formed having a thickness between about 5 nm and about 25 nm, though the first mandrels 206 may have another thickness in other embodiments. First spacers 208 are then formed on the sidewalls of the first mandrels 206. The material of the first spacers 208 may be different than the material of the first mandrels 206 and may be similar to the first spacer material of the first spacers 110 described previously. The first spacers 208 may be formed using similar techniques as described above for the first spacers 110. For example, a suitable dry anisotropic etching process may be performed to remove horizontal portions of the material of the first spacers 208. In FIG. 52, the first mandrels 206 are removed. The first mandrels 206 may be removed using a suitable etching process, such as a dry etching process, a wet etching process, or a combination. The etching process may be selective to the material of the first mandrels 206 over the material of the first spacers 208 or the first material 204.

Figure 53:
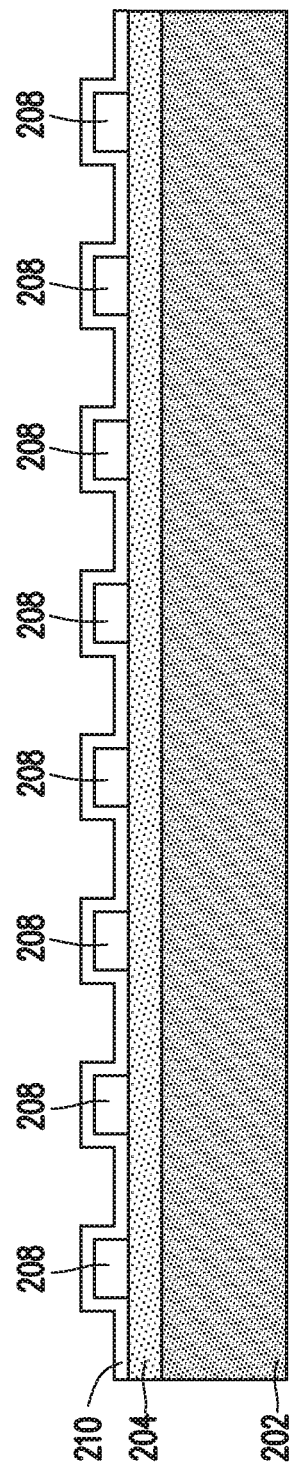

In FIG. 53, second material 210 is formed over the first spacers 208 and the first material 204. The second material 210 may be different than the material of the first mandrels 206 or the first material 204. The second material 210 may be similar to the second material 106 described above, and may be formed in a similar manner. For example, the second material 210 may be a material such as SiO, SiN, SiON, SiC, SiCN, SiOCN, a nitride material, or another type of material. The second material 210 may be formed using a process such as ALD, PVD, CVD, or the like. In some embodiments, the second material 210 is formed having a thickness that is less than that of the first spacers 208.

Figure 54:
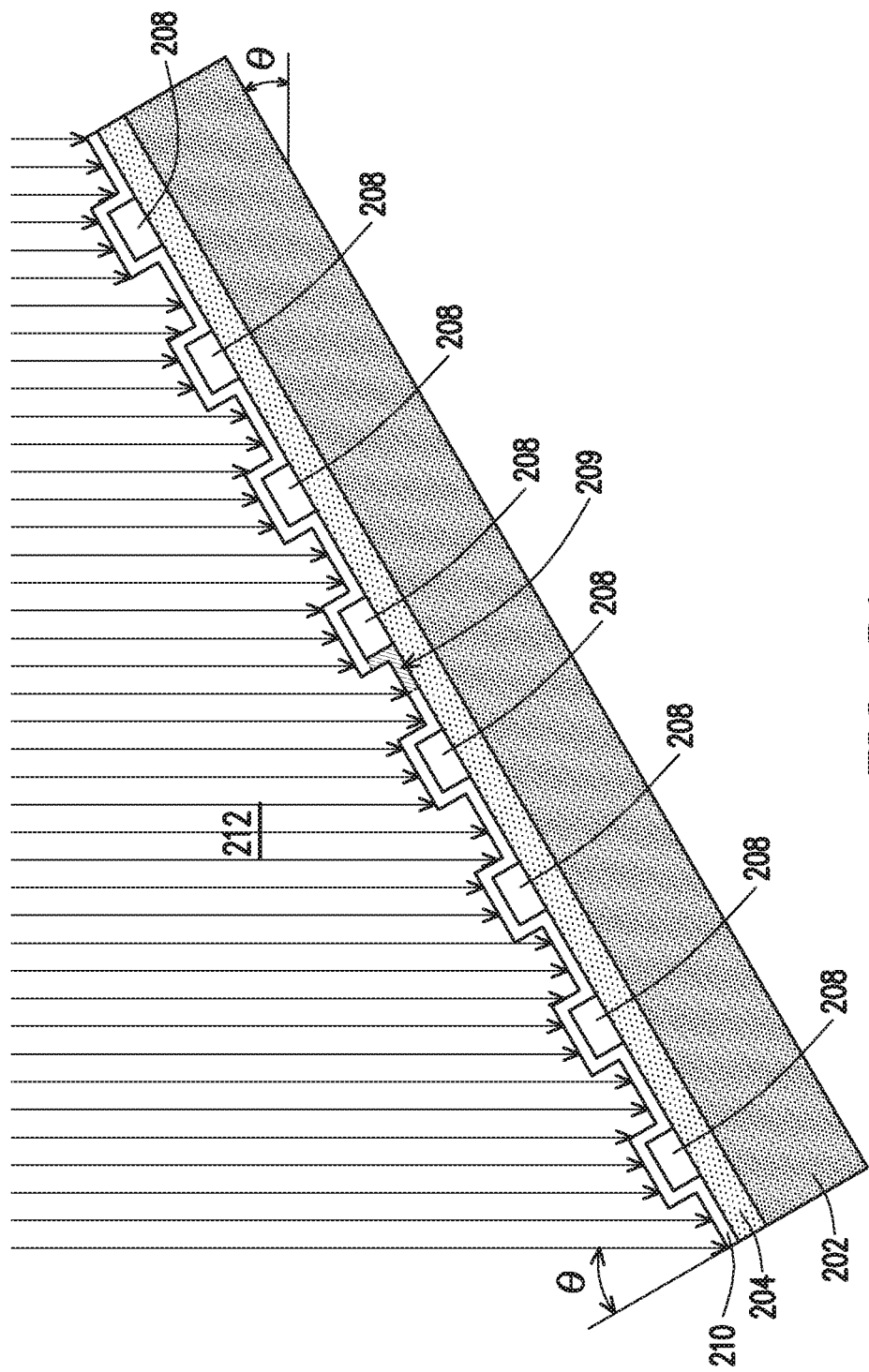
Figure 55:
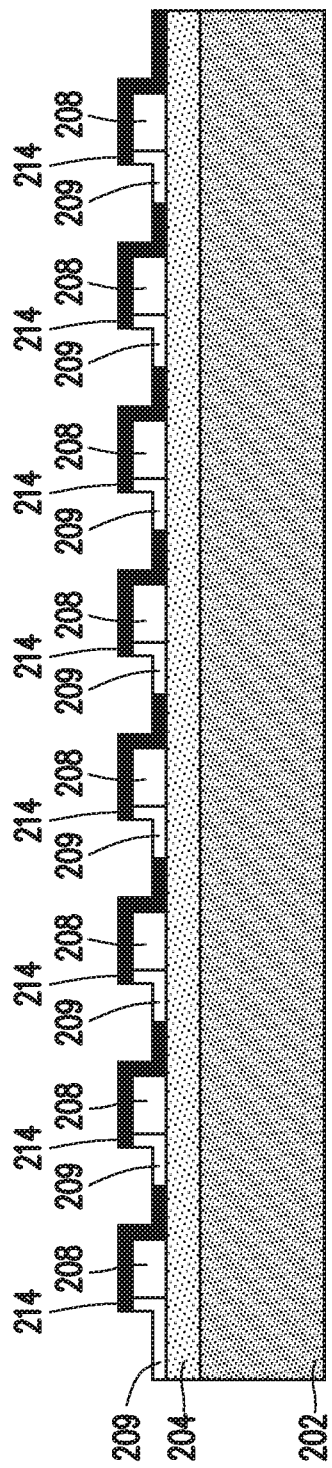

In FIG. 54, an implantation process 212 is performed on portions of the second material 210. The implantation process 212 may implant one or more species of ions such as boron, iron, other types of ions, a combination, or the like. In some cases, the implantation process 212 may also implant ions into portions of the first spacers 208, the first material 104, or the substrate 202. In some embodiments, the substrate 202 is tilted at an angle θ during the implantation process 212 such that the ions are directed obliquely at surfaces of the second material 210. In some embodiments, the angle θ is between about 10° and about 80°, though another implant angle may be used in other embodiments. In this manner, some portions of the second material 210 are shadowed from the ions, an example of which is shown in FIG. 54 as shadowed region 209. Due to the ions being blocked during the implantation process 212, the shadowed portions of the second material 210 have a smaller concentration of implanted ions than portions of the second material 210 that are exposed to the ions. FIG. 55 illustrates implanted regions 214 of the second material 210 which have a greater concentration of ions due to being exposed to ions during the implantation process 212 and shadowed regions 209 of the second material 210 which have a smaller concentration of ions due to being shadowed to ions during the implantation process 212.

Figure 56:
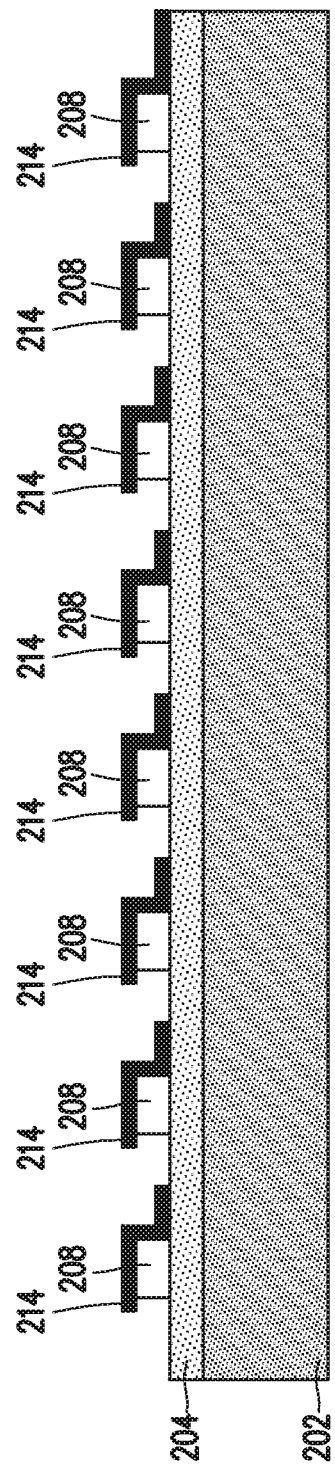

In FIG. 56, the shadowed regions 209 of the second material 210, which have a smaller concentration of ions, are removed using a selective etching process, leaving the implanted regions 214. The selective etching process may be selective to the shadowed regions 209 of the second material 210 having a smaller concentration of ions over the implanted regions 214 having a greater concentration of ions. The selective etching process may include a wet etching process or a dry etching process. As an illustrative example, a wet etching process using NH$_4$OH may selectively etch regions of the second material 210 having a smaller concentration of implanted boron (e.g., the shadowed regions 209) over the implanted regions 214 having a greater concentration of implanted boron. Other wet etching processes or dry etching processes may be used in other embodiments.

Figure 57:
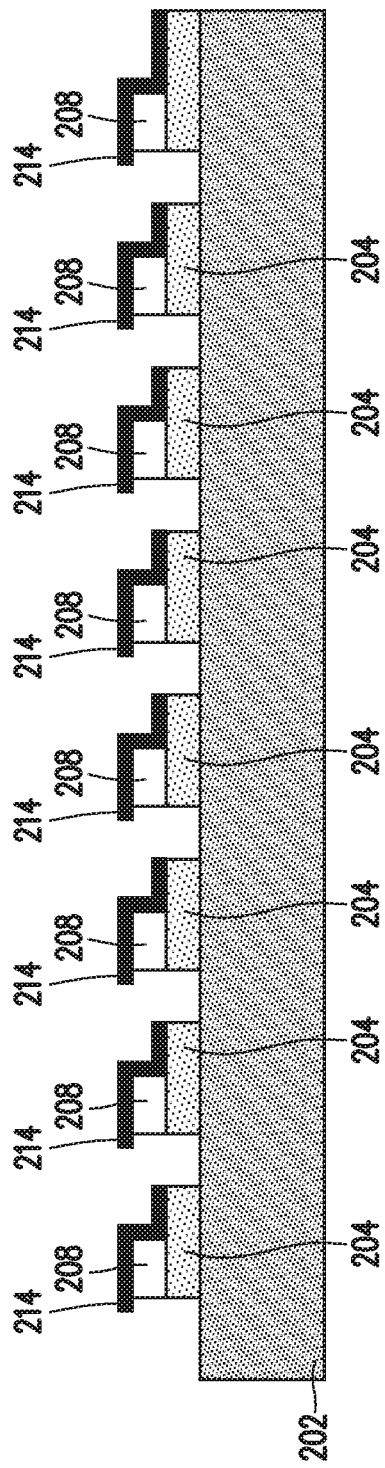
Figure 58:
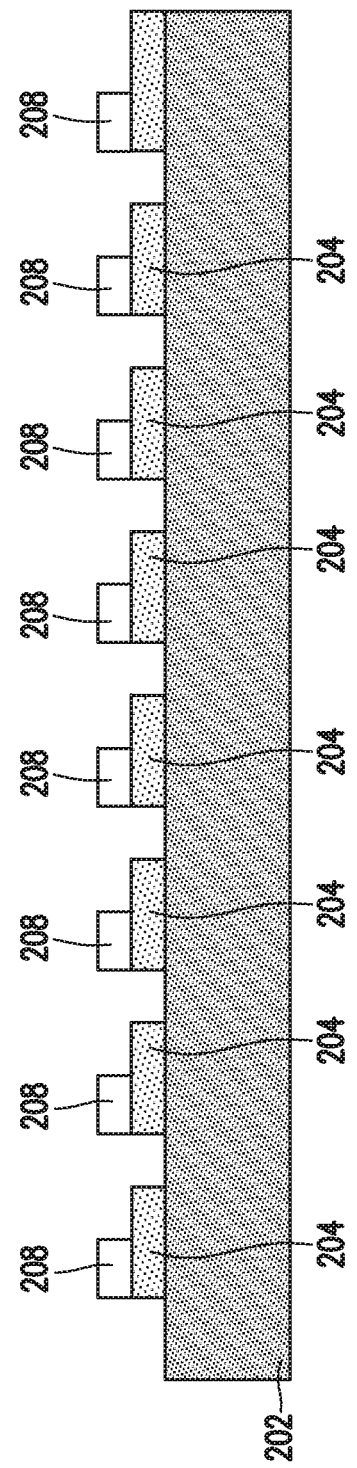

In FIG. 57, exposed portions of the first material 204 are removed. The portions of the first material 204 may be removed, for example, by an etching process that is selective to the first material 204 over the implanted regions 214 or the substrate 202. The etching process may include a wet etching process or a dry etching process. In FIG. 58, the implanted regions 214 are removed. The implanted regions 214 may be removed, for example, by an etching process that is selective to the implanted regions 214 over the first material 204 or the substrate 202. The etching process may include a wet etching process or a dry etching process.

In FIG. 59, a third material 216 is formed over the first spacers 208, the first material 204, and the substrate 202. The third material 216 may be similar to the first material 204 described above and may be formed in a similar manner, though the third material 216 may be a different material or be formed in a different manner in other embodiments. For example, the third material 216 may be a material such as SiO, SiN, SiON, SiC, SiCN, SiOCN, a nitride material, or another type of material. The third material 216 may be formed using a process such as ALD, PVD, CVD, or the like. In some embodiments, a planarization process such as a CMP process may be performed to remove excess third material 216 and expose the first spacers 208 after formation of the third material 216. In FIG. 60, portions of the third material 216 are removed using an etching process. After the etching process, the remaining third material 216 may have a thickness about the same as the first material 204 on the substrate 202. The etching process may also expose portions of the first material 204. The etching process may include a wet etching process or a dry etching process. For example, the etching process may be a timed etching process or include an etching system configured to stop etching once exposure of the first material 204 is detected.

Figure 61:
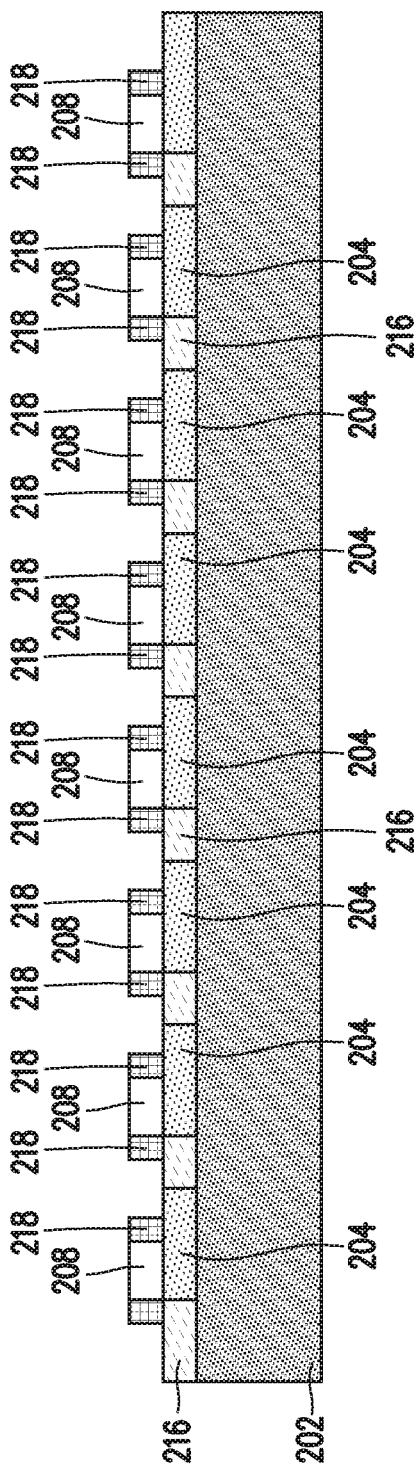

In FIG. 61, second spacers 218 are formed on the first spacers 208. The material of the second spacers 218 may be selected to have an etching selectivity with, for example, the first spacers 208. For example, the second spacers 218 may be a material such as SiO, SiN, SiON, SiC, SiCN, SiOCN, a nitride material, or another type of material. The second spacers 218 may be formed using a process such as ALD, PVD, CVD, or the like. In some embodiments, the material of the second spacers 218 may be blanket deposited over the structure, and then horizontal portions of the material may be etched to form the second spacers 218. The etching process may be, for example, an anisotropic dry etching process. In some embodiments, second spacers 218 may have a lateral width between about 1 nm and about 10 nm, though the second spacers 218 may have another lateral width in other embodiments.

Figure 62:
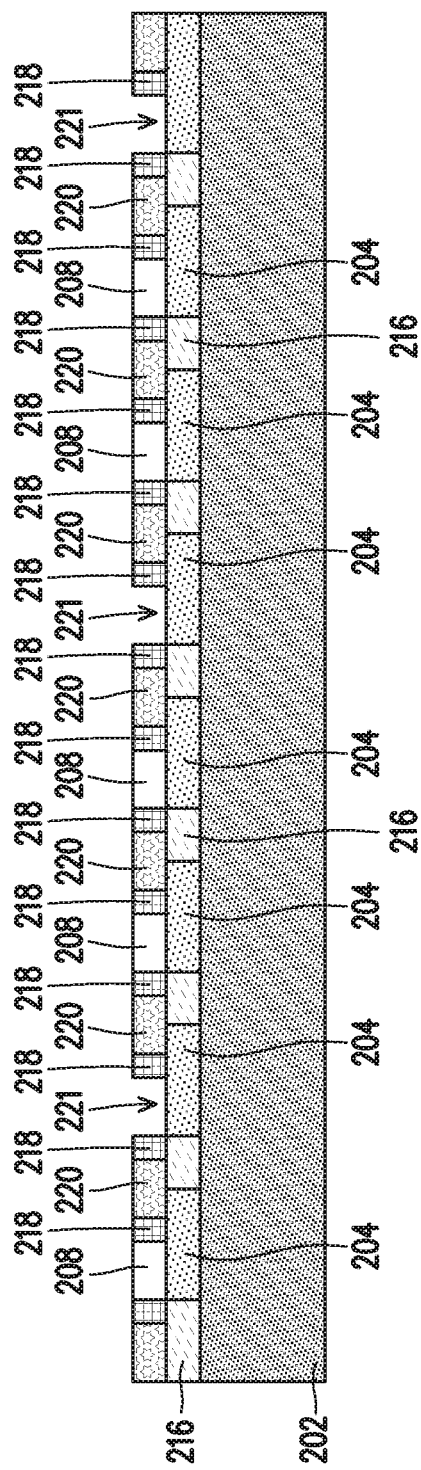

In FIG. 62, a photoresist 220 is formed to fill regions between the second spacers 218. The photoresist 220 may be formed using a spin-on process or another suitable process. As shown in FIG. 62, portions of the photoresist 220 between second spacers 218 are then removed to form openings 221. The openings 221 may be patterned using a suitable photolithographic process. In FIG. 63, portions of the first material 204 exposed by the openings 221 are removed to extend the openings 221 to the substrate 202. In some cases, portions of third material 216 exposed by the openings 221 may also be removed. The first material 204 (and third material 216, if present) may be removed using a suitable etching process, such as a wet etching process or a dry etching process. In some embodiments, the etching process is selective to the first material 204 over the first spacers 208 or the second spacers 218. In FIG. 64, the openings 221 are extended into the substrate 202 using an etching process. The etching process may include one or more dry etching processes, wet etching processes, or a combination. In some embodiments, the openings 221 may extend a depth into the substrate 202 a distance between about 50 nm and about 100 nm, though the openings 221 may extend another depth in other embodiments.

Figure 65:
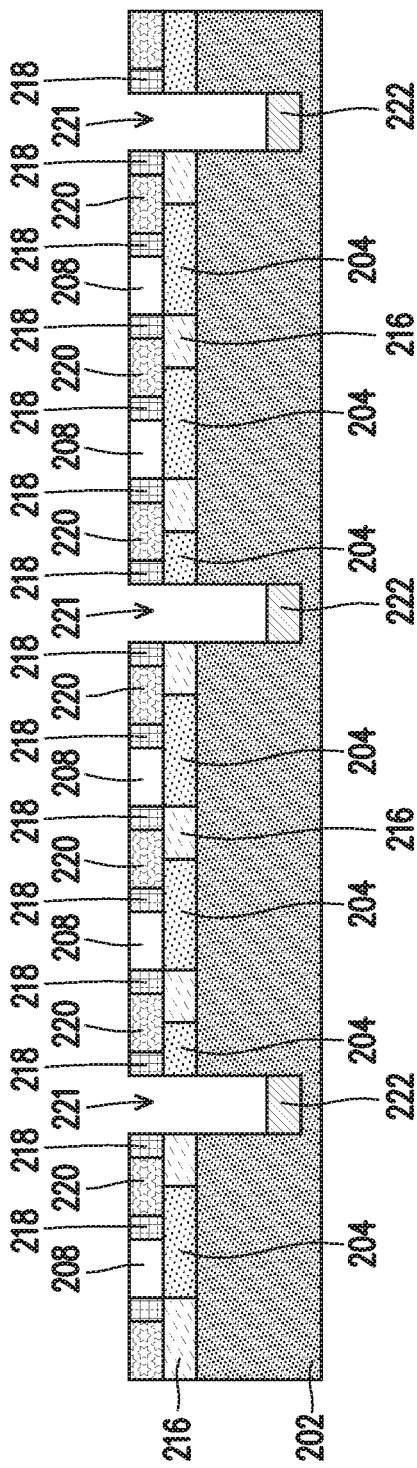

In FIG. 65, a conductive material is deposited in the openings 221 to form buried metal 222. The conductive material may be similar to the conductive material 132 described above, and may be formed in a similar manner. For example, the conductive material may be deposited over the openings 221 and excess conductive material outside of the openings 221 may be removed using, for example, a CMP process. Conductive material within the openings 221 may be then removed using a suitable wet or dry etching process, which may be a timed etching process.

Figure 66:
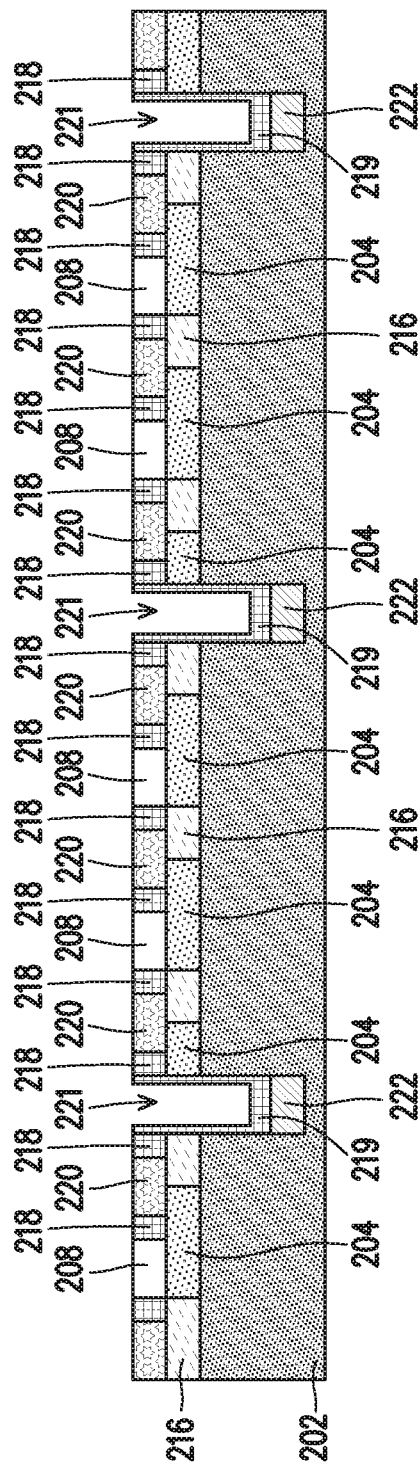
Figure 67:
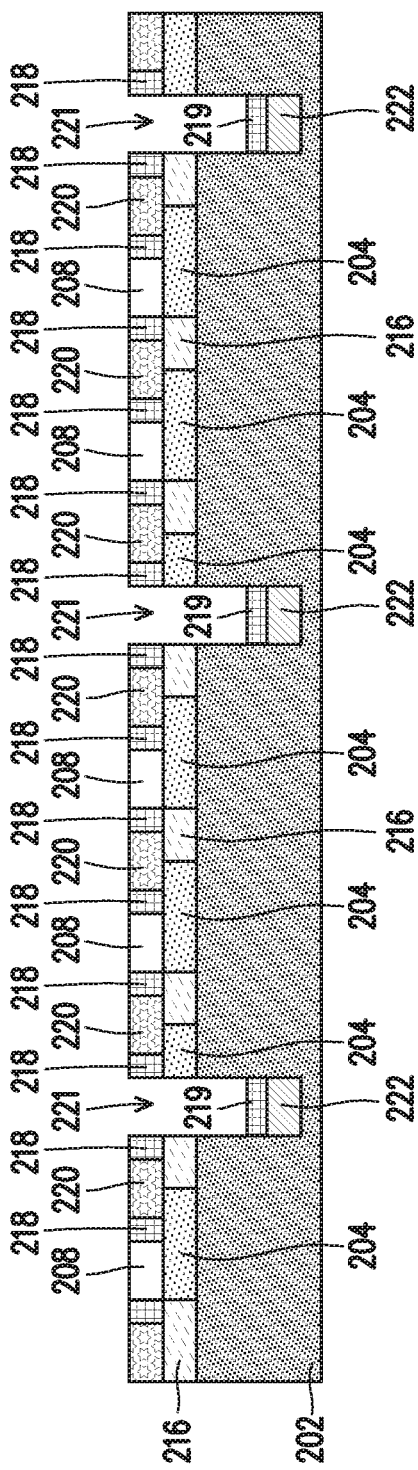

In FIG. 66, a first hard mask material 219 is formed within the openings 221 and on the buried metal 222. In some embodiments, the first hard mask material 219 is similar to the material of the second spacers 218, and may be formed in a similar manner. For example, first hard mask material 219 may be a material such as SiO, SiN, SiON, SiC, SiCN, SiOCN, a nitride material, or another type of material. The first hard mask material 219 may be formed using a process such as ALD, PVD, CVD, or the like. In some embodiments, the first hard mask material 219 formed on the sidewalls of the openings may be thinner than the first hard mask material 219 formed on the buried metal 222. In some embodiments, excess first hard mask material 219 outside of the openings 221 is removed, for example, using a CMP process. In FIG. 67, a trimming process is performed on the first hard mask material 219 to remove portions of the first hard mask material 219 from sidewalls of the openings 221. In some embodiments, the trimming process may include a wet etching process, a dry etching process, or a combination, and may include a timed etch. After the trimming process, a portion of the first hard mask material 219 is left remaining over the buried metal 222.

Figure 68:
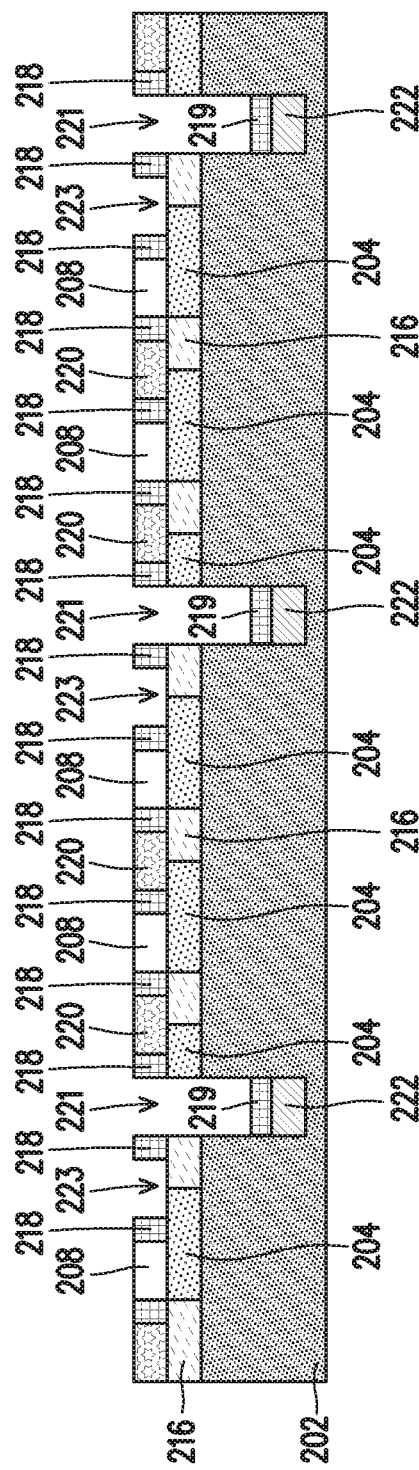
Figure 69:
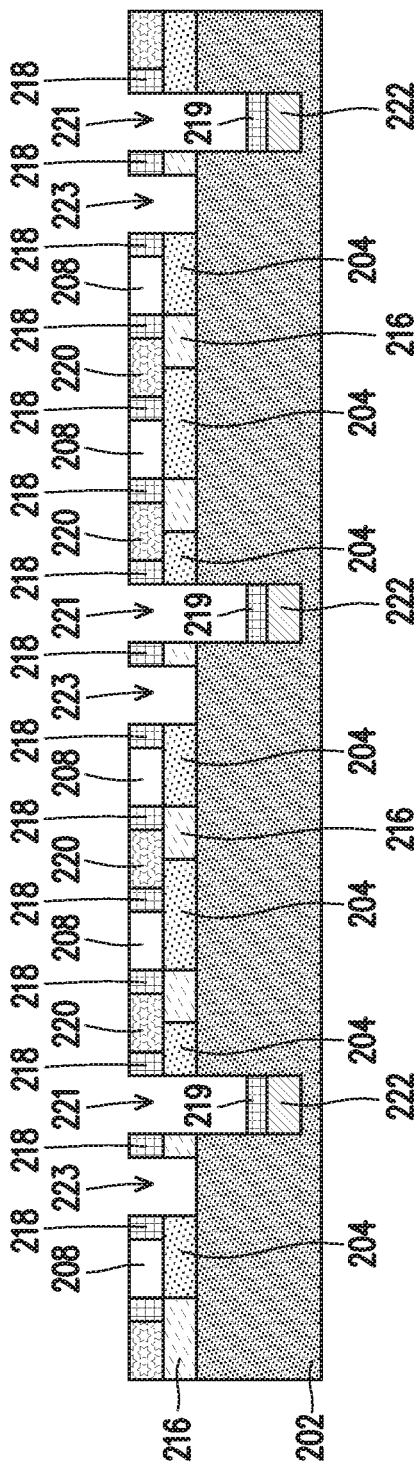
Figure 70:
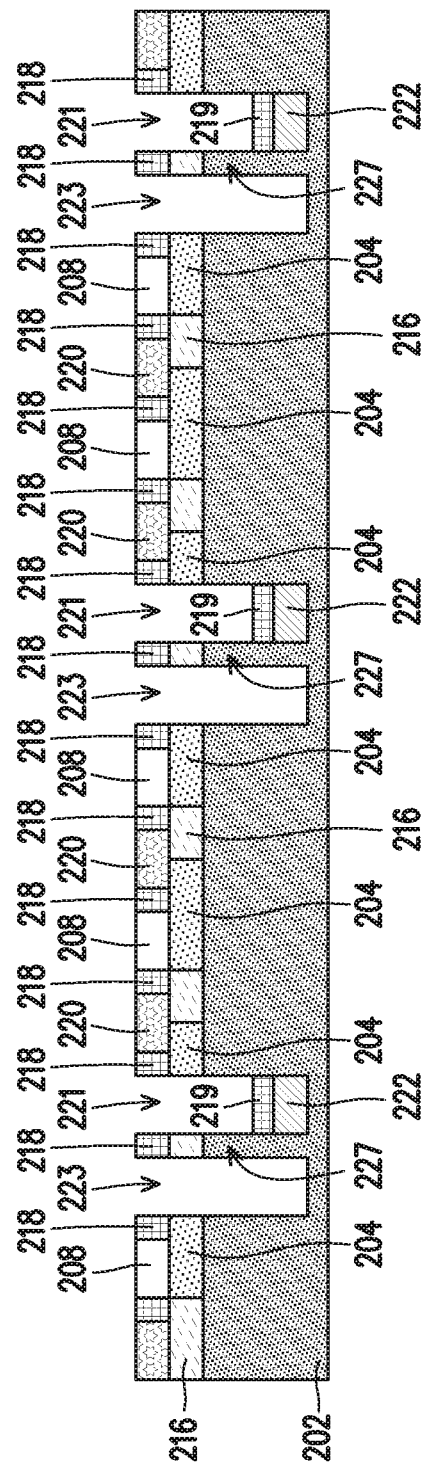

In FIG. 68, portions of the photoresist 220 between second spacers 218 are removed to form openings 223. The openings 223 may be adjacent to the openings 221 and separated from openings 221 by a second spacer 218, as shown in FIG. 68. The openings 223 may be patterned and the photoresist 220 removed using a suitable photolithographic process and etching process. In FIG. 69, portions of the first material 204 and third material exposed by the openings 223 are removed to extend the openings 223 to the substrate 202. The first material 204 and third material 216 may be removed using a suitable etching process, such as a wet etching process or a dry etching process. In some embodiments, the etching process is selective to the first material 204 or the third material 216 over the first spacers 208 or the second spacers 218. In FIG. 70, the openings 223 are extended into the substrate 202 using an etching process, which may be similar to the etching process described above with respect to FIG. 64. After etching the substrate 202, an opening 221 may be separated from an opening 223 by a portion of the substrate 202 that is designated as dummy fin 227 in FIG. 70.

Figure 71:
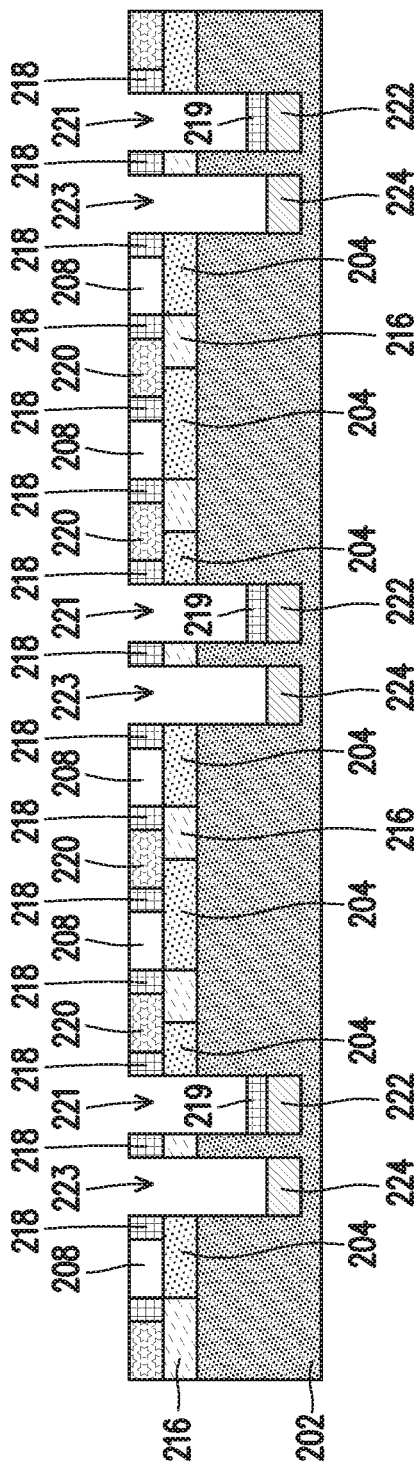
Figure 72:
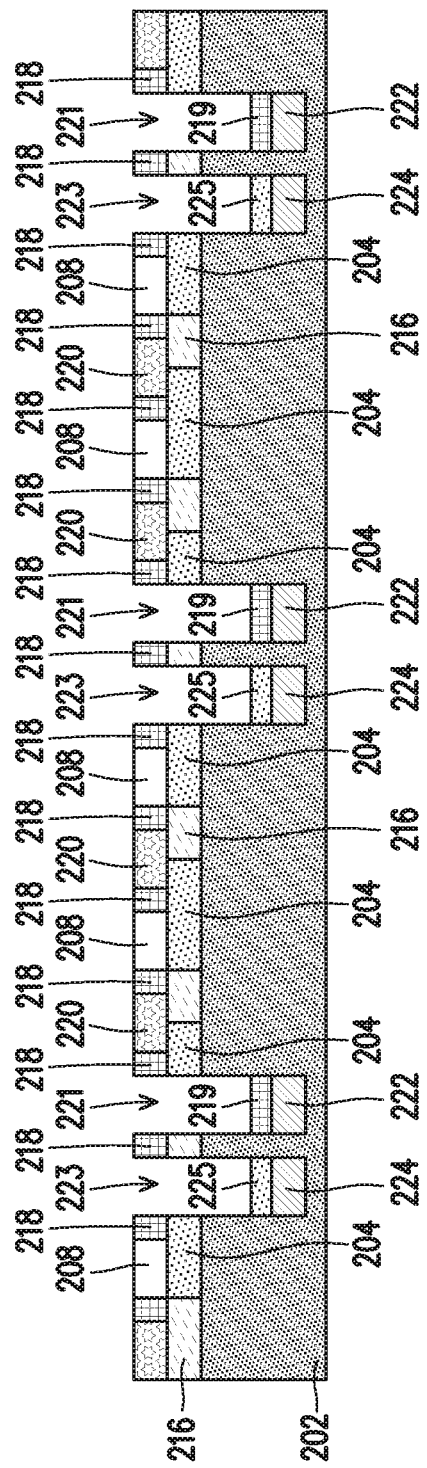

In FIG. 71, a conductive material is deposited in the openings 223 to form buried metal 224. The conductive material may be similar to the conductive material of buried metal 222 described above, and may be formed in a similar manner. In FIG. 72, a second hard mask material 225 is formed within the openings 223 and on the buried metal 224. In some embodiments, the second hard mask material 225 is similar to the first material 204, and may be formed in a similar manner. For example, the second hard mask material 225 may be formed within the openings 223, followed by a trimming process. In some embodiments, the second hard mask material 225 may be formed over the openings 223, followed by a planarization process. A timed etch may then be performed to etch the second hard mask material 225 within the openings 223, leaving a desired amount of the second hard mask material 225 remaining over the buried metal 224.

Figure 73:
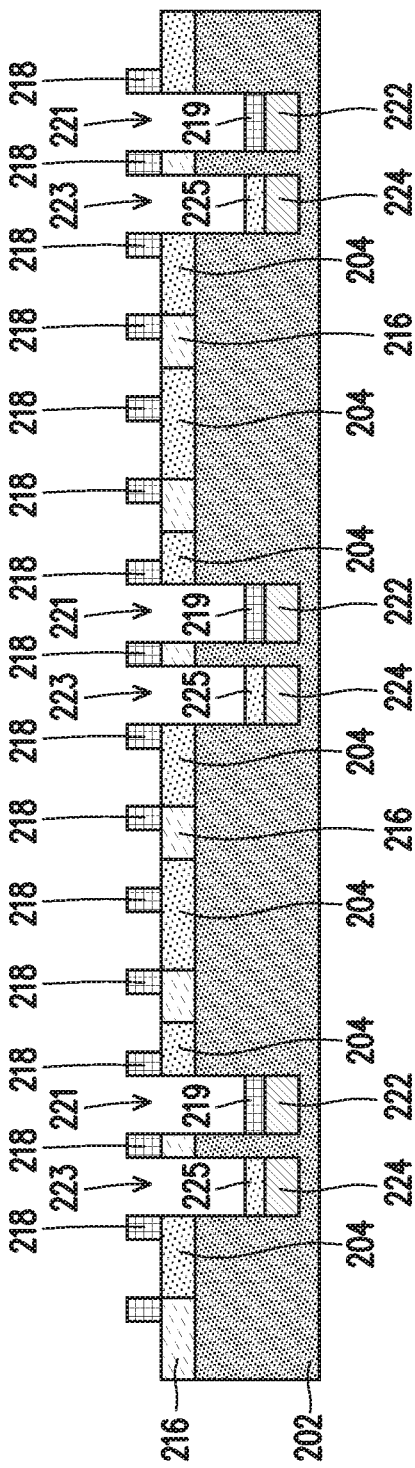
Figure 74:
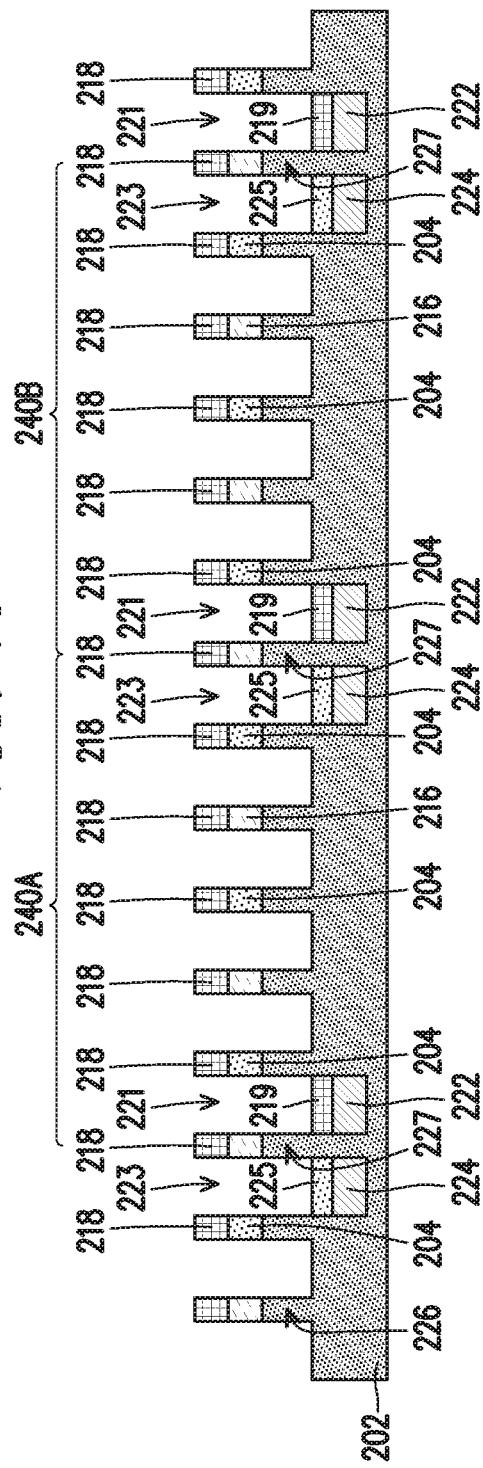

In FIG. 73, the first spacers 208 and the photoresist 220 are removed using one or more etching processes. The one or more etching processes may include wet etching processes, dry etching processes, or a combination. The one or more etching processes may be selective to the material of the first spacers 208 or the photoresist 220 over the first material 204, the third material 216, the second spacers 218, or the substrate 202. In FIG. 74, one or more etching processes are performed to form fins 226 in substrate 202. The one or more etching processes may include wet etching processes, dry etching processes, or a combination, which may include one or more timed etches. In some embodiments, portions of the first material 204 and third material 216 exposed between second spacers 218 are first etched to expose the substrate 202. The exposed portions of the substrate 202 between second spacers 218 are then etched to form fins 226. In some embodiments, regions of the substrate 202 between fins 226 have a surface that is about level with that of the top surface of the first hard mask material 219 and the second hard mask material 225. In some embodiments, the fins 226 have a width between about 1 nm and about 10 nm. FIG. 74 also shows example cells, which are separated by dummy fins 227. In other embodiments, cells may include a different number of fins 226 than shown in FIG. 74. In some embodiments, portions of buried metal 222 or 224 may extend adjacent multiple cells of FinFETs, and some or all of the multiple cells of FinFETs may be electrically connected together by being electrically connected to the same portion of buried metal 222 or 224. In some cases, having first material 204 and third material 216 disposed on different fins 226 allows the use of selective etching techniques to remove particular fins.

Figure 75:
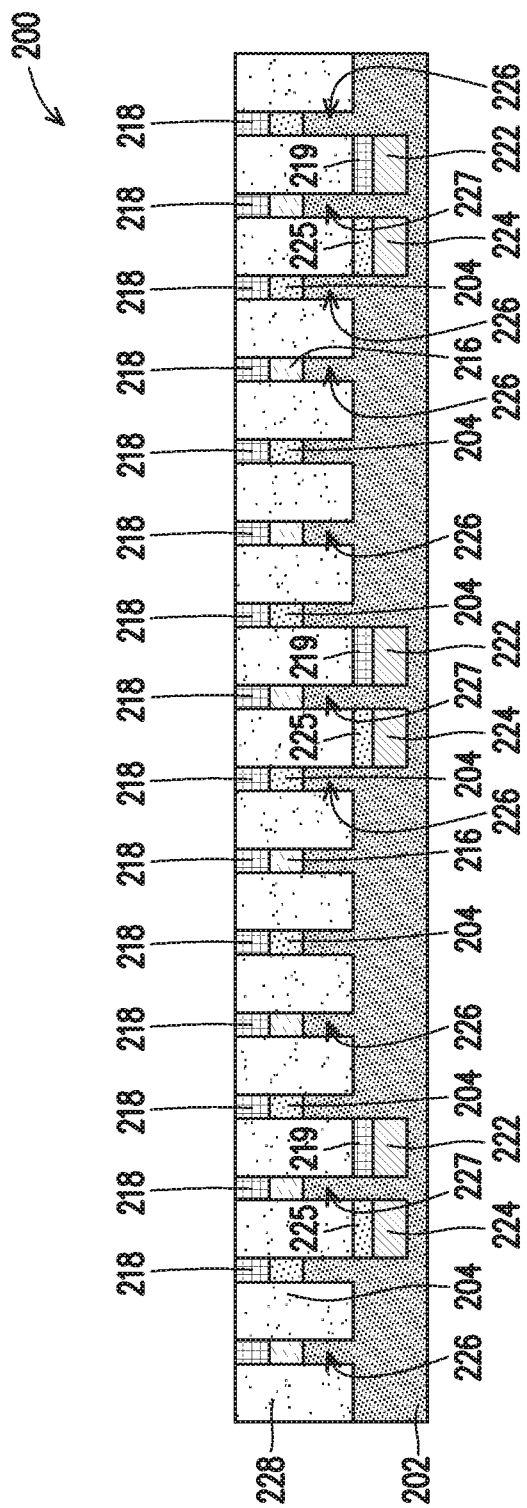

In FIG. 75, an insulation material is formed over the substrate 202 and between fins 226, forming Shallow Trench Isolation (STI) 228. The STI 228 may be similar to STI 148 described previously. In some embodiments, the STI 228 may be recessed such that the top surface of the STI 228 is below the top surfaces of the fins 226. The cross-sectional view of FIG. 75 may be along the example cross-section AA-AA, which is shown in FIG. 76A.

Figure 76A:
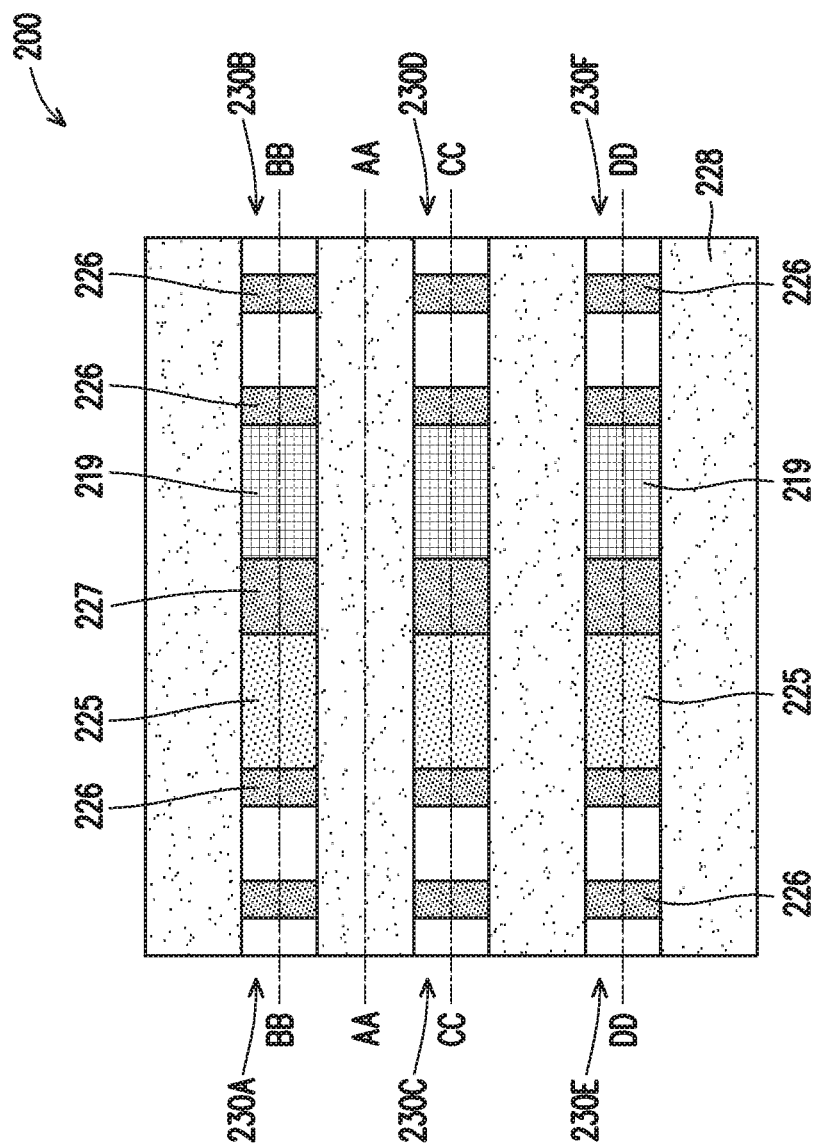
FIGS. 76A-78D illustrate cross-sectional views and plan views of intermediate stages in the formation of dummy gate stacks in accordance with a first embodiment.
Figure 76B:
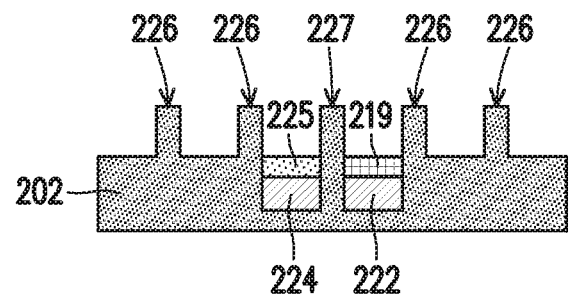
Figure 76C:
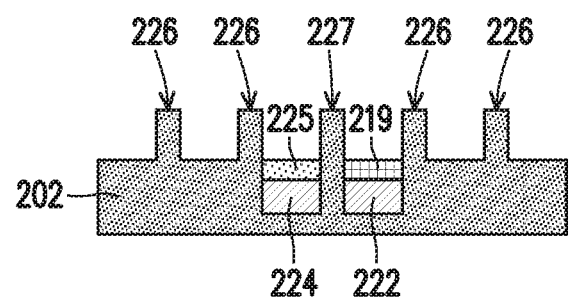
Figure 76D:
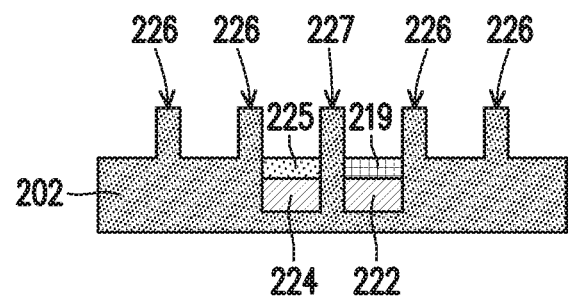
Figure 77A:
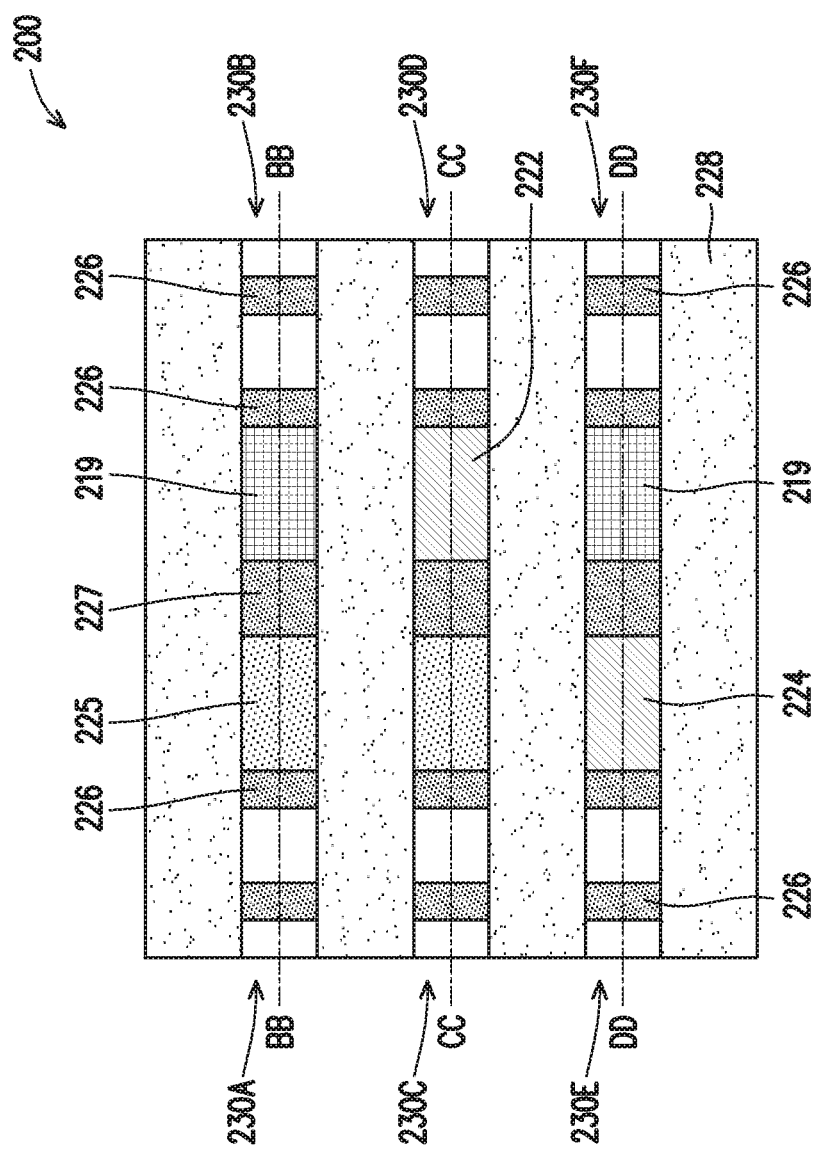
Figure 77B:
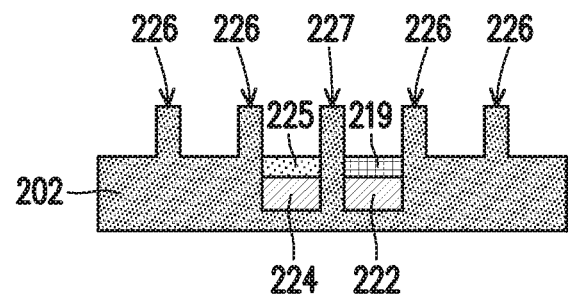
Figure 77C:
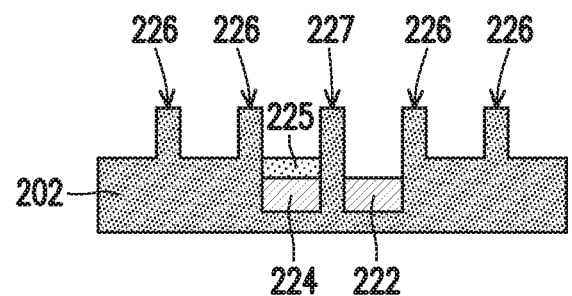
Figure 77D:
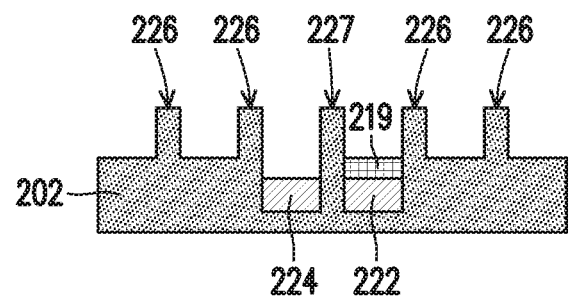
Figure 78A:
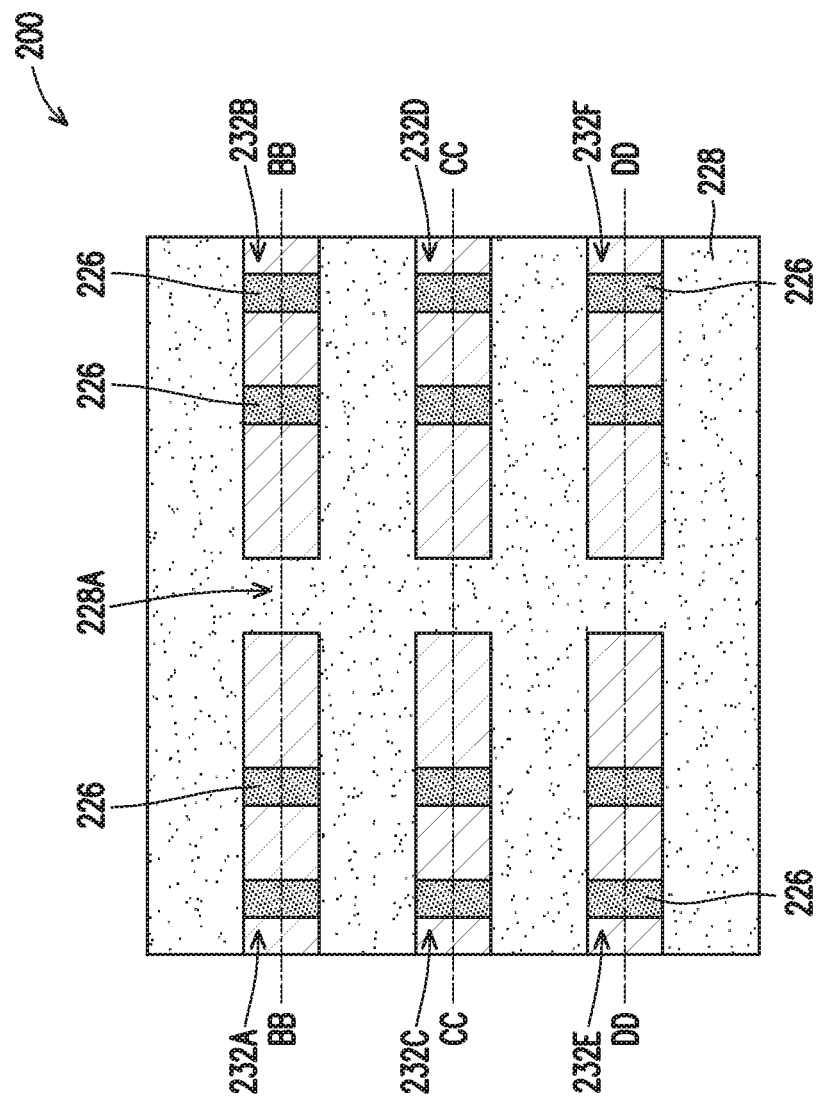
Figure 78B:
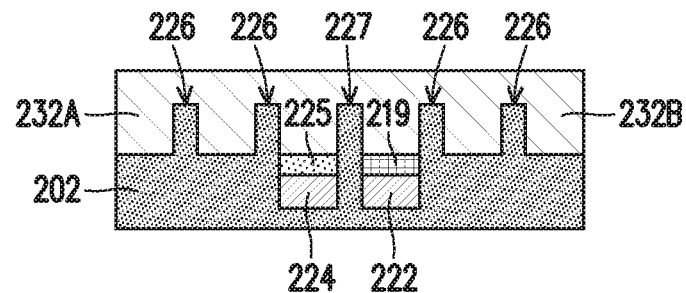
Figure 78C:
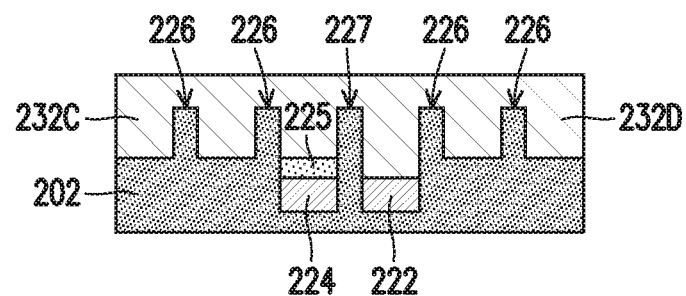
Figure 78D:
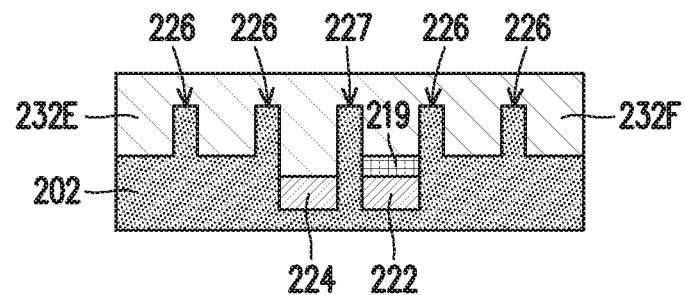

FIGS. 76A-76D, 77A-77D, and 78A-78D illustrate the formation of dummy gate structures 232A-F over the fins 226 of FinFET device 200, according to some embodiments. FIGS. 76A, 77A, and 78A show example plan views of a portion of FinFET device 200. FIGS. 76B, 77B, and 78B show example cross-sectional views along cross-section BB-BB as indicated in FIGS. 76A, 77A, and 78A. FIGS. 76C, 77C, and 78C show example cross-sectional views along cross-section CC-CC as indicated in FIGS. 76A, 77A, and 78A. FIGS. 76D, 77D, and 78D show example cross-sectional views along cross-section DD-DD as indicated in FIGS. 76A, 77A, and 78A. Each of cross-sections BB-BB, CC-CC, and DD-DD are perpendicular to the longitudinal direction of the fins 226 and are across subsequently formed metal gate structures, as in the cross-section A-A shown in FIG. 1.

In FIGS. 76A-76D, the STI 228, the first material 204 disposed on the fins 226, the third material 216 disposed on the fins 226, and the second spacers 218 disposed on the fins 226 are removed from regions 230A-F using suitable photolithographic techniques. For example, the different materials may be removed using one or more dry etching processes, one or more wet etching processes, or a combination. In some embodiments, the STI 228 in regions 230A-F are removed before removing the other materials. In this manner, the fins 226 in the regions 230A-F are exposed. In some embodiments, the STI 228 within the regions 230A-F may be recessed such that portions of the STI 228 remain within the regions 230A-F. The regions 230A-F shown in FIGS. 76A and 77A are intended as non-limiting examples, and other embodiments may include regions of a different number, shape, size, or other characteristics.

In FIGS. 77A-77D, the first hard mask layer 219 is removed in region 230D to expose the buried metal 222, and the second hard mask layer 225 is removed in region 230E to expose the buried metal 224. The first hard mask layer 219 in region 230D and the second hard mask layer 225 in region 230E may be removed using suitable photolithographic techniques. For example, an anisotropic dry etching process selective to the first hard mask layer 219 over the second hard mask layer 225 may be used to remove the first hard mask layer 219 in region 230D. In this manner, the second hard mask layer 225 in region 230C is less likely to be inadvertently removed, exposing the buried metal 224. Similarly, an anisotropic dry etching process selective to the second hard mask layer 225 over the first hard mask layer 219 may be used to remove the second hard mask layer 225 in region 230E. Due to the fact that the first hard mask layer 219 and the second hard mask layer 225 may be selectively etched, the buried metal 222 may be formed closer to the buried metal 224 and buried metal 222 with less risk of inadvertently exposing both buried metal 222 and buried metal 224 when only one is desired to be exposed. Additionally, buried metal 222 and buried metal 224 may be formed closer to neighboring fins 226 with less risk of inadvertently exposing both buried metal 222 and buried metal 224.

In FIGS. 78A-78D, dummy gate structures 232A-F are formed in regions 230A-F. In some embodiments, the dummy gate structures 232A-F may be similar to dummy gate structures 146A-F described above. For example, the dummy gate structures 232A-F may include multiple layers, such as a dummy dielectric layer, a dummy gate layer, or other layers. In some embodiments, the dummy gate structure materials are blanket formed over the surface of the FinFET device 200, and then portions are removed using a suitable photolithographic process to form dummy gate structures 232A-F. In some embodiments, a planarization process such as a CMP may be performed to remove excess dummy gate structure materials. In some embodiments, one or more of the dummy gate structures 232A-F may be formed simultaneously by the same processing steps, or may be formed sequentially in separate processing steps.

In some embodiments, the dummy gate structures 232A-F are formed before the STI 228 are formed. For example, appropriate portions of the first hard mask layer 219 and the second hard mask layer 225 may be removed in regions 230A-F as described above, then dummy gate structures 232A-F may be formed as described above. Portions of the dummy gate structures 232A-F may be removed outside of regions 230A-F via one or more etching processes, and then STI 228 may be formed as described above. This and other variations of processing steps are within the scope of this disclosure.

Figure 79A:
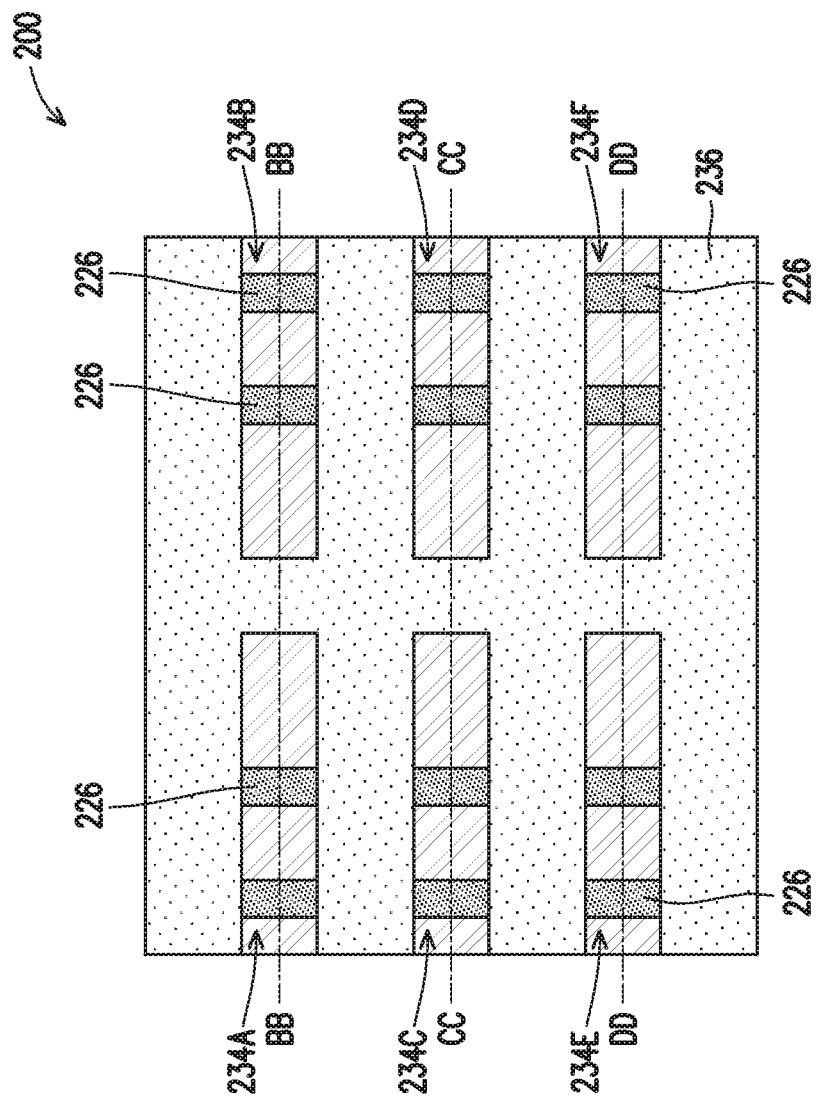
FIGS. 79A-79D illustrate cross-sectional views and plan views of intermediate stages in the formation of metal gate stacks in accordance with a first embodiment.

In FIGS. 79A-79D, the dummy gate structures 232A-F are removed and replaced with metal gate structures 234A-F. In some embodiments, some FinFET features may be formed prior to removal of the dummy gate structures 234A-F, such as epitaxial source/drain regions, gate spacers, interlayer dielectric (ILD) regions, or other features (not shown). The dummy gate structures 232A-F may be removed using one or more dry etching processes, one or more wet etching processes, or a combination. The metal gate structures 234A-F may include gate dielectric layers, metal gate fill material, and other layers such as work-function layers, barrier layers, etc. FIG. 79A also shows interlayer dielectric (ILD) regions 236 that may be formed in some embodiments, for example, after removal of the STI regions 228. The STI regions 228 may be removed using a suitable etching process.

Figure 80:
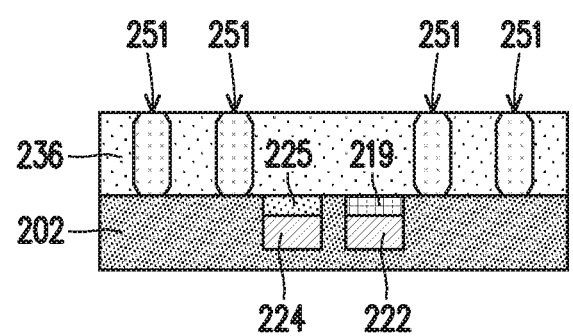
FIG. 80 illustrates a cross-sectional view of an intermediate stage in the formation of epitaxial source/drain regions in accordance with a first embodiment.

FIG. 80 is a cross-sectional view along cross-section AA-AA, showing the formation of epitaxial source/drain regions 251 over the fins 226. In some embodiments, the epitaxial source/drain regions 251 or other FinFET features may be formed prior to formation of the metal gate structures 234A-F, such as gate spacers, additional ILD regions, or other features (not shown). The epitaxial source/drain regions 251 may be formed using suitable techniques as known in the art.

Figure 79B:
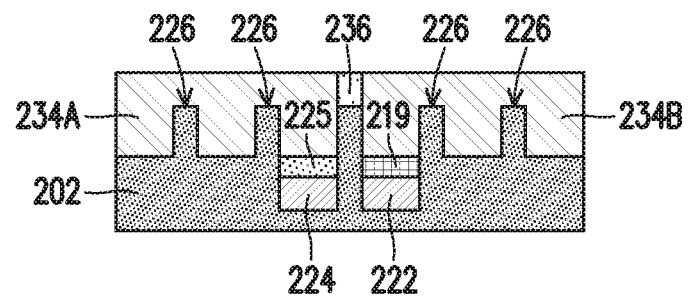
Figure 79C:
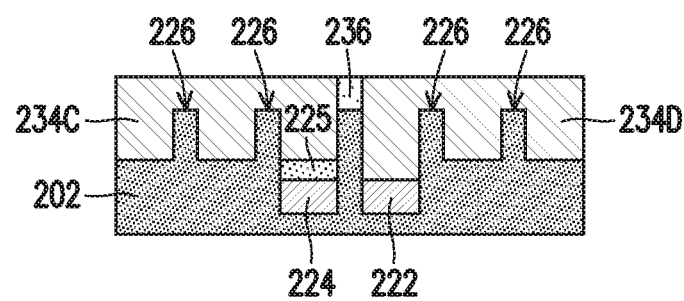
Figure 79D:
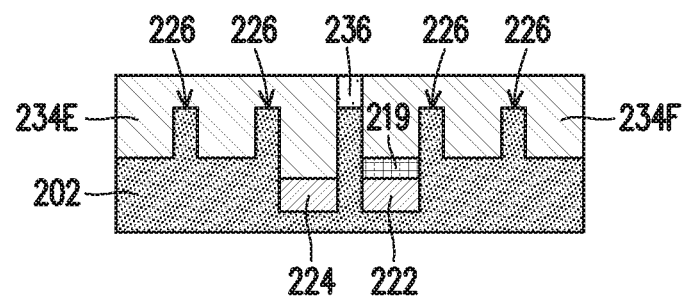

By selectively removing appropriate portions of the first hard mask layer 219 or the second hard mask layer 225 adjacent the dummy fin 227 (as shown above in FIGS. 77A-D), the metal gate structures 234A-F may contact (and thus make electrical connection to) the buried metal 222 or the buried metal 224 as desired. In this manner, the metal gate structures 234A-F may also be isolated from the buried metal 222 or the buried metal 224. For example, as shown in FIG. 79B, the metal gate structures 234A and 234B are isolated from one another by STI 228, are isolated from the buried metal 222 by the first hard mask layer 219, and are isolated from the buried metal 224 by the second hard mask layer 225.

The embodiments herein may achieve several advantages. For example, the process described allows for electrical connections to be made from buried metal lines to the metal gates of FinFETs. By forming buried metal lines as described herein, the width of metal lines may be reduced, and thus the area of a FinFET device may be reduced. Additionally, the use of different selectively-etched materials to isolate the metal lines from different metal gates reduces the chance of inadvertently connecting isolated metal gates to a buried metal line during processing. Because the connection between the metal gate and the buried metal is self-aligned to the buried metal, the separation between the metal gate isolation (e.g., third material 116A in FIGS. 48A-D or dummy fin 227 in FIGS. 79A-D) and the connection may be reduce or eliminated. In some cases, the techniques described herein may allow for reduced risk of inadvertent metal gate connections when the pitch between fins is less than about 20 nm. The techniques described herein may also be used for FinFET devices such as a 6-fin FinFET cell without increasing the area of the device. The techniques described herein may also be used for low-height FinFET cells, such as FinFET cells having a height less than about 7 nm.

In an embodiment, a method includes etching a first recess in a semiconductor substrate, depositing a conductive material within the first recess, etching a second recess in the semiconductor substrate to expose a first sidewall of the conductive material, depositing a first dielectric material within the second recess, etching a third recess in the semiconductor substrate to expose a second sidewall of the conductive material opposite the first sidewall, depositing a second dielectric material within the third recess, forming a first set of fins in the semiconductor substrate, the first set of fins disposed on a first side of the conductive material and a second set of fins in the semiconductor substrate, the second set of fins disposed on a second side of the conductive material opposite the first side, etching the first dielectric material to expose the first sidewall of the conductive material, forming a first metal gate structure over the first set of fins, the first metal gate structure contacting the exposed first sidewall of the conductive material; and, forming a second metal gate structure over the second set of fins. In an embodiment, the method further includes forming a hard mask layer over the conductive material, the hard mask layer extending over the conductive material from the first dielectric material to the second dielectric material. In an embodiment, the method further includes forming a third set of fins in the semiconductor substrate, the third set of fins disposed on the first side of the conductive material, and forming a third metal gate structure over the third set of fins, wherein the third metal gate structure is isolated from the conductive material by the first dielectric material and the hard mask layer. In an embodiment, etching the first dielectric material includes performing an etching process that is selective to the first dielectric material over the second dielectric material. In an embodiment, the method further includes etching the second dielectric material to expose the second sidewall of the conductive material, wherein the second metal gate structure contacts the exposed second sidewall of the conductive material. In an embodiment, etching the second dielectric material includes performing an etching process that is selective to the second dielectric material over the first dielectric material. In an embodiment, the method further includes forming a dummy fin including a third dielectric material over the conductive material, the dummy fin separating the first metal gate structure from the second metal gate structure. In an embodiment, the first dielectric material includes silicon oxide and the second dielectric material includes silicon nitride.

In an embodiment, a method includes forming a first recess in a substrate and a second recess in the substrate, the second recess separated from the first recess, forming a first buried metal line in the first recess and a second buried metal line in the second recess, forming a first dielectric material over the first buried metal line, forming a second dielectric material over the second buried metal line, forming first multiple semiconductor fins adjacent the first buried metal line, forming second multiple semiconductor fins adjacent the second buried metal line, selectively etching a portion of the first dielectric material to expose a portion of the first buried metal line, selectively etching a portion of the second dielectric material to expose a portion of the second buried metal line, forming a first dummy gate structure over the first multiple semiconductor fins and the exposed portion of the first buried metal line, forming a second dummy gate structure over the second multiple semiconductor fins and the exposed portion of the second buried metal line, replacing the first dummy gate structure with a first metal gate structure, and replacing the second dummy gate structure with a second metal gate structure. In an embodiment, the method further includes forming third multiple semiconductor fins adjacent the first buried metal line, the third multiple semiconductor fins separated from the first multiple semiconductor fins, and forming a third dummy gate structure over the third multiple semiconductor fins, wherein the third dummy gate structure is isolated from the first buried metal line by the first dielectric material. In an embodiment, the first buried metal line is formed before forming the second recess. In an embodiment, the first multiple semiconductor fins are part of a six-transistor (6T) FinFET cell. In an embodiment, the method further includes forming an interlayer dielectric (ILD) region surrounding the first multiple semiconductor fins and the second multiple semiconductor fins. In an embodiment, a portion of the ILD region is disposed between the first metal gate structure and the second metal gate structure. In an embodiment, the exposed portion of the first buried metal line is adjacent the exposed portion of the second buried metal line.

In an embodiment, a semiconductor device includes a buried metal line disposed in a semiconductor substrate, a first dielectric material on a first sidewall of the buried metal line and a second dielectric material on a second sidewall of the buried metal line, a first multiple fins disposed proximate the first sidewall of the buried metal line, a second multiple fins disposed proximate the second sidewall of the buried metal line, a first metal gate structure over the first multiple fins and over the buried metal line, wherein the first metal gate structure extends through the first dielectric material to contact the buried metal line, and a second metal gate structure over the second multiple fins and over the buried metal line. In an embodiment, the second metal gate structure extends through the second dielectric material to contact the buried metal line. In an embodiment, the first dielectric material is different than the second dielectric material. In an embodiment, the second metal gate structure is isolated from the second sidewall of the buried metal line by the second dielectric material. In an embodiment, the first metal gate structure is isolated from the second metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a first recess in a semiconductor substrate;
    depositing a conductive material within the first recess;
    etching a second recess in the semiconductor substrate to expose a first sidewall of the conductive material;
    depositing a first dielectric material within the second recess;
    etching a third recess in the semiconductor substrate to expose a second sidewall of the conductive material opposite the first sidewall;
    depositing a second dielectric material within the third recess;
    forming a first set of fins in the semiconductor substrate, the first set of fins disposed on a first side of the conductive material and a second set of fins in the semiconductor substrate, the second set of fins disposed on a second side of the conductive material opposite the first side;
    etching the first dielectric material to expose the first sidewall of the conductive material;
    forming a first metal gate structure over the first set of fins, the first metal gate structure contacting the exposed first sidewall of the conductive material; and
    forming a second metal gate structure over the second set of fins.

2. The method of claim 1, further comprising forming a hard mask layer over the conductive material, the hard mask layer extending over the conductive material from the first dielectric material to the second dielectric material.

3. The method of claim 2, further comprising forming a third set of fins in the semiconductor substrate, the third set of fins disposed on the first side of the conductive material; and
    forming a third metal gate structure over the third set of fins, wherein the third metal gate structure is isolated from the conductive material by the first dielectric material and the hard mask layer.

4. The method of claim 1, wherein etching the first dielectric material comprises performing an etching process that is selective to the first dielectric material over the second dielectric material.

5. The method of claim 1, further comprising etching the second dielectric material to expose the second sidewall of the conductive material, wherein the second metal gate structure contacts the exposed second sidewall of the conductive material.

6. The method of claim 5, wherein etching the second dielectric material comprises performing an etching process that is selective to the second dielectric material over the first dielectric material.

7. The method of claim 1, further comprising forming a dummy fin comprising a third dielectric material over the conductive material, the dummy fin separating the first metal gate structure from the second metal gate structure.

8. The method of claim 1, wherein the first dielectric material comprises silicon oxide and the second dielectric material comprises silicon nitride.

9. A semiconductor device comprising:
    a buried metal line disposed in a semiconductor substrate, wherein the buried metal line comprises a first portion of the buried metal line and a second portion of the buried metal line;

a first dielectric material on a first sidewall of the first portion of the buried metal line and a second dielectric material on a second sidewall of the first portion of the buried metal line;

a first plurality of fins on the semiconductor substrate, the first plurality of fins disposed proximate a first sidewall of the second portion of the buried metal line;

a second plurality of fins on the semiconductor substrate, the second plurality of fins disposed proximate a second sidewall of the second portion of the buried metal line;

a first metal gate structure over the first plurality of fins and over the buried metal line, wherein the first metal gate structure extends over the first sidewall of the second portion of the buried metal line and contacts the first sidewall of the second portion of the buried metal line; and a second metal gate structure over the second plurality of fins and over the buried metal line.

10. The semiconductor device of claim 9, wherein the second metal gate structure extends over the second sidewall of the second portion of the buried metal line and contacts the second sidewall of the second portion of the buried metal line.

11. The semiconductor device of claim 9, wherein the first dielectric material is different than the second dielectric material.

12. The semiconductor device of claim 9, wherein the second metal gate structure is isolated from the second sidewall of the buried metal line by the second dielectric material.

13. The semiconductor device of claim 9, wherein the first metal gate structure is isolated from the second metal gate structure.

14. A device, comprising:
a first fin protruding from a semiconductor substrate and extending in a first direction;
a second fin protruding from the semiconductor substrate and extending in the first direction;
a metal line on the semiconductor substrate between the first fin and the second fin, wherein the metal line extends in the first direction;
a first dielectric material over the metal line, wherein the first dielectric material extends in the first direction;
a first metal gate structure over the first fin, wherein the first metal gate structure extends in a second direction that is perpendicular to the first direction, wherein a portion of the first metal gate structure contacts a first sidewall of the metal line and a first sidewall of the first dielectric material; and
a second metal gate structure over the second fin, wherein the second metal gate structure extends in the second direction, wherein a portion of the second metal gate structure contacts a second sidewall of the metal line and a second sidewall of the first dielectric material.

15. The device of claim 14, wherein the first metal gate structure is aligned in the second direction with the second metal gate structure.

16. The device of claim 14, wherein the first fin protrudes from a top surface of the semiconductor substrate, and wherein a top surface of the metal line is lower than the top surface of the semiconductor substrate.

17. The device of claim 14, further comprising a second dielectric material under the first dielectric material, wherein the second dielectric material extends in the first direction, and wherein the first metal gate structure and the second metal gate structure contact the second dielectric material.

18. The device of claim 14, wherein the first dielectric material has a first width in the second direction and wherein the metal line has a second width in the second direction, wherein the first width is smaller than the second width.

19. The device of claim 14, wherein a top surface of the first dielectric material is higher than a top surface of the first fin.

20. The device of claim 14, wherein the first metal gate structure extends over the metal line, and wherein the second metal gate structure extends over the metal line.

* * * * *